US012805147B2

(12) United States Patent
Jin et al.

(10) Patent No.: US 12,805,147 B2
(45) Date of Patent: Nov. 17, 2026

(54) DISPLAY DEVICE AND METHOD FOR MANUFACTURING THE SAME

(71) Applicant: Samsung Display Co., LTD., Yongin-si (KR)

(72) Inventors: You Young Jin, Yongin-si (KR); Keun Chan Oh, Yongin-si (KR); Jae Cheol Park, Yongin-si (KR); Gak Seok Lee, Yongin-si (KR); Sun Kyu Joo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 355 days.

(21) Appl. No.: 18/502,246

(22) Filed: Nov. 6, 2023

(65) Prior Publication Data

US 2024/0334775 A1 Oct. 3, 2024

(30) Foreign Application Priority Data

Mar. 30, 2023 (KR) ........................ 10-2023-0042115

(51) Int. Cl.
*H10K 59/38* (2023.01)
*H10K 59/12* (2023.01)

(52) U.S. Cl.
CPC ......... *H10K 59/38* (2023.02); *H10K 59/1201* (2023.02)

(58) Field of Classification Search
CPC ........................... H10K 59/38; H10K 59/1201
See application file for complete search history.

(56) References Cited

U.S. PATENT DOCUMENTS 10,026,783 B2 * 7/2018 Kim ..................... H10K 71/166
11,309,360 B2 4/2022 Joo et al.
(Continued)

FOREIGN PATENT DOCUMENTS

CN 114078928 A * 2/2022 ............ H10W 90/00
CN 117063630 A * 11/2023 ........... H10K 59/879
(Continued)

OTHER PUBLICATIONS

Korea Office action issued on Aug. 26, 2026, in corresponding Korean Patent Application No. 10-2023-0042115, 10 pages.

*Primary Examiner* — Mary Ellen Bowman
(74) *Attorney, Agent, or Firm* — Womble Bond Dickinson (US) LLP

(57) ABSTRACT

A display device includes a first emission area, a second emission area disposed adjacent to the first emission area, and a non-emission area, a base member disposed in the first emission area, the second emission area, and the non-emission area, a light emitting element part disposed and including a first light emitting element disposed in the first emission area and a second light emitting element disposed in the second emission area, a wavelength conversion part disposed on the light emitting element part and including a first wavelength conversion pattern, a first insulating layer covering the first wavelength conversion pattern, opened at a portion disposed adjacent to the first emission area, exposing a portion of the first wavelength conversion pattern, and a light blocking member disposed in the non-emission area and covering the portion of the first wavelength conversion pattern. The wavelength conversion part is disposed in the second emission area.

19 Claims, 41 Drawing Sheets

(56) References Cited

U.S. PATENT DOCUMENTS

| | | | |
|---|---|---|---|
| 2015/0378192 | A1 | 12/2015 | Jin et al. |
| 2021/0376000 | A1 | 12/2021 | Jin et al. |
| 2023/0074534 | A1 | 3/2023 | Kim et al. |

FOREIGN PATENT DOCUMENTS

| | | | |
|---|---|---|---|
| KR | 10-2016-0000569 | A | 1/2016 |
| KR | 10-2020-0097380 | A | 8/2020 |
| KR | 10-2020-0110581 | | 9/2020 |
| KR | 10-2023-0035168 | A | 3/2023 |

* cited by examiner

CF : CF1, CF2
EA : EA1, EA2
ED : ED1, ED2

DISPLAY DEVICE AND METHOD FOR MANUFACTURING THE SAME

CROSS REFERENCE TO RELATED APPLICATION(S)

This application claims priority to and benefits of Korean Patent Application No. 10-2023-0042115 under 35 U.S.C. § 119, filed on Mar. 30, 2023, in the Korean Intellectual Property Office (KIPO), the entire contents of which are incorporated herein by reference.

BACKGROUND

1. Technical Field

Embodiments relate to a display device and a method for manufacturing the same.

2. Description of the Related Art

The importance of display devices has steadily increased with the development of multimedia technology. Accordingly, various types of display devices such as a liquid crystal display device, an organic light emitting display device, and the like have been developed.

The pixels of the display device emit light corresponding to each primary color. For example, the pixels of the display device may emit red, green, or blue light, respectively. By controlling a luminance of light emitted from each pixel, various color images may be displayed through the display device.

As a method for enabling each pixel of the display device to display a primary color, a method may be provided in which a color conversion pattern or a wavelength conversion pattern is disposed on an optical path from a light source to a viewer.

SUMMARY

The disclosure provides a high-resolution display device including a wavelength conversion pattern and a method for manufacturing the same.

However, aspects of the disclosure are not restricted to those set forth herein. The above and other aspects of the disclosure will become more apparent to one of ordinary skill in the art to which the disclosure pertains by referencing the detailed description of the disclosure given below.

According to an aspect of the disclosure, a display device may include a first emission area, a second emission area disposed adjacent to the first emission area, and a non-emission area disposed between the first emission area and the second emission area, a base member disposed in the first emission area, the second emission area, and the non-emission area, a light emitting element part disposed on the base member and including a first light emitting element disposed in the first emission area and a second light emitting element disposed in the second emission area, a wavelength conversion part disposed on the light emitting element part and including a first wavelength conversion pattern disposed in the second emission area, a first insulating layer covering the first wavelength conversion pattern, opened at a portion disposed adjacent to the first emission area, exposing a portion of the first wavelength conversion pattern, and a light blocking member disposed in the non-emission area and covering the portion of the first wavelength conversion pattern. The wavelength conversion part may be disposed only in the second emission area among the first emission area and the second emission area.

In an embodiment, the display device may further include a first color filter disposed on the first light emitting element in the first emission area, and a second color filter disposed on the first wavelength conversion pattern in the second emission area.

In an embodiment, the first color filter and the second color filter may be disposed on different layers, and the first color filter may be disposed closer to the light emitting element part than the second color filter.

In an embodiment, the first color filter may directly contact a side surface of the light blocking member.

In an embodiment, the second light emitting element may be a first color light emitting element emitting light of a first color, and the first wavelength conversion pattern may include a first wavelength shifter converting light of the first color into light of a second color.

In an embodiment, the second color filter may be a color filter of the second color which transmits light of the second color.

In an embodiment, the first light emitting element may be a first color light emitting element emitting light of a first color, and the first color filter may include a color filter of the first color, which transmits light of the first color.

In an embodiment, the second color filter may be disposed on the first insulating layer.

In an embodiment, the display device may further include a second insulating layer disposed on the second color filter entirely in a display area including the first emission area and the second emission area. The second insulating layer may be opened at a portion disposed adjacent to the first emission area to expose the portion of the first wavelength conversion pattern.

In an embodiment, the light blocking member may be disposed directly on the second insulating layer and the portion of the first wavelength conversion pattern.

In an embodiment, the first color filter may be disposed on the second insulating layer.

In an embodiment, the display device may further include a low refractive pattern disposed on the light emitting element part in the second emission area and overlap the wavelength conversion pattern in a plan view, and a third insulating layer covering the low refractive pattern, opened at a portion disposed adjacent to the first emission area, and exposing another portion of the first wavelength conversion pattern.

In an embodiment, the low refractive pattern and the third insulating layer may be sequentially disposed on the first insulating layer.

In an embodiment, the light blocking member may directly contact the portion of the first wavelength conversion pattern.

In an embodiment, the display device may further include a protection member disposed on the base member disposed with the light emitting element part, a color filter part disposed on a surface of the protection member facing the light emitting element part and including a first color filter disposed in the first emission area and a second color filter disposed in the second emission area, and a second insulating layer covering the color filter part.

In an embodiment, the wavelength conversion part may be disposed on a surface of the second insulating layer to face the light emitting element part.

In an embodiment, the display device may further include a display area including multiple emission areas including the first emission area and the second emission area. The display area may include a first pixel column in which the first emission area, which includes the first light emitting element and do not include a wavelength conversion pattern, and the second emission area, which includes the second light emitting element and the first wavelength conversion pattern, are alternately arranged.

In an embodiment, the display area may further include a second pixel column in which a third emission area, which includes a third light emitting element and a second wavelength conversion pattern, and the first emission area, which includes the first light emitting element and do not include the wavelength conversion pattern, are alternately arranged.

In an embodiment, the first insulating layer may be disposed entirely in the display area and cover the first wavelength conversion pattern and the second wavelength conversion pattern. The first insulating layer may be opened between the first emission area and the second emission area and expose the portion of the first wavelength conversion pattern. The first insulating layer may be opened between the first emission area and the third emission areas area and expose a portion of the second wavelength conversion pattern.

According to an aspect of the disclosure, a method for manufacturing a display device may include preparing a base member disposed in a first emission area, a second emission area disposed adjacent to the first emission area, and a non-emission area disposed between the first emission area and the second emission area, forming a sacrificial pattern only in the second emission area among the first emission area and the second emission area on the base member, forming a first insulating layer on the base member on which the sacrificial pattern is formed, exposing a portion of the sacrificial pattern by removing a portion of the first insulating layer in the non-emission area adjacent to the first emission area, forming a cavity corresponding to the sacrificial pattern and opened toward the first emission area by removing the sacrificial pattern, imparting liquid repellency to the first emission area and the second emission area by surface-treating a surface of the first insulating layer, supplying ink including a first wavelength shifter to the first emission area and filling the cavity with the ink through a portion where the first insulating layer is removed to form a wavelength conversion pattern in the second emission area, and forming a light blocking member in the non-emission area, and covering an exposed surface of the wavelength conversion pattern exposed at a portion where the first insulating layer is removed with the light blocking member.

According to embodiments of the disclosure, it is possible to provide a high-resolution display device including a wavelength conversion pattern and a method for manufacturing the same.

However, effects according to embodiments of the disclosure are not limited to those described as an example above and various other effects are incorporated herein.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
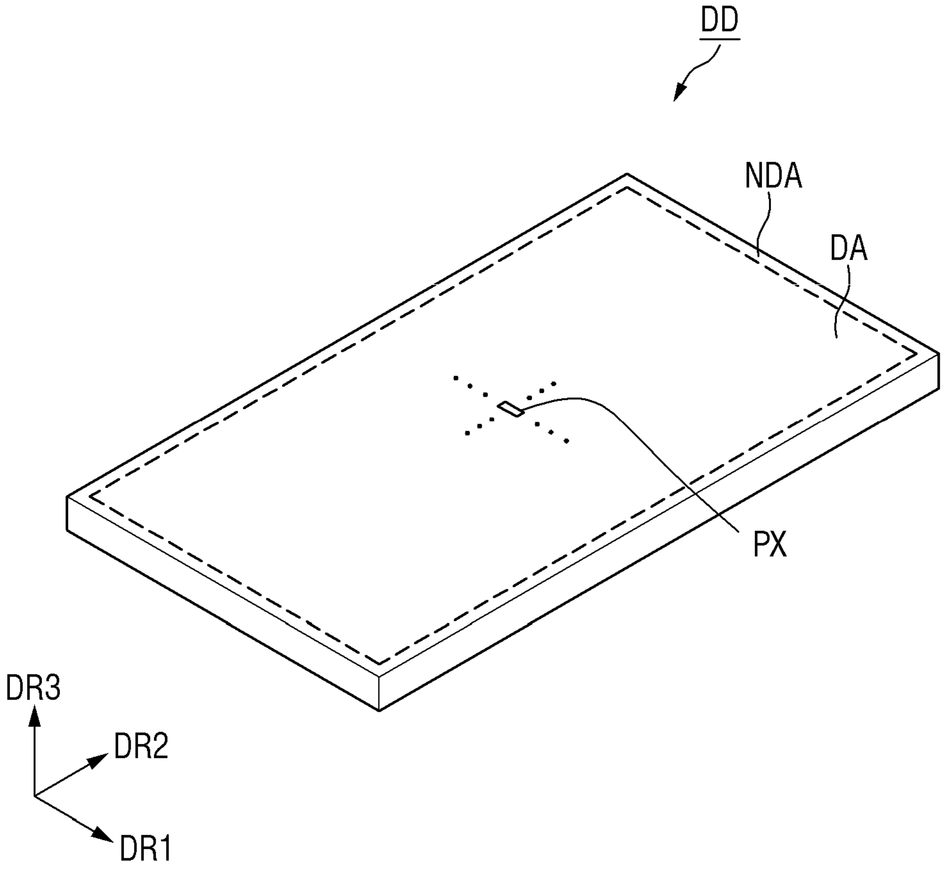
FIG. 1 is a schematic perspective view of a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

The disclosure will now be described more fully hereinafter with reference to the accompanying drawings, in which embodiments of the disclosure are shown. The disclosure may, however, be embodied in different forms and should not be construed as limited to the embodiments set forth herein. Rather, these embodiments are provided so that this disclosure will be more thorough and complete, and will fully convey the scope of the disclosure to those skilled in the art.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," "including," "has," and/or "having," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

It will also be understood that when an element or a layer is referred to as being "on" or "connected to" another element or layer, it can be "directly on" or "directly connected to" the other element or layer, or intervening layers may also be present. When, however, an element or layer is referred to as being "directly on" or "directly connected to" another element or layer, there are no intervening elements or layers present. To this end, the term "connected" may refer to physical, electrical, and/or fluid connection, with or without intervening elements. Further, the first direction DR1, the second direction DR2, and the third direction DR3 are not limited to three axes of a rectangular coordinate system, such as the x, y, and z axes, and may be interpreted in a broader sense. For example, the first direction DR1, the second direction DR2, and the third direction DR3 may be perpendicular to one another, or may represent different directions that are not perpendicular to one another. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

When a component is described herein to "connect" another component to the other component or to be "connected to" other components, the components may be connected to each other as separate elements, or the components may be integral with each other.

Throughout the specification, when an element is referred to as being "connected" to another element, the element may be "directly connected" to another element, or "electrically connected" to another element with one or more intervening elements interposed therebetween. Also, when an element is referred to as being "in contact" or "contacted" or the like to another element, the element may be in "electrical contact" or in "physical contact" with another element; or in "indirect contact" or in "direct contact" with another element.

Spatially relative terms, such as "under," "lower," "above," "upper," "over," "side," and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

For the purposes of this disclosure, the phrase "at least one of A and B" may be construed as A only, B only, or any combination of A and B. "At least one of X, Y, and Z," "at least two of X, Y, and Z," and "at least one selected from the group consisting of X, Y, and Z" may be construed as X only, Y only, Z only, or any combination of two or more of X, Y, and Z. Also, "at least two of X, Y, and Z," may be construed as two or more of X, Y, and Z such as both X and Y, both X and Z, both Y and Z, both X, Y, and Z.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

When a component is described herein to "connect" another component to the other component or to be "connected to" other components, the components may be connected to each other as separate elements, or the components may be integral with each other.

Throughout the specification, when an element is referred to as being "connected" to another element, the element may be "directly connected" to another element, or "electrically connected" to another element with one or more intervening elements interposed therebetween. Also, when an element is referred to as being "in contact" or "contacted" or the like to another element, the element may be in "electrical contact" or in "physical contact" with another element; or in "indirect contact" or in "direct contact" with another element.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the disclosure. Further, the blocks, units, and/or modules of some example embodiments may be physically combined into more complex blocks, units, and/or modules without departing from the scope of the disclosure.

Features of each of various embodiments of the disclosure may be partially or entirely combined with each other and may technically variously interwork with each other, and embodiments may be implemented independently of each other or may be implemented together in association with each other.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The display surface may be parallel to a surface defined by a first direction DR1 and a second direction DR2. A normal direction of the display surface, i.e., a thickness direction of the display device DD, may indicate a third direction DR3. In this specification, an expression of "when viewed from the top or in a plan view" may represent a case when viewed in the third direction DR3. Hereinafter, a front surface (or a top surface) and a rear surface (or a bottom surface) of each of layers or units may be distinguished by the third direction DR3. However, directions indicated by the first to third directions DR1, DR2, and DR3 may be a relative concept, and converted with respect to each other, e.g., converted into opposite directions.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a schematic perspective view of a display device DD according to an embodiment. FIG. 1 schematically illustrates a display device DD with a display panel, which is a component (e.g., a main component) of the display device DD.

Referring to FIG. 1, the display device DD may be applied to a variety of electronic devices, i.e., small and medium electronic devices such as a tablet PC, a smartphone, a car navigation unit, a camera, a center information display (CID) provided in a vehicle, a wristwatch-type electronic device, a personal digital assistant (PDA), a portable multimedia player (PMP), a game console, and the like and medium and large electronic devices such as a television, an external billboard, a monitor, a personal computer, a laptop computer, and the like. However, the disclosure is not limited thereto, and the display device DD may also be applied to other electronic devices without departing from the disclosure.

In an embodiment, the display device DD may have a rectangular shape in a plan view. The display device DD may include two first sides extending in a first direction DR1 and two second sides extending in a second direction DR2 intersecting the first direction DR1. In an embodiment, a corner where the first side and the second side of the display device DD meet may have a right angle. However, the disclosure is not limited thereto, and in another embodiment, the corner may have a curved surface. In an embodiment, the first side may be shorter than the second side, but the disclosure is not limited thereto. However, the disclosure is limited thereto, and in another embodiment, a shape of the display device DD may have a circular shape or other shapes in a plan view.

A first direction DR1, a second direction DR2, and a third direction DR3 are defined as shown in FIG. 1. The first direction DR1 and the second direction DR2 may intersect each other, the first direction DR1 and the third direction DR3 may intersect each other, and the second direction DR2 and the third direction DR3 may intersect each other. The first direction DR1 may be a vertical direction in the drawing, and the second direction DR2 may be a horizontal direction in the drawing. The third direction DR3 may be an upward direction (or a thickness or height direction of the display device DD) in the drawing.

The display device DD may include a display area DA and a non-display area NDA (also referred to as a "bezel area"). The display area DA may be an area displaying an image and include pixels PX. The non-display area NDA may be an area other than the display area DA, and an image may not be displayed in the non-display area NDA. In an embodiment, the non-display area NDA may be disposed adjacent to the display area DA and may surround the display area DA.

Figure 2:
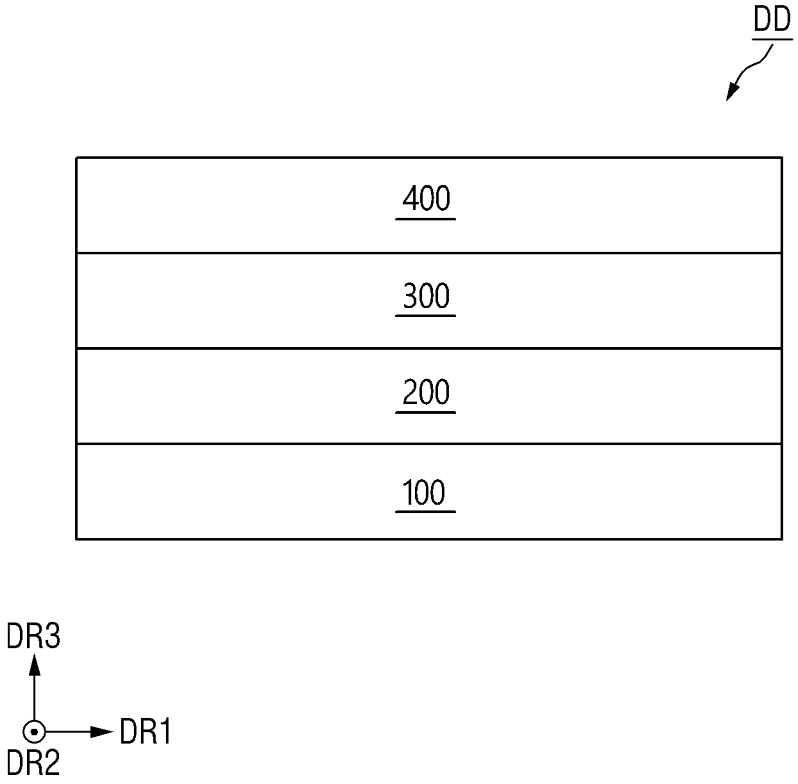
FIG. 2 is a schematic cross-sectional view illustrating a configuration of a display device according to an embodiment.

FIG. 2 is a schematic cross-sectional view illustrating a configuration of the display device DD according to an embodiment.

Referring to FIG. 2 (in addition to FIG. 1), the display device DD may include a base member 100 (also referred to as a "base layer" or a "substrate"), and a panel circuit part 200, a light emitting element part 300, and a light conversion part 400 sequentially disposed (or provided) on the base member 100. However, the structure of the display device DD is not limited thereto. For example, in another embodiment, the light emitting element part 300 may be disposed on a surface of the base member 100, and the panel circuit part 200 may be disposed on the light emitting element part

300. In another embodiment, the panel circuit part 200 may not be disposed or provided in the display panel of the display device DD.

The base member 100 may be a rigid or flexible substrate, film, or the like. In an embodiment, the base member 100 may be a glass substrate, a plastic substrate, or the like. For example, the base member 100 may be one of a glass substrate, a quartz substrate, a glass ceramic substrate, a film substrate including a high molecular organic material, and a plastic substrate. In an embodiment, the base member 100 may include fiber glass reinforced plastic (FRP).

The panel circuit part 200 may include circuit elements and wires provided inside the display panel. For example, the panel circuit part 200 may include circuit elements (e.g., transistors and capacitors) provided in the display area DA and constituting a pixel circuit of each of the pixels PX, and wires electrically connected to the pixels PX. In an embodiment, the panel circuit part 200 may further include at least a portion of a driving circuit part that supplies a driving signal to the pixels PX. For example, the panel circuit part 200 may further include circuit elements of a gate driver that supplies a gate driving signal (e.g., a scan signal) to the pixels PX. The circuit elements of the gate driver may be provided in the non-display area NDA or may be disposed in a distributed manner within the display area DA.

The light emitting element part 300 (also referred to as a "light source part" or "light emitting element layer") may include light emitting elements functioning as light sources for each of the pixels PX. For example, the light emitting element part 300 may include a self-light emitting element provided or formed in each pixel PX. In an embodiment, the light emitting element part 300 may be at least one of an organic light emitting diode, a quantum dot light emitting diode, an inorganic micro light emitting diode (e.g., micro LED), an inorganic nano light emitting diode (e.g., nano LED), the like, and a combination thereof. Hereinafter, for simplicity of description, an embodiment that the light emitting element is an organic light emitting element will be described.

The light conversion part 400 may include light conversion patterns (or light conversion elements) for converting or controlling light emitted from the light emitting element part 300. For example, the light conversion part 400 may include patterns (or elements) to convert the wavelength band of light generated by the light emitting element part 300 and/or selectively transmit light of a specific wavelength band from the light generated by the light emitting element part 300.

In an embodiment, the light conversion part 400 may include wavelength conversion patterns (e.g., a pattern layer including a wavelength shifter such as quantum dots or the like) that are provided to at least some of the pixels PX and that convert or shift a wavelength of light emitted from the light emitting elements of the pixels PX such that the pixels PX emit light of a color (e.g., a specific or selectable color). The light conversion part 400 may further include color filters (e.g., color filters corresponding to the primary color of each pixel PX) that control transmission of light such that the pixels PX emit light corresponding to each primary color.

Figure 3:
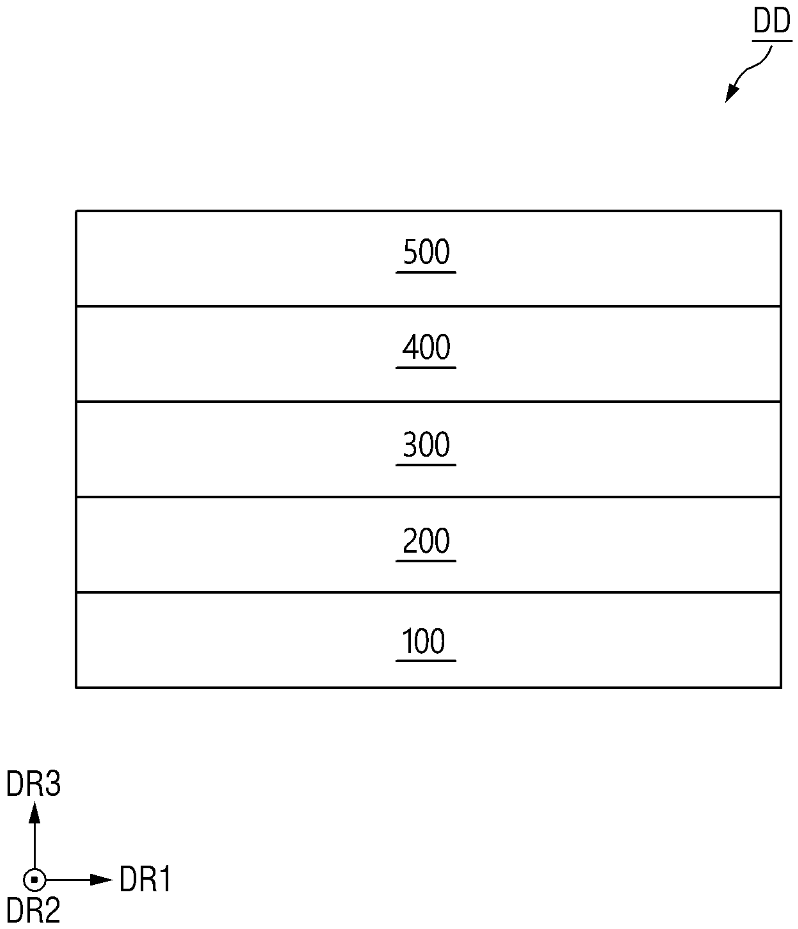
FIG. 3 is a schematic cross-sectional view illustrating a configuration of a display device according to an embodiment.

FIG. 3 is a schematic cross-sectional view illustrating the configuration of the display device DD according to an embodiment.

Referring to FIG. 3 (in addition to FIGS. 1 and 2), the display device DD may further include a protection member 500 disposed (or provided) on the light conversion part 400.

The protection member 500 may have a single layer or multilayer insulating layer, or may be a glass substrate, a plastic substrate, or the like, but the disclosure is not limited thereto. The protection member 500 may be formed or provided (e.g., directly formed or provided) on the base member 100 including the light emitting element part 300 and the like, or may be provided separately from the base member 100 and be combined with the base member 100 by a sealing material, a filler, the like, or a combination thereof. In case that the protection member 500 is provided separately from the base member 100, the light conversion part 400 may be formed or provided (e.g., directly formed or provided) on the base member 100 including the light emitting element part 300 and the like, or may be disposed or provided on the light emitting element part 300 by a bonding process after being formed or provided on the protection member 500 separately from the light emitting element part 300.

A description of other configurations of FIG. 3 and the description of the configurations of FIG. 2 are substantially the same or similar, and the same description will be omitted.

Figure 4:
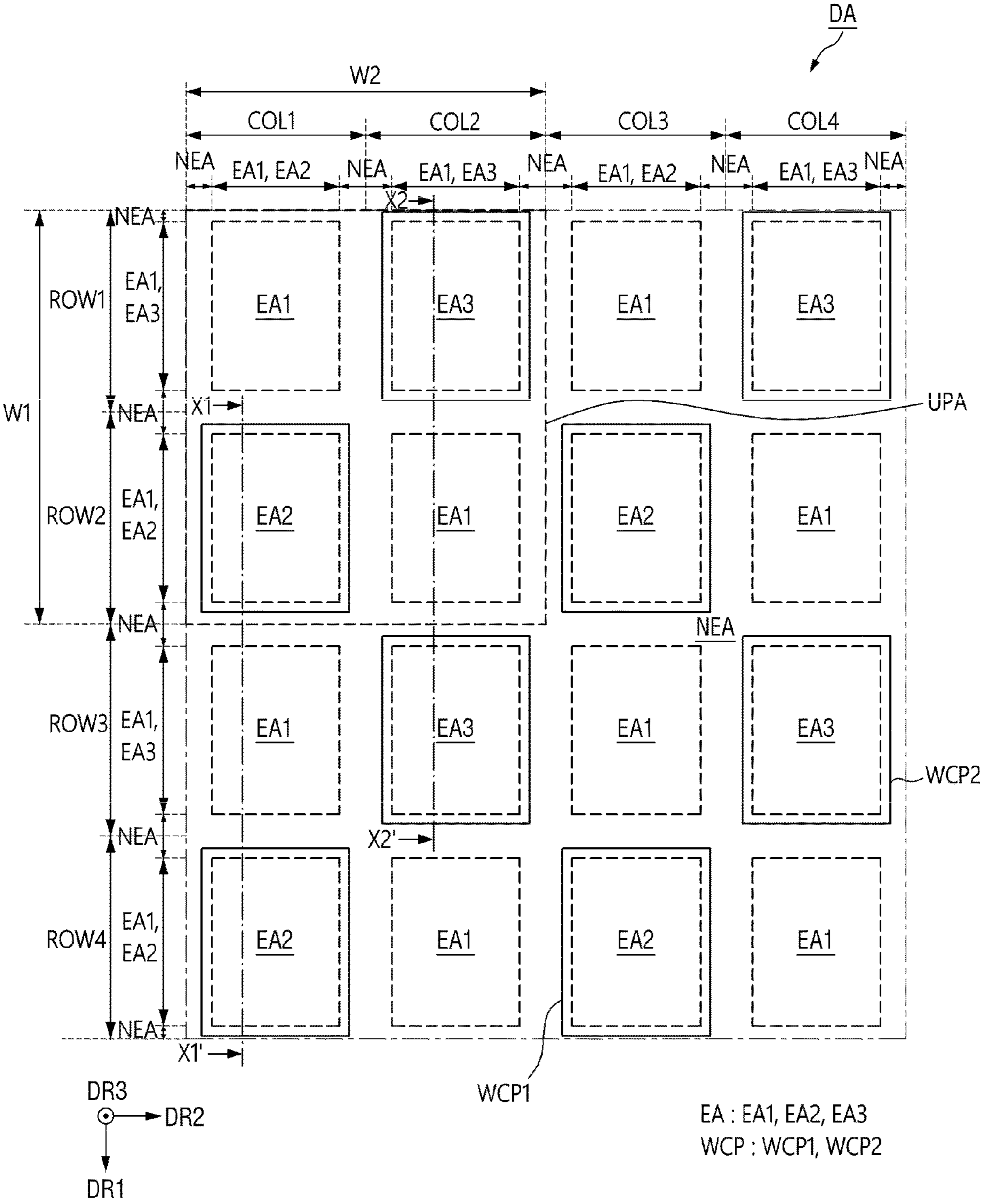
FIG. 4 is a schematic plan view illustrating a display area of a display device according to an embodiment.

FIG. 4 is a schematic plan view illustrating the display area DA of the display device DD according to an embodiment. For convenience, FIG. 4 illustrates a portion of the display area DA corresponding to four pixel rows ROW1, ROW2, ROW3, and ROW4 and four pixel columns COL1, COL2, COL3, and COL4, and a structure (e.g., an overall structure) of the display area DA will be described below.

Referring to FIG. 4 (in addition to FIGS. 1 to 3), the display area DA may include emission areas EA arranged in multiple pixel rows ROW1, ROW2, ROW3, and ROW4 and pixel columns COL1, COL2, COL3, and COL4 and a non-emission area NEA disposed adjacent to (or surround) the emission areas EA. The emission areas EA may be areas in which light generated by the light emitting element part 300 passes through the light conversion part 400 and is emitted to an outside of the display device DD. The non-emission area NEA may be an area in which no light is emitted and may correspond to a light blocking area.

Light emitted from the emission areas EA may be light corresponding to the primary color of the pixel PX corresponding to each of the emission areas EA. In an embodiment, the emission areas EA may include first emission areas EA1 emitting light of a first color, second emission areas EA2 emitting light of a second color, and third emission areas EA3 emitting light of a third color. For example, the emission areas EA may include the first emission areas EA1 (e.g., emission areas of blue pixels) emitting blue light (e.g., blue light having a peak wavelength in a range of about 440 nm to about 480 nm), the second emission areas EA2 (e.g., emission areas of red pixels) emitting red light (e.g., red light having a peak wavelength in a range of about 610 nm to about 650 nm), and the third emission areas EA3 (e.g., emission areas of green pixels) emitting green light (e.g., green light having a peak wavelength in a range of about 510 nm to about 550 nm). However, the primary color of light emitted from each of the emission areas EA is not limited thereto.

In an embodiment, the light conversion part 400 may include a wavelength conversion part WCP disposed or provided only in some of the emission areas EA. For example, the wavelength conversion part WCP may include first wavelength conversion patterns WCP1 that are disposed in the second emission areas EA2 and convert light of the first color generated in each of the second emission areas EA2 into light of the second color, and second wavelength conversion patterns WCP2 that are disposed in the third emission areas EA3 and convert the light of the first color generated in each of the third emission areas EA3 into light of the third color. The wavelength conversion part WCP may not be disposed or provided in the first emission areas EA1. In an embodiment, each of the first emission areas EA1 may not include a wavelength conversion pattern. The light of the first color generated in each of the first emission areas EA1 may pass through the light conversion part 400 and/or the protection member 500 and be emitted to the outside of the display device DD. In an embodiment, the light conversion part 400 may further include color filters disposed or provided in the emission areas EA. Accordingly, light corresponding to each primary color may be emitted from the emission areas EA.

In an embodiment, at least one first emission area EA1 may be disposed (e.g., disposed directly) adjacent to a periphery of each of the second emission areas EA2. At least one first emission area EA1 may be disposed (e.g., disposed directly) adjacent to a periphery of each of the third emission areas EA3. Each of the first wavelength conversion patterns WCP1 disposed or provided in the second emission areas EA2 and the second wavelength conversion patterns WCP2 disposed or provided in the third emission areas EA3 may include a wavelength shifter introduced through at least one adjacent first emission area EA1. Accordingly, even in the high-resolution display device DD in which a width (e.g., a width W1 in the first direction DR1 and/or a width W2 in the second direction DR2) and/or an area of each of unit pixels UPA are reduced and the emission areas EA are densely disposed with smaller areas, the first wavelength conversion patterns WCP1 and the second wavelength conversion patterns WCP2 may be readily formed in the second emission areas EA2 and the third emission areas EA3 by an inkjet method, respectively. A detailed description thereof will be described below.

In an embodiment, the display area DA may include the unit pixels UPA including multiple pixel rows and/or pixel columns. For example, FIG. 4 illustrates that each of the unit pixels UPA includes the four emission areas EA in which two pixel rows (e.g., ROW1 and RO2) and two pixel columns (e.g., COL1 and COL2) are arranged adjacent to each other. For convenience, in FIG. 4, only one of the unit pixels UPA including the four emission areas EA (e.g., EA1, EA1, EA2, and EA3) arranged in a first pixel row ROW1 and a second pixel row ROW2, and a first pixel column COL1 and a second pixel column COL2 will be displayed.

In an embodiment, each of the unit pixels UPA may include two first emission areas EA1, one second emission area EA2, and one third emission area EA3. For example, each unit pixel UPA may be constituted with two first color pixels, one second color pixel, and one third color pixel.

However, the disclosure is not limited thereto. For example, in another embodiment, each of the unit pixels UPA may include one first emission area EA1, one second emission area EA2, and one third emission area EA3. For example, in another embodiment, in the unit pixel UPA of FIG. 4, one of the two first emission areas EA1 may be changed to or replaced with the non-emission area NEA, a transparent window area, a sensor area, or the like.

In an embodiment, in each pixel column COL1, COL2, COL3, or COL4 of the display area DA, in the first direction DR1, the first emission areas EA1 and the second emission areas EA2 may be sequentially or alternately arranged, or the third emission areas EA3 and the first emission areas EA1 may be sequentially or alternately arranged. For example, in the odd-numbered pixel columns (e.g., the first pixel column COL1 and the third pixel column COL3) of the display area DA, the first emission areas EA1 and the second emission area EA2 may be alternately and repeatedly arranged, and in the even-numbered pixel columns (e.g., the second pixel column COL2 and the fourth pixel column COL4) of the display area DA, the third emission areas EA3 and the first emission areas EA1 may be alternately and repeatedly arranged.

In an embodiment, in each pixel row ROW1, ROW2, ROW3, or ROW4 of the display area DA, in the second direction DR2, the first emission areas EA1 and the third emission areas EA3 may be sequentially or alternately arranged, or the second emission areas EA2 and the first emission areas EA1 may be sequentially or alternately arranged. For example, in the odd-numbered pixel rows (e.g., the first pixel row ROW1 and the third pixel row ROW3) of the display area DA, the first emission areas EA1 and the third emission area EA3 may be alternately and repeatedly arranged, and in the even-numbered pixel rows (e.g., the second pixel row ROW2 and the fourth pixel row ROW4) of the display area DA, the second emission areas EA2 and the first emission areas EA1 may be alternately and repeatedly arranged.

In an embodiment, the first emission areas EA1 may be arranged in the display area DA in a checkerboard shape in a plan view. For example, in each pixel column COL1, COL2, COL3, or COL4 and each pixel row ROW1, ROW2, ROW3, or ROW4 of the display area DA, the first emission areas EA1 may be discontinuously disposed so as not to be adjacent to each other. However, the arrangement structure of the emission areas EA is not limited thereto.

Figure 5:
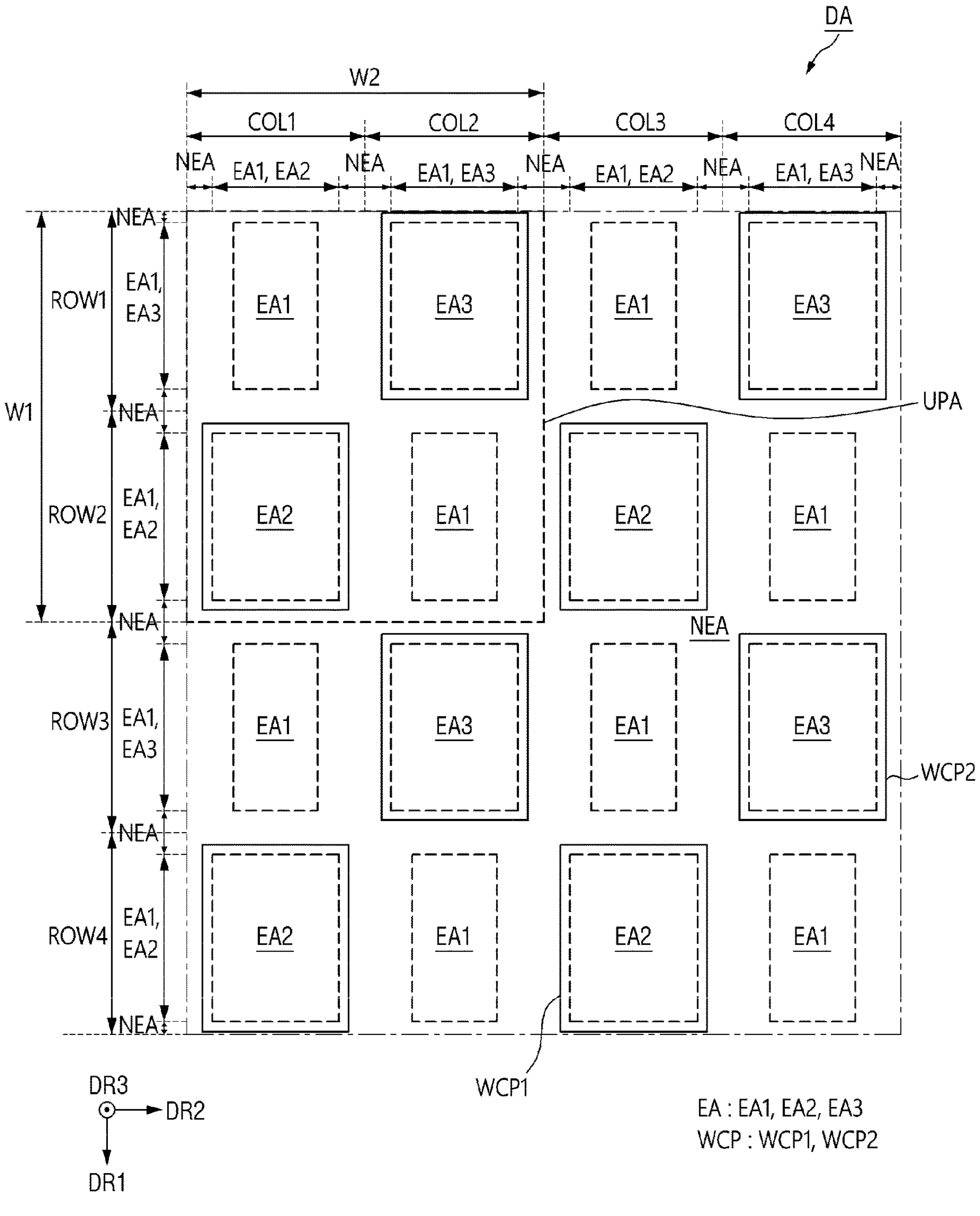
FIG. 5 is a schematic plan view illustrating a display area of a display device according to an embodiment.

FIG. 5 is a schematic plan view illustrating the display area DA of the display device DD according to an embodiment.

Referring to FIG. 5 (in addition to FIGS. 1 to 4), a width of the first emission areas EA1 of FIG. 5 may be reduced compared to the width of the first emission areas EA1 of FIG. 4. For example, by forming the width of each of the first emission areas EA1 to be less than the width of each of the second emission areas EA2 and/or the third emission areas EA3, a color balance of light emitted from each of the unit pixels UPA may be adjusted. In FIG. 5, only the width in the second direction DR2 is reduced in each of the first emission areas EA1, but the disclosure is not limited thereto. For example, in another embodiment, by reducing the width of each of the first emission areas EA1 in the first direction DR1 or reducing the width of each of the first emission areas EA1 in both the first direction DR1 and the second direction DR2, color balance (e.g., white balance) of light emitted from each of the unit pixels UPA may be adjusted.

Figure 6:
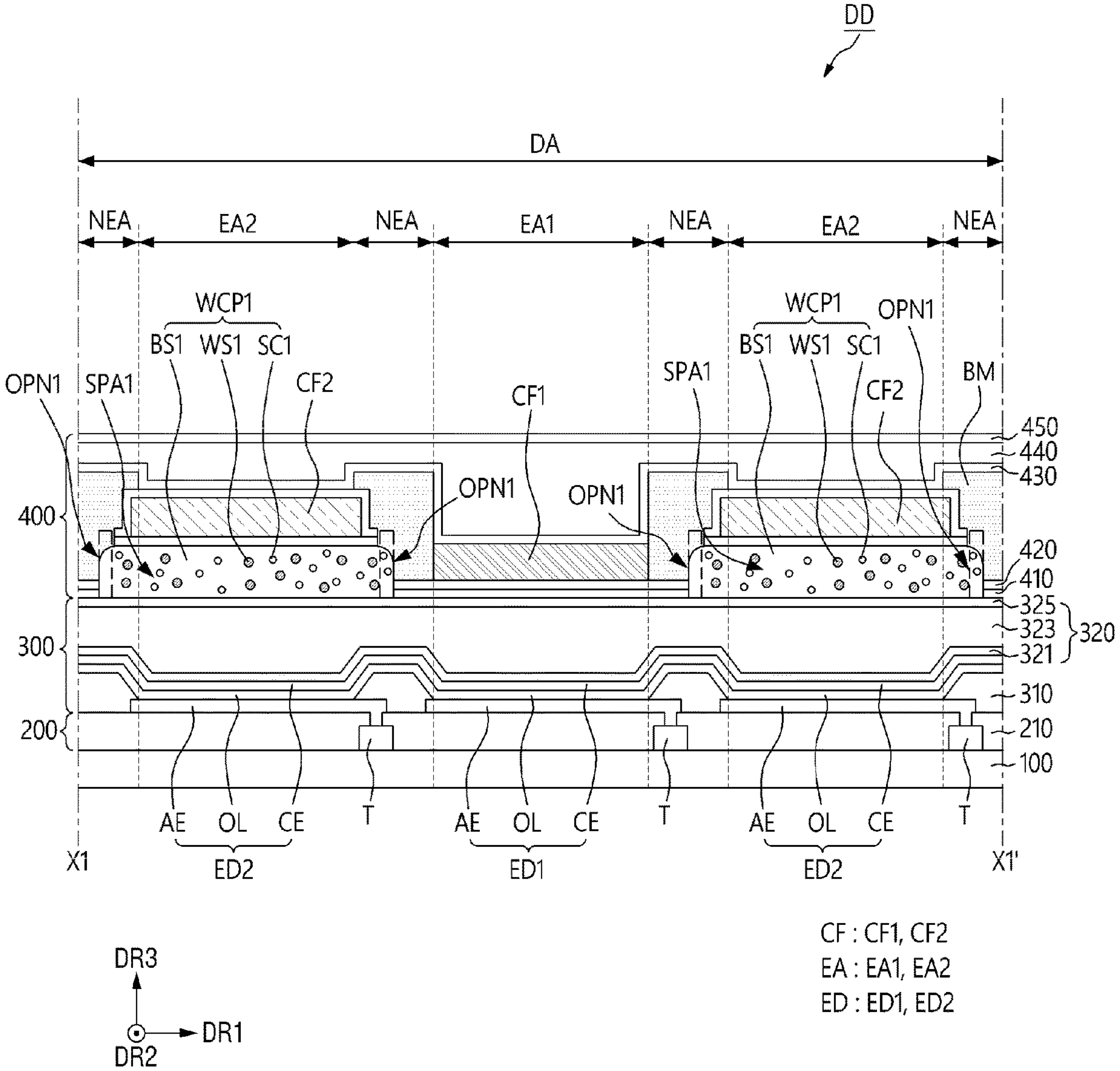
FIG. 6 is a schematic cross-sectional view of the display device according to an embodiment taken along line X1-X1' of FIG. 4.
Figure 7:
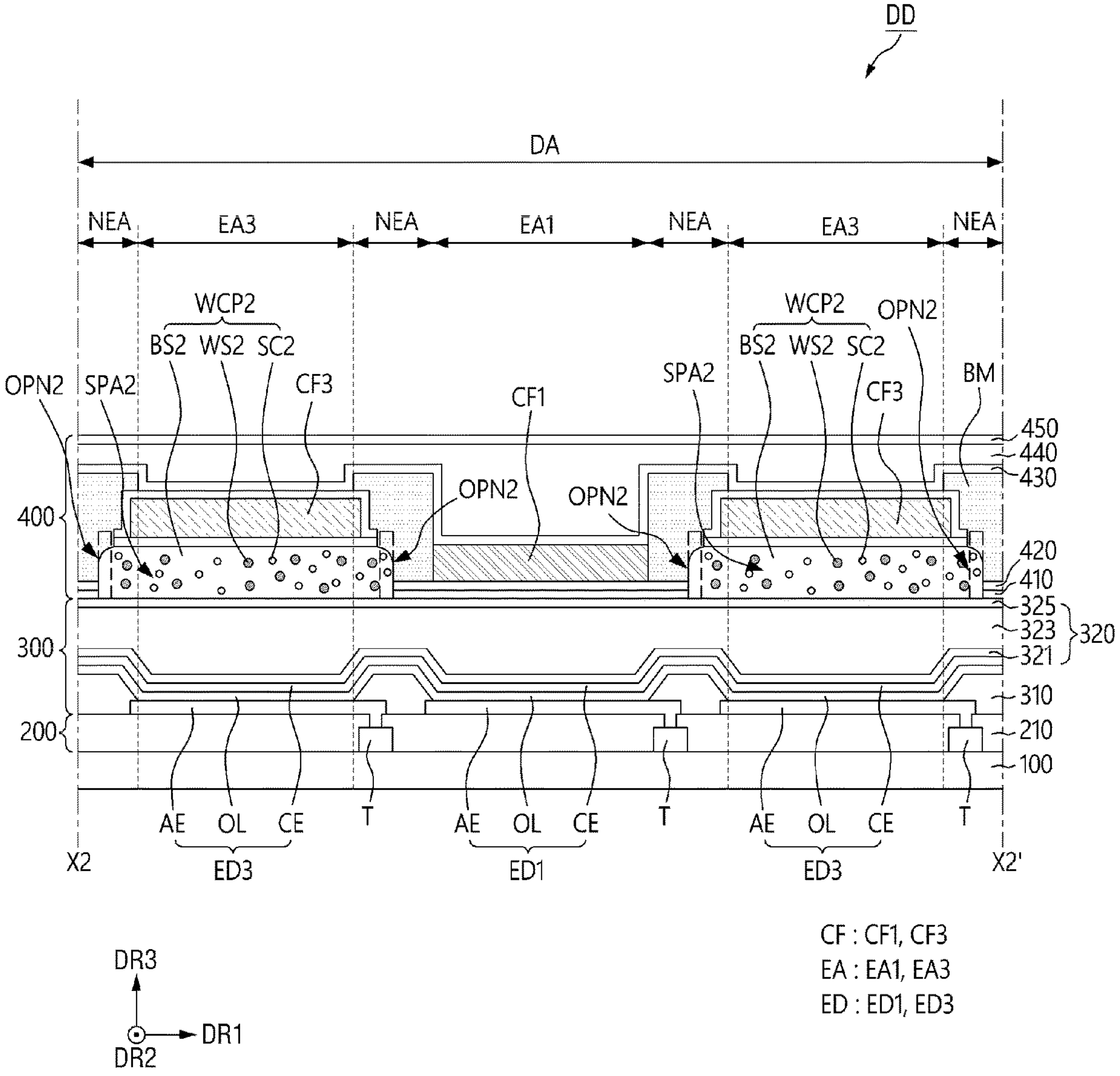
FIG. 7 is a schematic cross-sectional view of the display device according to an embodiment taken along line X2-X2' of FIG. 4.

FIG. 6 is a schematic cross-sectional view of the display device DD according to an embodiment taken along line X1-X1' of FIG. 4. FIG. 7 is a schematic cross-sectional view of the display device DD according to an embodiment taken along line X2-X2' of FIG. 4.

Referring to FIGS. 6 and 7 (in addition to FIGS. 1 to 5), the display device DD may include the base member 100, the panel circuit part 200, the light emitting element part 300, and the light conversion part 400 sequentially disposed (or provided) on the base member 100. In an embodiment, the display device DD may further include the protection member (see, e.g., 500 of FIG. 3) (e.g., an insulating layer or an upper substrate) disposed or provided on the light conversion part (see, e.g., 400 of FIG. 3).

As described above, the base member 100 may be a rigid or flexible substrate, film, or the like. In an embodiment, the base member 100 may further include a separate layer provided on a substrate, a film, or a like, for example, a buffer layer or an insulating layer.

The display area DA may be defined in the base member 100, and the emission areas EA and the non-emission area NEA may be defined in the display area DA. For example, the base member 100 may include the display area DA, and the display area DA may include the emission areas EA and the non-emission area NEA. For example, multiple emission areas EA including the first emission areas EA1, the second emission areas EA2, and the third emission areas EA3, and the non-emission area NEA disposed adjacent to (or surround) the emission areas EA may be defined in the display area DA of the base member 100. For example, the display area DA may include the first emission areas EA1, the second emission areas EA2, and the non-emission area NEA. A portion of the non-emission area NEA may be disposed between the adjacent emission areas EA in the first direction DR1 and the second direction DR2.

The panel circuit part 200 may be selectively disposed or provided on the base member 100. The panel circuit part 200 may include circuit elements such as transistors T, wires, and the like. In an embodiment, FIG. 6 schematically illustrates the transistors T electrically connected to the light emitting elements ED of the pixels PX of circuit elements provided to the panel circuit part 200. In an embodiment, each of the transistors T may be a thin film transistor including polysilicon, a thin film transistor including an oxide semiconductor, or the like.

An insulating layer 210 may be disposed (or provided) on circuit elements such as the transistors T, wires, and the like. In an embodiment, the insulating layer 210 may be a planarization layer. In an embodiment, the insulating layer 210 may be formed of an organic layer. For example, the insulating layer 210 may include an acrylic resin, an epoxy resin, an imide resin, an ester resin, the like, or a combination thereof.

The light emitting element part 300 including the light emitting elements ED may be disposed (or provided) on the panel circuit part 200. The light emitting elements ED may be disposed in the emission areas EA, and each of the emission areas EA may include at least one light emitting element ED. For example, the first light emitting elements ED1 may be disposed in the first emission areas EA1, and the second light emitting elements ED2 may be disposed in the second emission areas EA2. Similarly, the third light emitting elements ED3 may be disposed in the third emission areas EA3. In an embodiment, the light emitting elements ED may be formed (e.g., directly formed) on the base member 100 on which the panel circuit part 200 is formed.

Each of the light emitting elements ED may include an anode electrode AE, a light emitting layer OL, and a cathode electrode CE. In an embodiment, the anode electrode AE, the light emitting layer OL, and the cathode electrode CE may be sequentially stacked on the insulating layer 210 of the panel circuit part 200. However, the disclosure is not limited thereto. For example, the cathode electrode CE may be disposed on the insulating layer 210 of the panel circuit part 200, and the light emitting layer OL and the anode electrode AE may be sequentially stacked on the cathode electrode CE. Each of the light emitting elements ED may penetrate the insulating layer 210 of the panel circuit part 200 and be electrically connected to at least one circuit element (e.g., the transistor T) constituting the pixel circuit of the corresponding to the pixel PX.

In an embodiment, the anode electrodes AE may be a reflective electrode, and the anode electrodes AE may include a metal layer including a metal such as Ag, Mg, Al, Pt, Pd, Au, Ni, Nd, Ir, Cr, the like, or an alloy thereof. In another embodiment, the anode electrodes AE may further include a metal oxide layer stacked or disposed on the metal layer. In an embodiment, each of the anode electrodes AE may have a two-layer structure of ITO/Ag, Ag/ITO, ITO/Mg, or ITO/MgF or a multilayer structure such as ITO/Ag/ITO or the like. In an embodiment, the anode electrodes AE may be formed as individual patterns separated from each other.

A pixel defining layer 310 may be disposed on the anode electrodes AE. For example, the pixel defining layer 310 may be disposed on ends of the anode electrodes AE and a portion of the insulating layer 210. The pixel defining layer 310 may be disposed in the non-emission area NEA and may include openings exposing each of the anode electrodes AE corresponding to each of the emission areas EA. For example, the pixel defining layer 310 may define the emission areas EA and the non-emission area NEA.

In an embodiment, the pixel defining layer 310 may include an organic insulating material including at least one of an acrylic resin, an epoxy resin, a phenolic resin, a polyamide resin, a polyimide resin, an unsaturated polyester resin, a polyphenylene ether resin, a polyphenylenesulfide resin, and benzocyclobutene (BCB). In an embodiment, the pixel defining layer 310 may overlap the light blocking member BM in a plan view.

The light emitting layer OL may be disposed on the anode electrodes AE and the pixel defining layer 310. In an embodiment, the light emitting layer OL may have a shape of a continuous layer formed in the emission areas EA and the non-emission area NEA. For example, the light emitting layer OL may have a shape of a common layer formed (e.g., formed entirely) in the display area DA. In an embodiment, the light emitting layer OL may emit light of the first color, and each of the light emitting elements ED may emit light of substantially a same color. For example, all of the first light emitting elements ED1, the second light emitting elements ED2, and the third light emitting elements ED3 may emit blue light.

A cathode electrode CE may be disposed on the light emitting layer OL. In an embodiment, the cathode electrode CE may have a semi-transmissive or transmissive property. In case that the cathode electrode CE has a semi-transmissive property, the cathode electrode CE may include Ag, Mg, Cu, Al, Pt, Pd, Au, Ni, Nd, Ir, Cr, Li, Ca, LiF/Ca, LiF/Al, Mo, Ti, the like, or a compound or mixture thereof, such as a mixture of Ag and Mg. In case that the cathode electrode CE has a thickness of tens to hundreds of angstroms, the cathode electrode CE may have a semi-transmissive property.

In case that the cathode electrode CE has a transmissive property, the cathode electrode CE may include a transparent conductive oxide (TCO) or the like. For example, the cathode electrode CE may include tungsten oxide ($W_xO_y$), titanium oxide ($TiO_2$), indium tin oxide (ITO), indium zinc oxide (IZO), zinc oxide (ZnO), indium tin zinc oxide (ITZO), magnesium oxide (MgO), the like, or a combination thereof.

Light of the first color (e.g., blue light) emitted from each of the first light emitting elements ED1 may pass through a first color filter CF1 and be emitted to an outside. Accordingly, light of the first color may be emitted from the first emission area EA1.

Light of the first color (e.g., blue light) emitted from each of the second light emitting elements ED2 may be converted into light of the second color (e.g., red light) by passing through the first wavelength conversion pattern WCP1 and pass through a second color filter CF2 to be emitted to the outside. Accordingly, light of the second color may be emitted from the second emission area EA2.

Light of the first color (e.g., blue light) emitted from each of the third light emitting elements ED3 may be converted into light of the third color (e.g., green light) by passing through the second wavelength conversion pattern WCP2 and pass through a third color filter CF3 to be emitted to the outside. Accordingly, light of the third color may be emitted from the third emission area EA3.

An encapsulation layer 320 may be disposed or provided on the cathode electrode CE. The encapsulation layer 320 may be commonly disposed in the emission areas EA and the non-emission areas NEA. In an embodiment, the encapsulation layer 320 may cover (e.g., directly cover) the cathode electrode CE. In an embodiment, a capping layer (not illustrated) covering the cathode electrode CE may be provided between the encapsulation layer 320 and the cathode electrode CE, and the encapsulation layer 320 may cover (e.g., directly cover) the capping layer.

In an embodiment, the encapsulation layer 320 may include a first encapsulation layer 321, a second encapsulation layer 323, and a third encapsulation layer 325 sequentially stacked on the cathode electrode CE. In an embodiment, each of the first encapsulation layer 321 and the third encapsulation layer 325 may include an inorganic layer including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, the like, or a combination thereof. In an embodiment, the second encapsulation layer 323 may include an organic layer including an acrylic resin, a methacrylic resin, polyisoprene, a vinyl resin, an epoxy resin, a urethane resin, a cellulose resin, a perylene resin, or the like. However, the structure of the encapsulation layer 320 and the material constituting of the encapsulation layer 320 is not limited thereto.

The encapsulation layer 320 may constitute the light emitting element part 300 together with the light emitting elements ED. In another embodiment, the encapsulation layer 320 may be a separate component from the light emitting element part 300.

The light conversion part 400 may be disposed (or provided) on the light emitting element part 300. The light conversion part 400 may include the wavelength conversion part (see, e.g., WCP of FIG. 4), a color filter part CF, and the light blocking member BM. In an embodiment, the light conversion part 400 may further include at least one of a first insulating layer 410 (or a first capping layer), a second insulating layer 420 (or a second capping layer), a third insulating layer 430 (or a third capping layer), a fourth insulating layer 440, and a fifth insulating layer 450. In an embodiment, the wavelength conversion part (see, e.g., WCP of FIG. 4), the color filter part CF, the light blocking member BM, and the like may be formed (e.g., directly formed) on the base member 100 on which the light emitting element part 300 is formed.

The wavelength conversion part (see, e.g., WCP of FIG. 4) may include the first wavelength conversion patterns WCP1 disposed in the second emission areas EA2 and the second wavelength conversion patterns WCP2 disposed in the third emission areas EA3, which are provided on the light emitting element part 300. In an embodiment, the wavelength conversion part (see, e.g., WCP of FIG. 4) may not be disposed or provided in the first emission areas EA1. In an embodiment, the wavelength conversion part (see, e.g., WCP of FIG. 4) may be formed by an inkjet method.

The first wavelength conversion patterns WCP1 may be disposed on the second light emitting elements ED2, and may be disposed in the second emission areas EA2. In each of the second emission areas EA2, the first wavelength conversion pattern WCP1 may overlap the second color filter CF2 in a plan view. For example, the first wavelength conversion pattern WCP1 may be disposed under the second color filter CF2.

In an embodiment, the first wavelength conversion patterns WCP1 may have a greater area and/or a greater width than the first emission areas EA1, and ends of the first wavelength conversion patterns WCP1 may be disposed in the non-emission area NEA. For example, with respect to the first direction DR1, both ends of the first wavelength conversion patterns WCP1 may be disposed in the non-emission area NEA between the first emission areas EA1 and the second emission areas EA2.

In an embodiment, the first wavelength conversion patterns WCP1 may be disposed or provided under the first insulating layer 410, and may fill first spaces SPA1 open toward the adjacent first emission areas EA1 by first openings OPN1 formed in the first insulating layer 410 and/or the second insulating layer 420 between adjacent ones of the first emission areas EA1 in the first direction DR1 (and/or in a direction opposite to the first direction DR1). For example, the first wavelength conversion patterns WCP1 may fill the first spaces SPA1 of a structure of which both ends in the first direction DR1 are not covered by the first insulating layer 410 and are open (e.g., a tunnel structure that extends in the first direction DR1 and in which the first openings OPN1 are formed at both ends in the first direction DR1), in the non-emission area NEA between the first emission areas EA1 and the second emission areas EA2 adjacent in the first direction DR1. The first openings OPN1 may be covered by the light blocking member BM disposed or provided in the non-emission area NEA. Accordingly, the first spaces SPA1 may be closed by the light blocking member BM.

The first wavelength conversion patterns WCP1 may emit light by converting or shifting a peak wavelength of incident light to another peak wavelength (e.g., specific peak wavelength). For example, the first wavelength conversion patterns WCP1 may convert light of the first color, for example, blue light emitted from each of the second light emitting elements ED2 into red light having a peak wavelength in a range of about 610 nm to about 650 nm and emit the red light.

In an embodiment, each of the first wavelength conversion patterns WCP1 may include a first base resin BS1 and a first wavelength shifter WS1 dispersed in the first base resin BS1. In an embodiment, each of the first wavelength conversion patterns WCP1 may further include a first scatterer SC1 dispersed in the first base resin BS1.

The first base resin BS1 may include a material having high light transmittance. In an embodiment, the first base resin BS1 may include an organic material. For example, the first base resin BS1 may include an organic material such as an epoxy resin, an acrylic resin, a cardo resin, an imide resin, the like, or a combination thereof.

The first wavelength shifter WS1 may convert or shift the peak wavelength of incident light to another peak wavelength (e.g., specific peak wavelength). For example, the first wavelength shifter WS1 may convert light of the first color, for example, blue light, provided from the second light emitting element ED2 into light of the second color, for example, red light having a single peak wavelength in a range of about 610 nm to about 650 nm and emit the red light.

For example, the first wavelength shifter WS1 may include a quantum dot, a quantum bar, a phosphor, the like, or a combination thereof. For example, the first wavelength shifter WS1 may include the quantum dot including a particulate material that emits light of a color (e.g., specific or selectable color) in case that an electron transitions from a conduction band to a valence band.

The first wavelength shifter WS1 may include the quantum dot including a semiconductor nanocrystal material. The quantum dot may have a band gap (e.g., a specific or selectable band gap) according to composition and size of the quantum dot. Thus, the quantum dot may absorb light and emit light having a wavelength (e.g., an intrinsic wavelength). For example, the first wavelength shifter WS1 including quantum dots may include semiconductor nanocrystal such as group IV nanocrystal, group II-VI compound nanocrystal, group III-V compound nanocrystal, group IV-VI compound nanocrystal, the like, or a combination thereof.

The group II-VI compound may be selected from the group consisting of: a binary compound such as CdSe, CdTe, ZnS, ZnSe, ZnTe, ZnO, HgS, HgSe, HgTe, MgSe, MgS, and a mixture thereof; a ternary compound such as AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound such as HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from the group consisting of: a binary compounds such as GaN, GaP, GaAs, GaSb, AlN, AlP, AlAs, AlSb, InN, InP, InAs, InSb, and a mixture thereof; a ternary compound such as GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from the group consisting of: a binary compound such as SnS, SnSe, SnTe, PbS, PbSe, PbTe, and a mixture thereof; a ternary compound such as SnSeS, SnSeTe, SnSTe, PbSeS, PbSeTe, PbSTe, SnPbS, SnPbSe, SnPbTe, and a mixture thereof; and a quaternary compound such as SnPbSSe, SnPbSeTe, SnPbSTe, and a mixture thereof. The group IV element may be selected from the group consisting of: Si, Ge, or mixtures thereof. The group IV compound may be selected from the group consisting of: a binary compound such as SiC, SiGe, or mixtures thereof.

The binary compound, the tertiary compound, or the quaternary compound may exist in particles at a uniform concentration, or may exist in a same particle divided into states where concentration distributions are partially different. Further, the particles may have a core/shell structure in which a quantum dot surrounds another quantum dot. An interface between the core and the shell may have a concentration gradient in which the concentration of elements present in the shell decreases toward a center.

In an embodiment, the quantum dot may have a core-shell structure including a core including the nanocrystal described above and a shell surrounding the core. The shell of the quantum dot may serve as a protective layer for maintaining semiconductor characteristics by preventing chemical denaturation of the core and/or as a charging layer for giving electrophoretic characteristics to the quantum dot. The shell may have a single layer or a multilayer. An interface between the core and the shell may have a concentration gradient in which the concentration of elements present in the shell decreases toward the center. For example, the shell of the quantum dot may include a metal oxide, a non-metal oxide, a semiconductor compound, the like, or a combination thereof.

For example, the metal oxide or the non-metal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, the like, or a mixture thereof; or a tertiary compound such as $MgAl_2O_4$, $CoFe_2O_4$, $NiFe_2O_4$, $CoMn_2O_4$, the like, or a mixture thereof, but the disclosure is not limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, the like, or a combination thereof, but the disclosure is not limited thereto.

In an embodiment, the light emitted from the first wavelength shifter WS1 may have a full width of half maximum (FWHM) of the emission wavelength spectrum, which is less than or equal to about 45 nm. In an embodiment, the light emitted from the first wavelength shifter WS1 may have the FWHM of the emission wavelength spectrum, which is the less than or equal to about 40 nm. In an embodiment, the light emitted from the first wavelength shifter WS1 may have the FWHM of the emission wavelength spectrum, which is less than or equal to about 30 nm. Thus, a purity and reproducibility of colors displayed by the display device DD may be further improved. The light emitted from the first wavelength shifter WS1 may be emitted in various directions regardless of an incident direction of the incident light. Accordingly, side visibility of the light of the second color emitted from each of the second emission area EA2 may be improved.

Some of the light of the first color provided from each of the second light emitting elements ED2 may pass through the first wavelength conversion pattern WCP1 without being converted into light of the second color by the first wavelength shifter WS1. The light of the first color incident to the second color filter CF2 without being converted by the first wavelength conversion pattern WCP1 may be blocked by the second color filter CF2. On the other hand, the light of the second color converted by the first wavelength conversion pattern WCP1 from the light of the first color provided from each of the second light emitting elements ED2 may pass through the second color filter CF2 and be emitted to the outside. Accordingly, light of the second color may be emitted from the second emission area EA2.

The first scatterer SC1 and the first base resin BS1 may have different refractive indexes and form an optical interface. For example, the first scatterer SC1 may be light scattering particles. The first scatterer SC1 is not particularly limited as long as it is a material capable of scattering at least a portion of the transmitted light, and in an embodiment, the first scatterer SC1 may be metal oxide particles, organic particles, the like, or a combination thereof. For example, the first scatterer SC1 may include a metal oxide such as titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), the like, or a combination thereof. For example, the first scatterer SC1 may include an organic particle including an acrylic resin, a urethane resin, the like, or a combination thereof. The first scatterer SC1 may scatter light in a random direction regardless of the incident direction of incident light, without substantially converting the wavelength of light passing through the light conversion part 400.

The second wavelength conversion patterns WCP2 may be each disposed on the third light emitting elements ED3, and may be each disposed in the third emission areas EA3. In each of the third emission areas EA3, the second wavelength conversion pattern WCP2 may overlap the third color filter CF3 in a plan view. For example, the second wavelength conversion pattern WCP2 may be disposed under the third color filter CF3.

In an embodiment, the second wavelength conversion patterns WCP2 may have a greater area and/or a greater width than the second emission areas EA2, respectively, and ends of the second wavelength conversion patterns WCP2 may be each disposed in the non-emission area NEA. For example, with respect to the first direction DR1, both ends of the second wavelength conversion patterns WCP2 may be disposed in the non-emission area NEA between the first emission areas EA1 and the third emission areas EA3.

In an embodiment, the second wavelength conversion patterns WCP2 may be disposed or provided under the first insulating layer 410 and may respectively fill second spaces SPA2 open toward the adjacent first emission areas EA1 by second openings OPN2 formed in the first insulating layer 410 and/or the second insulating layer 420 between adjacent ones of the first emission areas EA1 in the first direction DR1 (and/or in a direction opposite to the first direction DR1). For example, the second wavelength conversion patterns WCP2 may fill the second spaces SPA2 of a structure of which both ends in the first direction DR1 are not covered by the first insulating layer 410 and are open (e.g., a tunnel structure that extends in the first direction DR1 and in which the second openings OPN2 are formed at both ends in the first direction DR1), in the non-emission area NEA between the first emission areas EA1 and the third emission areas EA3 adjacent in the first direction DR1. The second openings OPN2 may be covered by the light blocking member BM disposed or provided in the non-emission area NEA. Accordingly, the second spaces SPA2 may be closed by the light blocking member BM.

The second wavelength conversion patterns WCP2 may emit light by converting or shifting a peak wavelength of incident light to another peak wavelength (e.g., specific peak wavelength). For example, the second wavelength conversion patterns WCP2 may convert light of the first color, for example, blue light emitted from each of the third light emitting elements ED3 into green light having a peak wavelength in a range of about 510 nm to about 550 nm and emit the green light.

In an embodiment, each of the second wavelength conversion patterns WCP2 may include a second base resin BS2 and a second wavelength shifter WS2 dispersed in the second base resin BS2. In an embodiment, each of the second wavelength conversion patterns WCP2 may further include a second scatterer SC2 dispersed in the second base resin BS2.

The second base resin BS2 may include a material having high light transmittance. In an embodiment, the second base resin BS2 may include an organic material. For example, the second base resin BS2 and the first base resin BS1 may include a same material, or the second base resin BS2 may include at least one of the materials described as an example as the constituent materials of the first base resin BS1.

The second wavelength shifter WS2 may convert or shift the peak wavelength of incident light to another peak wavelength (e.g., specific peak wavelength). For example, the second wavelength shifter WS2 may convert light of the first color, for example, blue light, provided from the third light emitting element ED3 into light of the third color, for example, green light having a peak wavelength in a range of about 510 nm to about 550 nm.

For example, the second wavelength shifter WS2 may include a quantum dot, a quantum bar, a phosphor, the like, or a combination thereof. A description of the second wavelength shifter WS2 and the description of the first wavelength shifter WS1 are substantially similar to, and the same description will be omitted.

In an embodiment, both the first wavelength shifter WS1 and the second wavelength shifter WS2 may be formed of quantum dots. The particle size of the quantum dots forming the first wavelength shifter WS1 may be greater than the particle size of the quantum dots forming the second wavelength shifter WS2.

The second scatterer SC2 and the second base resin BS2 may have different refractive indexes and form an optical interface. For example, the second scatterer SC2 may be light scattering particles. A description of the second scatterer SC2 and the description of the first scatterer SC1 are substantially the same or similar to, and the same description will be omitted.

The first insulating layer 410 may be disposed or provided on the wavelength conversion part (see, e.g., WCP of FIG. 4). The first insulating layer 410 may cover each of the first wavelength conversion patterns WCP1 and the second wavelength conversion patterns WCP2 and may be formed (e.g., formed entirely) in the display area DA including the first emission areas EA1, the second emission areas EA2, and the third emission areas EA3.

In an embodiment, the first insulating layer 410 may be a capping layer protecting the wavelength conversion part (see, e.g., WCP of FIG. 4) and may include an inorganic material. For example, the first insulating layer 410 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, the like, or a combination thereof.

In an embodiment, the first insulating layer 410 may define the first space SPA1 in which each of the first wavelength conversion patterns WCP1 is formed. The first insulating layer 410 may define the second space SPA2 in which each of the second wavelength conversion patterns WCP2 is formed.

The first insulating layer 410 may be opened between the first emission areas EA1 and the second emission areas EA2 to expose portions of the first wavelength conversion patterns WCP1. Similarly, the first insulating layer 410 may be opened between the first emission areas EA1 and the third emission areas EA3 to expose portions of the second wavelength conversion patterns WCP2.

In an embodiment, the first insulating layer 410 may be opened adjacent to the first emission area EA1 in the first direction DR1 among portions thereof covering each of the first wavelength conversion patterns WCP1 and may expose a portion of the first wavelength conversion pattern WCP1. For example, the first insulating layer 410 may be opened toward at least one adjacent first emission area EA1 at least an end thereof in the first direction DR1 among portions thereof covering each of the first wavelength conversion patterns WCP1 and may expose a portion of the first wavelength conversion pattern WCP1.

For example, at one of the second emission areas EA2 arranged in a middle of a row in the display area DA, the first insulating layer 410 may be opened toward the two first emission areas EA1 disposed adjacent to the second emission area EA2 at both ends thereof in the first direction DR1 among portions thereof covering the first wavelength conversion pattern WCP1 of the second emission area EA2 and may expose both ends of the first wavelength conversion pattern WCP1. Both the exposed ends of the first wavelength conversion pattern WCP1 may be covered by a light blocking member BM.

In an embodiment, the first insulating layer 410 may be opened adjacent to the first emission area EA1 in the first direction DR1 among portions thereof covering each of the second wavelength conversion patterns WCP2 and may expose a portion of the second wavelength conversion pattern WCP2. For example, the first insulating layer 410 may be opened toward at least one adjacent first emission area EA1 at least an end thereof in the first direction DR1 among portions thereof covering each of the second wavelength conversion patterns WCP2 and may expose a portion of the second wavelength conversion pattern WCP2.

For example, at one of the third emission areas EA3 arranged in a middle of a row in the display area DA, the first insulating layer 410 may be opened toward the two first emission areas EA1 disposed adjacent to the third emission area EA3 at both ends thereof in the first direction DR1 among portions thereof covering the second wavelength conversion pattern WCP2 of the third emission area EA3 and may expose both ends of the second wavelength conversion pattern WCP2. Both the exposed ends of the second wavelength conversion pattern WCP2 may be covered by the light blocking member BM.

The color filter part CF may include the first color filter CF1 disposed or provided in each of the first emission areas EA1, the second color filter CF2 disposed or provided in each of the second emissions areas EA2, and the third color filter CF3 disposed or provided in each of the third emission areas EA3.

The first color filter CF1 may be provided on each of the first light emitting elements ED1. For example, the first color filter CF1 may be disposed or provided on the first insulating layer 410 and the second insulating layer 420 to overlap the first light emitting element ED1 in a plan view. The first color filter CF1 may transmit light of the first color (e.g., blue light) emitted from the first light emitting element ED1 and may block or absorb light of other colors (e.g., red light and green light). For example, the first color filter CF1 may be a blue color filter and may include a blue colorant such as a blue dye, a blue pigment, or the like.

The second color filter CF2 may be provided on each of the first wavelength conversion patterns WCP1. For example, the second color filter CF2 may be disposed or provided on the first insulating layer 410 to overlap each of the first wavelength conversion patterns WCP1 in a plan view. The second color filter CF2 may block or absorb the first color light (e.g., blue light). For example, the second color filter CF2 may function as a blue light blocking filter that blocks blue light. In an embodiment, the second color filter CF2 may transmit light of the second color (e.g., red light), and block or absorb light of the first color (e.g., blue light) and light of the third color (e.g., green light). For example, the second color filter CF2 may be a red color filter and may include a red colorant.

The third color filter CF3 may be provided on each of the second wavelength conversion patterns WCP2. For example, the third color filter CF3 may be disposed or provided on the first insulating layer 410 to overlap each of the second wavelength conversion patterns WCP2 in a plan view. The third color filter CF3 may block or absorb the first color light (e.g., blue light). For example, the third color filter CF3 may also function as a blue light blocking filter. In an embodiment, the third color filter CF3 may selectively transmit light of the third color (e.g., green light), and block or absorb light of the first color (e.g., blue light) and light of the second color (e.g., red light). For example, the third color filter CF3 may be a green color filter and may include a green colorant.

In an embodiment, the first color filter CF1, the second color filter CF2, and the third color filter CF3 may be provided on different layers. For example, in case that the light conversion part 400 is formed or disposed (e.g., directly formed or disposed) on the base member 100 including the light emitting element part 300, the wavelength conversion part (see, e.g., WCP of FIG. 4) may not be provided between the first color filter CF1 and the light emitting element part 300, and the wavelength conversion part (see, e.g., WCP of FIG. 4) may be provided between the second color filter CF2, third color filter CF3, and the light emitting element part 300, so that the first color filter CF1 may be disposed closer to the light emitting element part 300 than the second color filter CF2 and the third color filter CF3.

The second insulating layer 420 may be disposed or provided on the second color filters CF2 and the third color filters CF3. In an embodiment, the first color filter CF1 may be disposed or provided on the second insulating layer 420 and may be formed after the light blocking member BM is formed. For example, the light blocking member BM and the first color filter CF1 may be sequentially or continuously formed, and the first color filter CF1 may contact (e.g., directly contact) the side surface of the light blocking member BM.

The second insulating layer 420 may cover the second color filters CF2 and the third color filters CF3. In an embodiment, the second insulating layer 420 may be disposed or provided (e.g., disposed or provided entirely) in the display area DA including the first emission areas EA1, the second emission areas EA2, and the third emission areas EA3.

In an embodiment, the second insulating layer 420 may be a capping layer protecting the second color filters CF2 and the third color filters CF3 and may include an inorganic material. For example, the second insulating layer 420 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, the like, or a combination thereof.

In an embodiment, the second insulating layer 420 may be opened along with the first insulating layer 410 at a portion disposed adjacent to the first emission areas EA1. Accordingly, the second insulating layer 420 may expose a portion of each of the first wavelength conversion patterns WCP1 and the second wavelength conversion patterns WCP2.

For example, the second insulating layer 420 may be opened toward at least one adjacent first emission area EA1 (e.g., the two first emission areas EA1 disposed adjacent to each of the first wavelength conversion patterns WCP1 in the first direction DR1) on or around each of the first wavelength conversion patterns WCP1 and may expose a portion of the first wavelength conversion pattern WCP1 (e.g., portions corresponding to both ends of the first wavelength conversion pattern WCP1 with respect to the first direction DR1). An exposed portion of the first wavelength conversion pattern WCP1 may be covered by the light blocking member BM.

Similarly, the second insulating layer 420 may be opened toward at least one adjacent first emission area EA1 (e.g., the two first emission areas EA1 disposed adjacent to each of the second wavelength conversion patterns WCP2 in the first direction DR1) on or around each of the second wavelength conversion patterns WCP2 and may expose a portion of the second wavelength conversion pattern WCP2 (e.g., portions corresponding to both ends of the second wavelength conversion pattern WCP2 with respect to the first direction DR1). The exposed portion of the second wavelength conversion pattern WCP2 may be covered by the light blocking member BM.

The light blocking member BM may be disposed in the non-emission area NEA and block transmission of light. In an embodiment, the light blocking member BM may cover exposed portions of the first wavelength conversion patterns WCP1 and the second wavelength conversion patterns WCP2. For example, the first wavelength conversion patterns WCP1 and the second wavelength conversion patterns WCP2 exposed at both ends in the first direction DR1 before the formation of the light blocking member BM may be covered by the light blocking member BM. In an embodiment, the light blocking member BM may be disposed or formed (e.g., directly disposed or formed) on the exposed portions of the first wavelength conversion patterns WCP1 and the second wavelength conversion patterns WCP2 and on a portion of the second insulating layer 420 disposed adjacent to the exposed portions of the first wavelength conversion patterns WCP1 and the second wavelength conversion patterns WCP2. The light blocking member BM may contact (e.g., directly contact) the exposed portions of the first wavelength conversion patterns WCP1 and the second wavelength conversion patterns WCP2.

The light blocking member BM may be disposed between and around the emission areas EA to surround the emission areas EA, and may prevent color mixing between the emission areas EA. In an embodiment, the light blocking member BM may include an organic light blocking material.

At least one insulating layer may be disposed or provided on a surface of the base member 100 on which the color filters CF and the light blocking member BM are formed. For example, the third insulating layer 430 may be formed (e.g., formed entirely) in the display area DA to cover the color filters CF and the light blocking member BM, and the fourth insulating layer 440 and the fifth insulating layer 450 may be sequentially formed on the third insulating layer 430. In an embodiment, the third insulating layer 430, the fourth insulating layer 440, and the fifth insulating layer 450 may be disposed or provided (e.g., disposed or provided entirely) in the display area DA including the first emission areas EA1, the second emission areas EA2, and the third emission areas EA3. However, the number, type, stacked structure, and the like of the insulating layers covering the color filters CF and the light blocking member BM are not limited thereto.

The third insulating layer 430 may be disposed or provided on the base member 100 on which the color filter part CF, the second insulating layer 420, the light blocking member BM, and the like are formed. In an embodiment, the third insulating layer 430 may be a capping layer protecting the first color filters CF1 and may cover at least the first color filters CF1. In an embodiment, the third insulating layer 430 may include an inorganic material. For example, the third insulating layer 430 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, the like, or a combination thereof.

The fourth insulating layer 440 and the fifth insulating layer 450 may be disposed or provided on the third insulating layer 430. The fourth insulating layer 440 and the fifth insulating layer 450 may seal components disposed under the fourth insulating layer 440 and the fifth insulating layer 450. In an embodiment, the fourth insulating layer 440 may include an organic material, and the fifth insulating layer 450 may include an inorganic material.

In an embodiment, the protection member (see, e.g., 500 of FIG. 3) may be provided on the light conversion part 400. For example, the protection member 500 may be a protective film, an upper substrate, a window, or the like, but the disclosure is not limited thereto.

Figure 8:
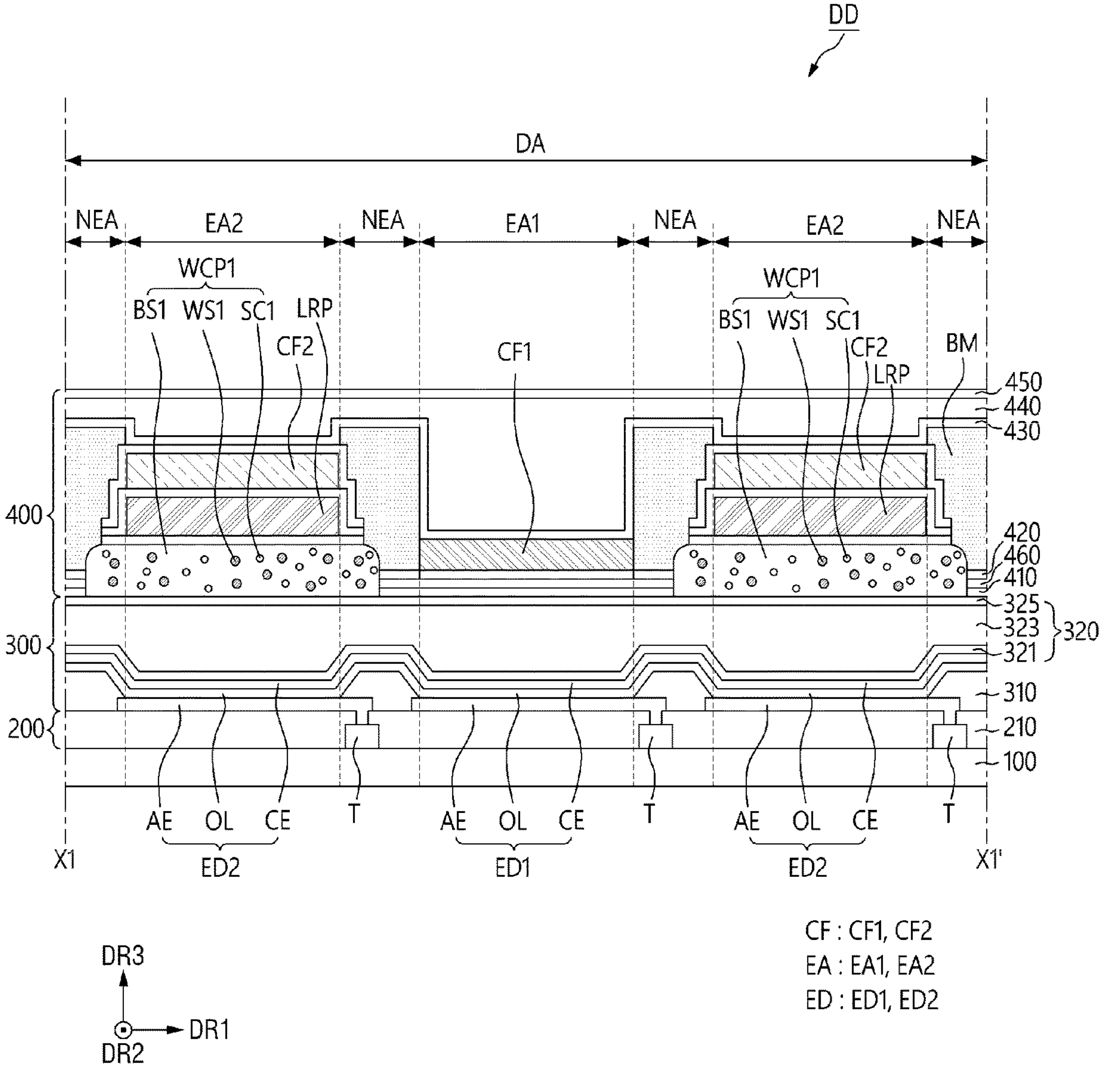
FIG. 8 is a schematic cross-sectional view of the display device according to an embodiment taken along line X1-X1' of FIG. 4.
Figure 9:
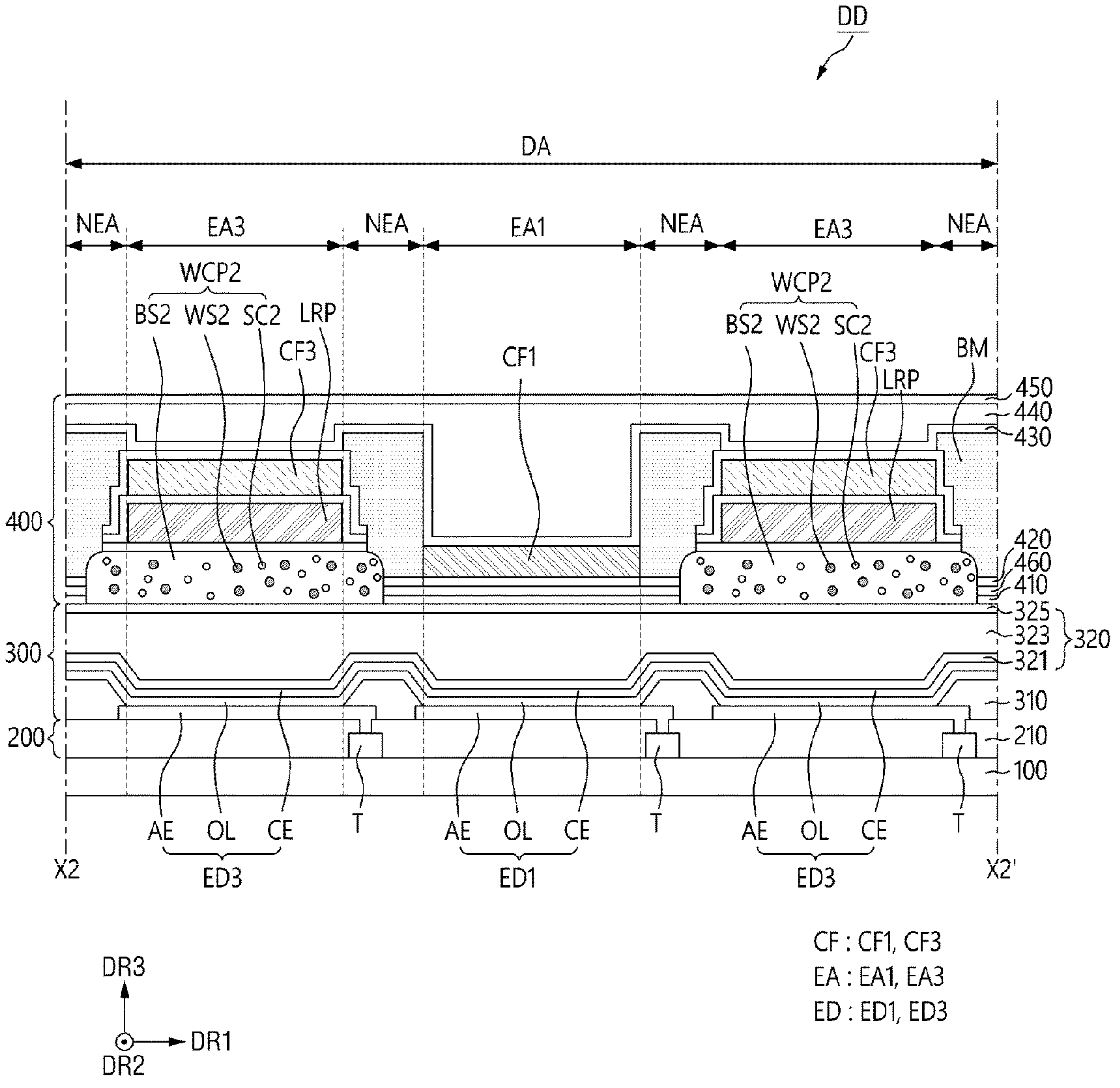
FIG. 9 is a schematic cross-sectional view of the display device according to an embodiment taken along line X2-X2' of FIG. 4.

FIG. 8 is a schematic cross-sectional view of the display device DD according to an embodiment taken along line X1-X1' of FIG. 4. FIG. 9 is a schematic cross-sectional view of the display device DD according to an embodiment taken along line X2-X2' of FIG. 4.

Compared to the display device DD of FIGS. 6 and 7, the display device DD of FIGS. 8 and 9 may further include low refractive patterns LRP and a sixth insulating layer 460. A description of other configurations of FIGS. 8 and 9 and the description of the configurations of FIGS. 6 and 7 are substantially the same or similar, and the same description will be omitted.

Referring to FIGS. 8 and 9 (in addition to FIGS. 1 to 7), the display device DD may further include the low refractive patterns LRP provided in the light conversion part 400 and the sixth insulating layer 460 covering the low refractive patterns LRP. In an embodiment, the low refractive patterns LRP and the sixth insulating layer 460 may be sequentially disposed or provided on the first insulating layer 410.

The low refractive patterns LRP (or low refractive layer) may overlap the wavelength conversion part (see, e.g., WCP of FIG. 4) in a plan view and may be disposed in the second emission areas EA2 and the third emission areas EA3. For example, the low refractive pattern LRP overlapping the first wavelength conversion pattern WCP1 in a plan view may be disposed or provided in each of the second emission areas EA2, and the low refractive pattern LRP overlapping the second wavelength conversion pattern WCP2 in a plan view may be disposed or provided in each of the third emission areas EA3. In an embodiment, the low refractive pattern LRP disposed or provided in each of the second emission areas EA2 may be disposed or provided between the first wavelength conversion pattern WCP1 and the second color filter CF2, and the low refractive pattern LRP disposed or provided in each of the third emission areas EA3 may be disposed between the second wavelength conversion pattern WCP2 and the third color filter CF3. Positions of the low refractive patterns LRP may be changed according to embodiments in consideration of various factors such as light efficiency, process efficiency, and the like.

In an embodiment, the low refractive patterns LRP may include a material having a lower refractive index than the wavelength conversion part WCP (e.g., the first wavelength conversion patterns WCP1 and the second wavelength conversion patterns WCP2). For example, the low refractive patterns LRP may include an organic layer including an organic material having a refractive index in a range of about 1.1 to about 1.4. Loss of light traveling from the wavelength conversion part WCP to the color filter part CF (e.g., the second color filters CF2 and the third color filters CF3) may be reduced by the low refractive patterns LRP.

The sixth insulating layer 460 covering the low refractive patterns LRP may be disposed or provided on the low refractive patterns LRP. In an embodiment, the sixth insulating layer 460 may be disposed or provided (e.g., disposed or provided entirely) in the display area DA including the first emission areas EA1, the second emission areas EA2, and the third emission areas EA3.

In an embodiment, the sixth insulating layer 460 may be a capping layer that protects lower components such as the low refractive patterns LRP or the like and may include an inorganic material. For example, the sixth insulating layer 460 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, the like, or a combination thereof.

In an embodiment, the sixth insulating layer 460 may be opened along with the first insulating layer 410 and the second insulating layer 420 at a portion disposed adjacent to the first emission areas EA1. Accordingly, the sixth insulating layer 460 may expose a portion of each of the first wavelength conversion patterns WCP1 and the second wavelength conversion patterns WCP2.

For example, the sixth insulating layer 460 may be opened toward at least one adjacent first emission area EA1 (e.g., the two first emission areas EA1 disposed adjacent to each of the first wavelength conversion patterns WCP1 in the first direction DR1) on or around each of the first wavelength conversion patterns WCP1 and may expose a portion of the first wavelength conversion pattern WCP1 (e.g., portions corresponding to both ends of the first wavelength conversion pattern WCP1 with respect to the first direction DR1). An exposed portion of the first wavelength conversion pattern WCP1 may be covered by the light blocking member BM.

Similarly, the sixth insulating layer 460 may be opened toward at least one adjacent first emission area EA1 (e.g., the two first emission areas EA1 disposed adjacent to each of the second wavelength conversion patterns WCP2 in the first direction DR1) on or around each of the second wavelength conversion patterns WCP2 and may expose a portion of the second wavelength conversion pattern WCP2 (e.g., portions corresponding to both ends of the second wavelength conversion pattern WCP2 with respect to the first direction DR1). The exposed portion of the second wavelength conversion pattern WCP2 may be covered by the light blocking member BM.

Figure 10:
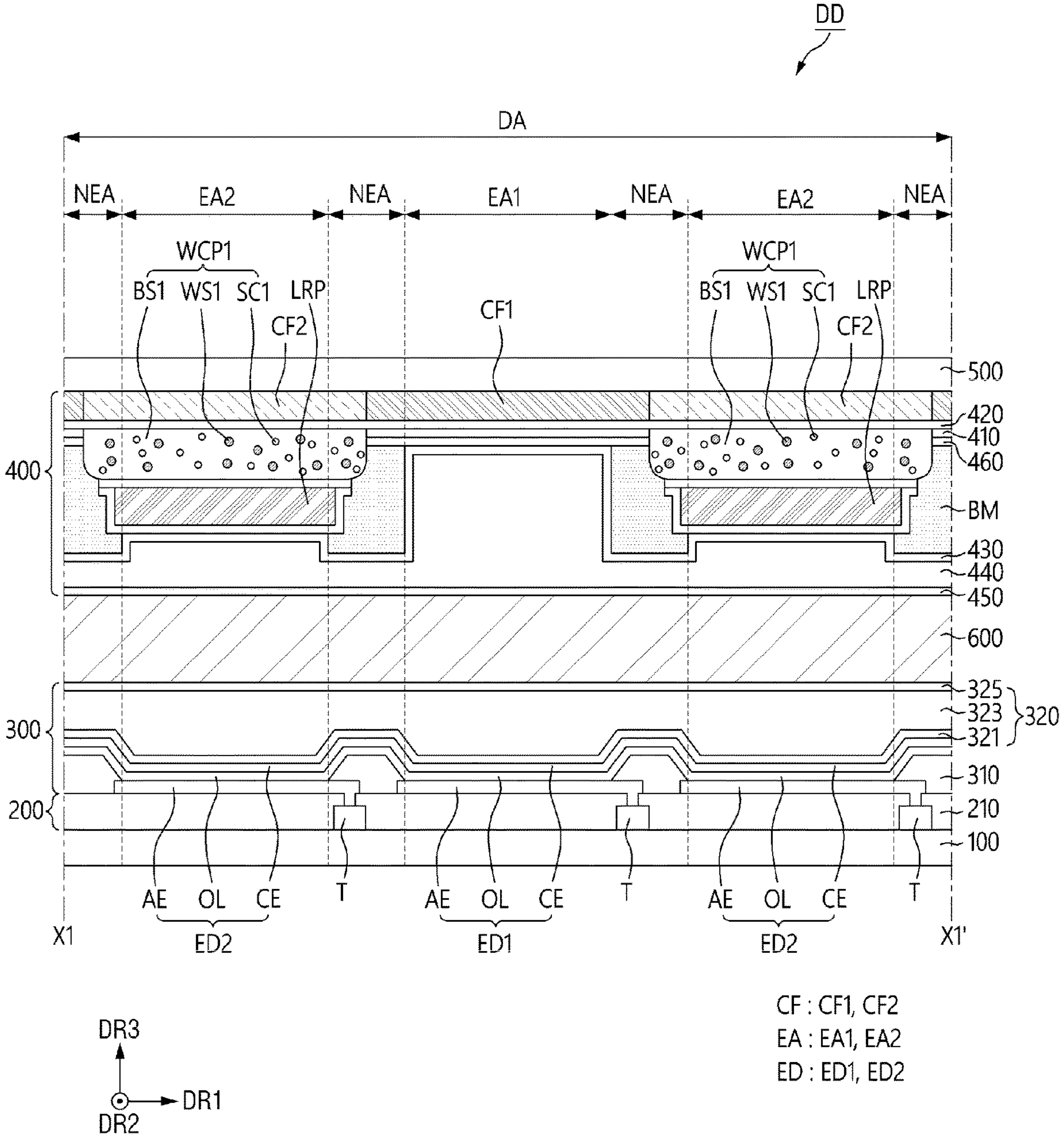
FIG. 10 is a schematic cross-sectional view of the display device according to an embodiment taken along line X1-X1' of FIG. 4.
Figure 11:
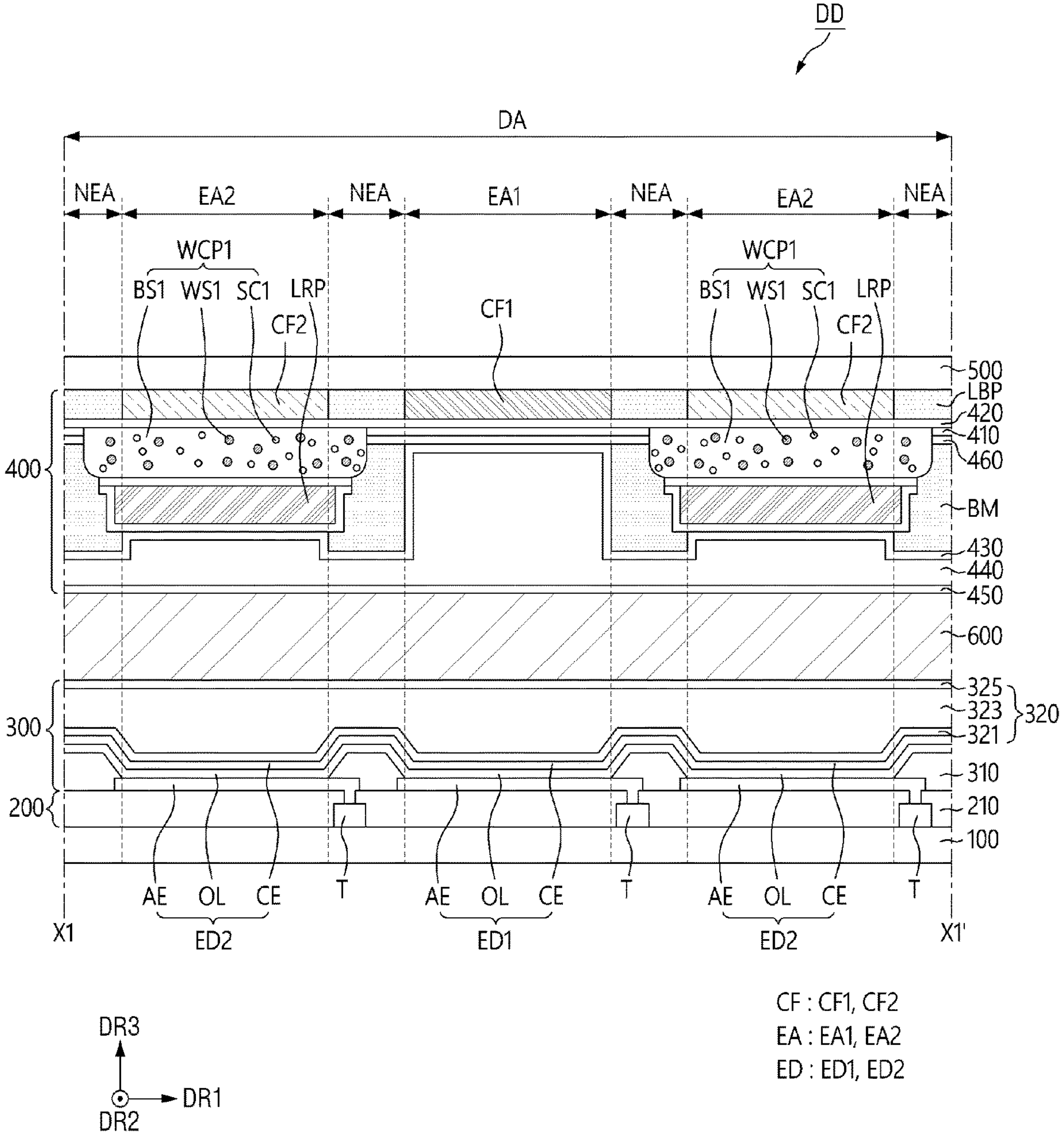
FIG. 11 is a schematic cross-sectional view of the display device according to an embodiment taken along line X1-X1' of FIG. 4.
Figure 12:
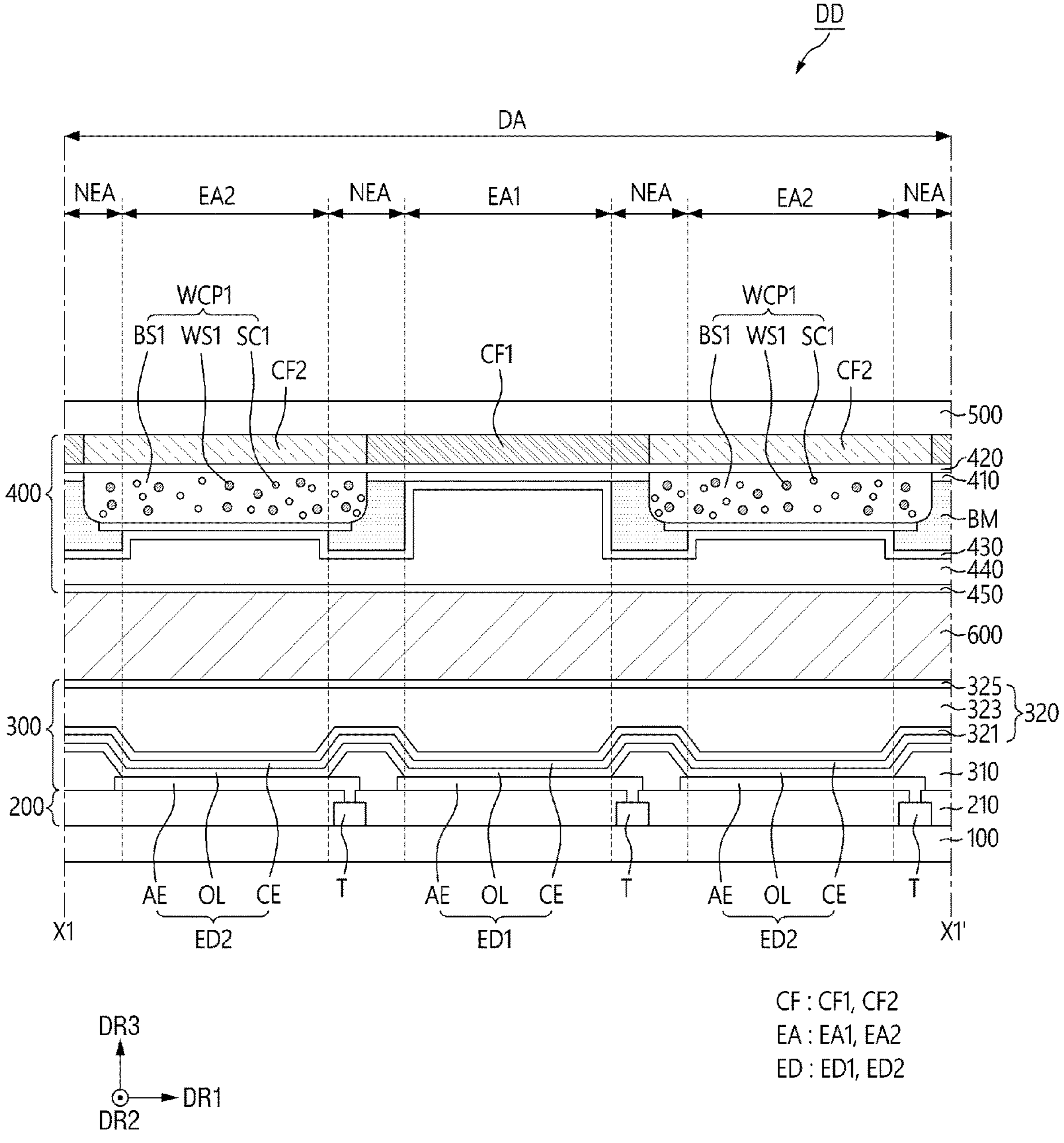
FIG. 12 is a schematic cross-sectional view of the display device according to an embodiment taken along line X1-X1' of FIG. 4.

FIG. 10 is a schematic cross-sectional view of the display device DD according to an embodiment taken along line X1-X1' of FIG. 4. FIG. 11 is a schematic cross-sectional view of the display device DD according to an embodiment taken along line X1-X1' of FIG. 4. FIG. 12 is a schematic cross-sectional view of the display device DD according to an embodiment taken along line X1-X1' of FIG. 4.

Compared with the display devices DD of FIGS. 6 to 9, each of the display devices DD of FIGS. 10, 11, and 12 may have a different structure. For example, the display devices DD of FIGS. 10, 11, and 12 may further include a protection member 500 and may have a structure in which the light conversion part 400 is formed or provided (e.g., formed or provided directly) on the protection member 500 and bonded to the base member 100 to face the light emitting element part 300. Each of the display devices DD of FIGS. 10, 11 and 12 may selectively further include a filler 600.

Referring to FIG. 10 (in addition to FIGS. 1 to 9), the display device DD may include the protection member 500 disposed on the base member 100 provided with the light emitting element part 300, and the light conversion part 400 provided on a surface of the protection member 500 facing the light emitting element part 300.

In an embodiment, the protection member 500 may be an upper substrate or a protective film and may be a rigid or flexible substrate, film, or the like. In an embodiment, the light conversion part 400 may be disposed or formed (e.g., directly disposed or formed) on a surface (e.g., a surface facing the light emitting element part 300) of the protection member 500. The protection member 500 may be a base member used as a substrate in forming the light conversion part 400.

The light conversion part 400 may include the color filter part CF, the second insulating layer 420, the wavelength conversion part (see, e.g., WCP of FIG. 4) (see, e.g., the first wavelength conversion patterns WCP1 of FIG. 10 and the second wavelength conversion patterns WCP2 of FIG. 9), the first insulating layer 410, the low refractive patterns LRP, the sixth insulating layer 460, and the light blocking member BM sequentially disposed or formed on a surface of the protection member 500. The light conversion part 400 may further include at least one of the third insulating layer 430, the fourth insulating layer 440, and the fifth insulating layer 450 sequentially disposed or formed on a surface of the protection member 500 including the light blocking member BM. Although FIG. 10 illustrates only the first wavelength conversion patterns WCP1 disposed or provided in the second emission areas EA2 corresponding to line X1-X1' of FIG. 4 among the components of the wavelength conversion part WCP, the disclosure is not limited thereto, and the display device DD according to an embodiment of FIG. 10 may include the second wavelength conversion patterns WCP2 disposed or provided in the third emission areas EA3.

The color filter part CF may be provided on a surface of the protection member 500 facing the light emitting element part 300. As described above, the color filter part CF may include the first color filters CF1 disposed or provided in the first emission areas EA1, the second color filters CF2 disposed or provided in the second emission areas EA2, and the third color filters CF3 disposed or provided in the third emission areas EA3. In an embodiment, the first color filters CF1, the second color filters CF2, and the third color filters CF3 may be disposed or provided on substantially a same layer.

The second insulating layer 420 may be provided on a surface of the protection member 500 on which the color filter part CF covers the color filter part CF. For example, the second insulating layer 420 may be formed (e.g., formed entirely) in the display area DA to cover the first color filters CF1, the second color filters CF2, and the third color filters CF3.

The wavelength conversion part WCP may be provided on a surface of the protection member 500 on which the second insulating layer 420 is disposed and may face the light emitting element part 300. As described above, the wavelength conversion part WCP may be disposed or provided in the second emission areas EA2 and the third emission areas EA3 but may not be disposed or provided in the first emission areas EA1.

The first insulating layer 410 may be provided on a surface of the protection member 500 on which the wavelength conversion part WCP covers the wavelength conversion part WCP. In an embodiment, the first insulating layer 410 may be disposed or provided (e.g., disposed or provided entirely) in the display area DA. For example, the first insulating layer 410 may also be disposed or provided in the first emission areas EA1. As described above, the first insulating layer 410 may expose a portion (e.g., both ends in the first direction DR1) of each of the first wavelength conversion patterns WCP1 and the second wavelength conversion patterns WCP2.

The low refractive patterns LRP may be provided on a surface of the first insulating layer 410 to overlap the wavelength conversion part WCP in a plan view. For example, the low refractive patterns LRP may be disposed between the light emitting element part 300 and the wavelength conversion part WCP. However, positions of the low refractive patterns LRP are not limited thereto.

The sixth insulating layer 460 may be provided on a surface of the protection member 500 on which the low refractive patterns LRP cover the low refractive patterns LRP. In an embodiment, the sixth insulating layer 460 may be disposed or provided (e.g., disposed or provided entirely) in the display area DA. For example, the sixth insulating layer 460 may also be disposed or provided in the first emission areas EA1. As described above, the sixth insulating layer 460 may expose a portion (e.g., both ends in the first direction DR1) of each of the first wavelength conversion patterns WCP1 and the second wavelength conversion patterns WCP2.

The light blocking member BM may be provided on a surface of the protection member 500 on which the color filter part CF, the wavelength conversion part WCP, the low refractive patterns LRP, and the like are disposed and may be disposed in the non-emission area NEA. As described above, the light blocking member BM may cover the exposed portion of each of the first wavelength conversion patterns WCP1 and the second wavelength conversion patterns WCP2.

In an embodiment, the filler 600 may be provided between the light emitting element part 300 and the light conversion part 400. For example, the filler 600 may fill a space between the base member 100 provided with the light emitting element part 300 and the like and the protection member 500 provided with the light conversion part 400.

In an embodiment, the filler 600 may include a light transmittance material. In an embodiment, the filler 600 may include an organic material. For example, the filler 600 may include a silicon-based organic material, an epoxy-based organic material, a mixture of a silicon-based organic material, an epoxy-based organic material, and the like, but the disclosure is not limited thereto. In another embodiment, the filler 600 may be omitted.

A description of other configurations of FIGS. 10 to 12 and the description of the configuration of FIGS. 6 to 9 are substantially the same or similar, and the same description will be omitted.

Referring to FIG. 11 (in addition to FIG. 10), the display device DD may further include the light blocking pattern LBP provided between adjacent color filters CF. The light blocking pattern LBP may be disposed in the non-emission area NEA and may overlap the light blocking member BM in a plan view. The light blocking pattern LBP and the light blocking member BM may include a same light blocking material or may include different light blocking materials. In another embodiment, color mixing may be prevented by overlapping at least two color filters CF in a plan view without providing the light blocking pattern LBP in the non-emission area NEA.

A description of other configurations of FIG. 11 and the description of the configuration of FIG. 10 are substantially the same as or similar to the description of FIG. 10, and the same description will be omitted.

Referring to FIG. 12 (in addition to FIG. 10), as in an embodiment of FIG. 10, the display device DD of a structure in which the light conversion part 400 is disposed (e.g., directly disposed) on a surface of the protection member 500 and is bonded to the base member 100 on which the light emitting element part 300 and the like are disposed may not include the low refractive patterns LRP and the sixth insulating layer 460. For example, the low refractive patterns LRP and the sixth insulating layer 460 may be selectively provided in the display device DD according to embodiments.

The display device DD may include the protection member 500 disposed on the base member 100 provided with the light emitting element part 300, and the light conversion part 400 provided on a surface of the protection member 500 facing the light emitting element part 300.

A description of other configurations of FIG. 12 and the description of the configuration of FIG. 10 are substantially the same or similar, and the same description will be omitted.

Figure 23:
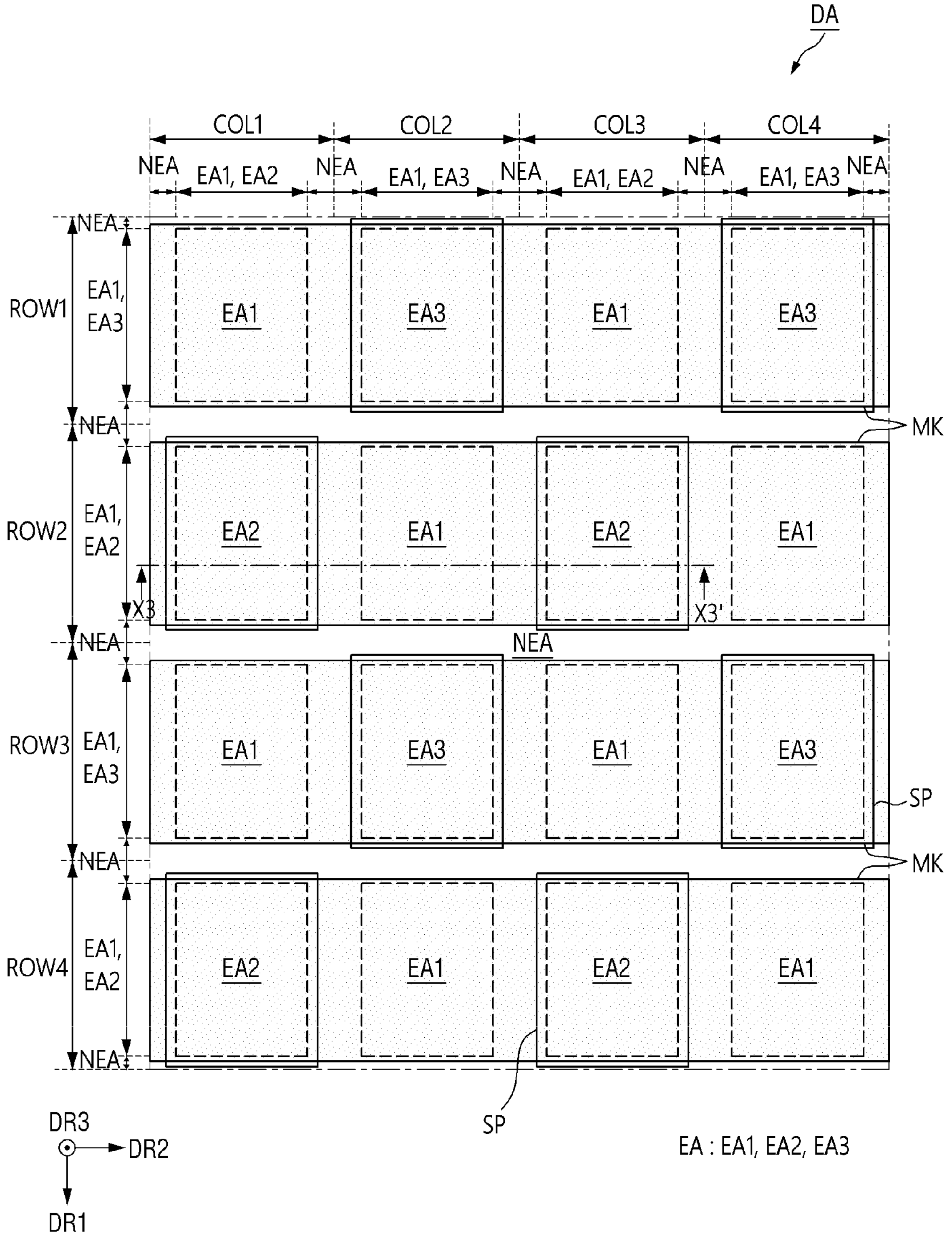
FIG. 23 is a schematic plan view of a mask according to an embodiment that may be used in a manufacturing step of FIGS. 15 and 16.
Figure 24:
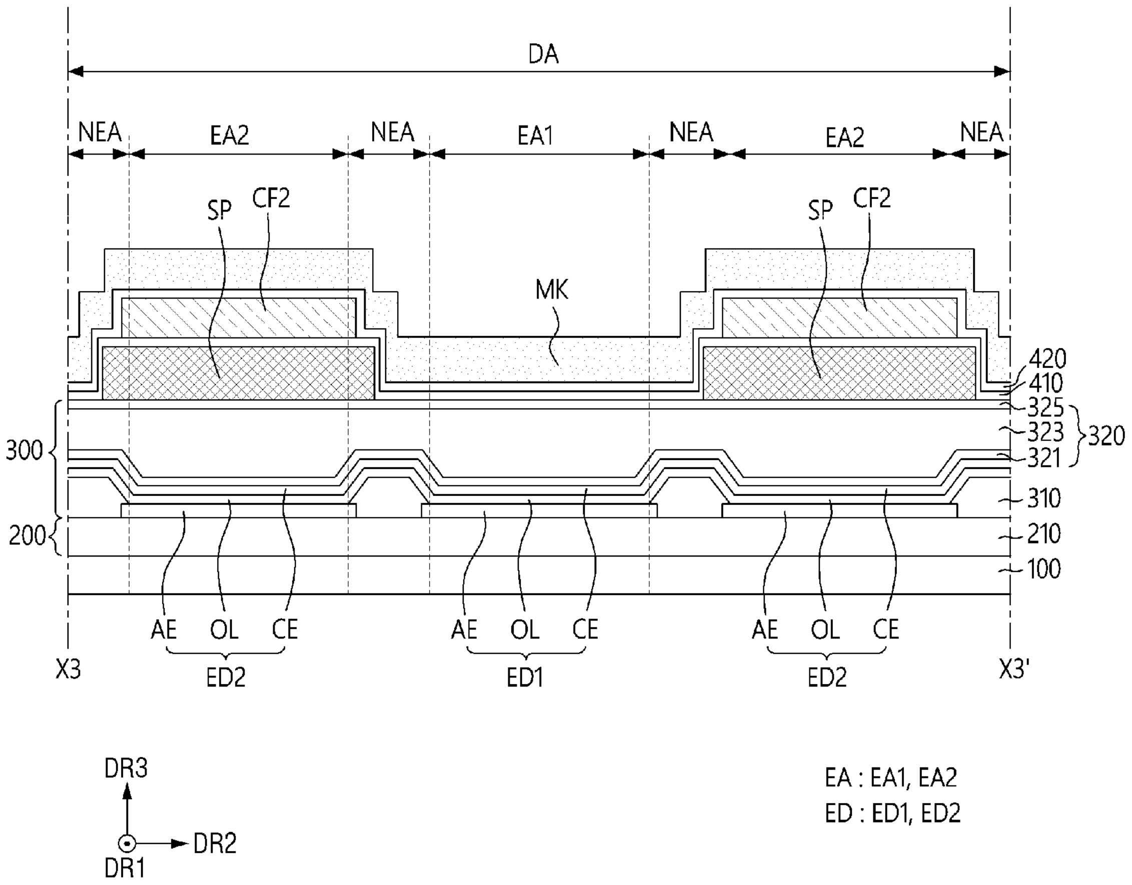
FIG. 24 is a schematic cross-sectional view of the display device in a manufacturing step of FIGS. 15 and 16 corresponding to line X3-X3' of FIG. 23.

FIGS. 13 to 22 are schematic cross-sectional views illustrating a method for manufacturing the display device DD according to an embodiment based on the structure of FIG. 6. FIG. 23 is a schematic plan view of the mask MK according to an embodiment that may be used in the manufacturing step of FIGS. 15 and 16. FIG. 24 is a schematic cross-sectional view of the display device DD in the manufacturing step of FIGS. 15 and 16 corresponding to line X3-X3' of FIG. 23.

Figure 13:
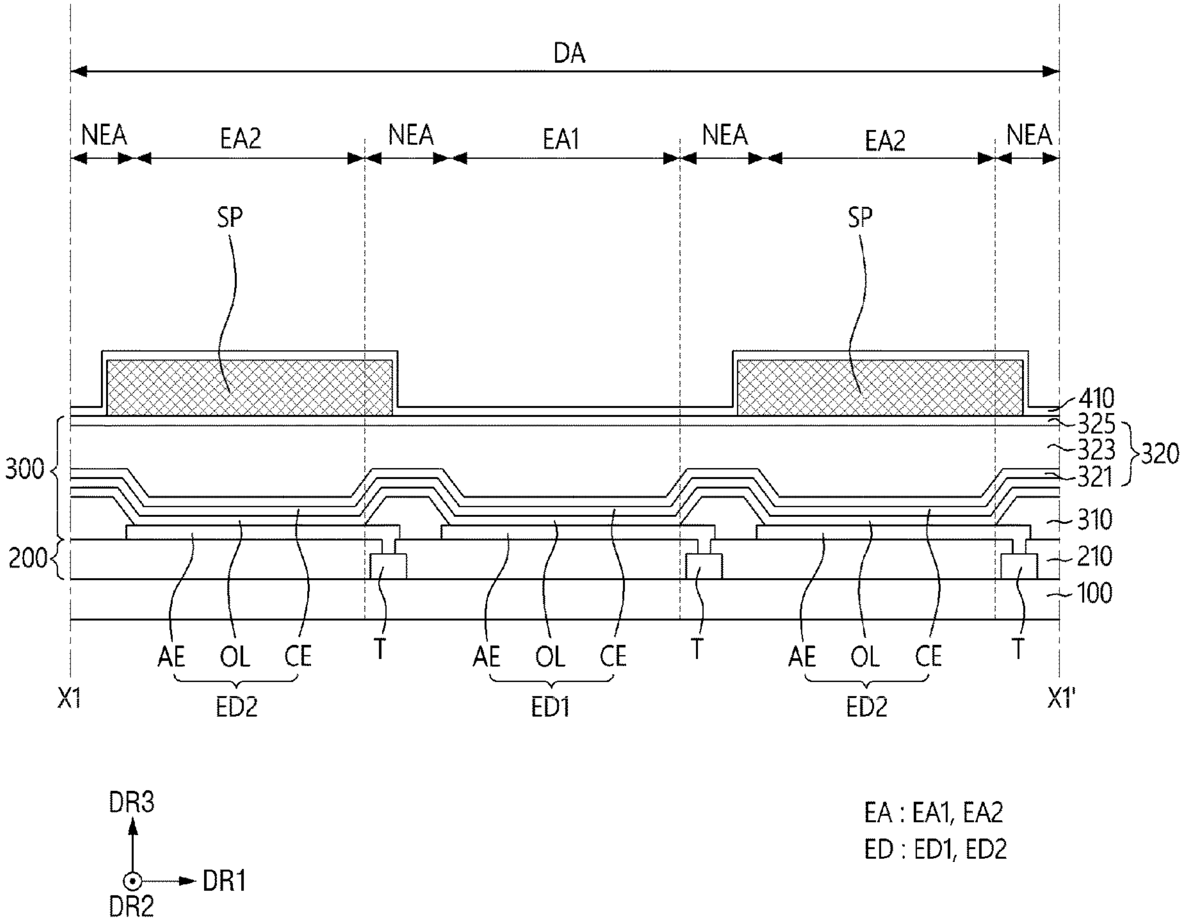
FIGS. 13 to 22 are schematic cross-sectional views illustrating a method for manufacturing the display device according to an embodiment based on a structure of FIG. 6.

Referring to FIGS. 13 to 24 (in addition to FIGS. 1 to 7), the base member 100 may be prepared, and the panel circuit part 200 may be formed (e.g., selectively formed) on the base member 100, as shown in FIG. 13. Further, the light emitting element part 300 may be formed on the base member 100 on which the panel circuit part 200 is formed.

As described above, the emission areas EA including the first emission areas EA1, the second emission areas EA2, and the third emission areas EA3 as well as the non-emission area NEA may be defined on the base member 100. For example, the base member 100 may include the first emission areas EA1, the second emission areas EA2, and the non-emission area NEA. The first emission areas EA1 may be emission areas of first color pixels, and the second emission areas EA2 may be emission areas of second color pixels. The third emission areas EA3 may be emission areas of third color pixels. Each pixel PX may include at least one emission area EA that emits light corresponding to each color (e.g., basic or selectable color). For example, each pixel PX may include a first emission area EA1, a second emission area EA2, or a third emission area EA3. The circuit elements of the panel circuit part 200 and the light emitting elements ED of the light emitting element part 300 may be formed on the base member 100 according to positions (e.g., predetermined or selectable positions).

After forming the circuit elements and the light emitting elements ED, sacrificial patterns SP (or a sacrificial layer) may be formed on the base member 100 on which the light emitting element part 300 and the like are formed. The first insulating layer 410 may be formed on the base member 100 on which the sacrificial patterns SP are formed.

The sacrificial patterns SP may be formed in the second emission areas EA2 and the third emission areas EA3, and may not be formed in the first emission areas EA1. an embodiment, the sacrificial patterns SP may be formed to have a greater width than a width of each of the second emission areas EA2 and the third emission areas EA3 such that both ends of the sacrificial patterns SP are disposed in the non-emission area NEA in the first direction DR1. In an embodiment, the sacrificial patterns SP may be formed by applying a photosensitive organic material and exposing and developing the photosensitive organic material. In an embodiment, the sacrificial patterns SP may have a thickness in a range of about 1 μm to about 20 μm, but the disclosure is not limited thereto.

The first insulating layer 410 may be formed on the base member 100 on which the sacrificial patterns SP are formed. In an embodiment, the first insulating layer 410 may be formed in an area (e.g., an entire area) of the display area DA including the first emission areas EA1, the second emission areas EA2, and the third emission areas EA3. In an embodiment, the first insulating layer 410 may include an inorganic insulating material and may be formed by a plasma enhanced chemical vapor deposition (PECVD) process or the like. In an embodiment, the first insulating layer 410 may have a thickness in a range of about 1,000 Å to about 20,000 Å, but the disclosure is not limited thereto.

Figure 14:
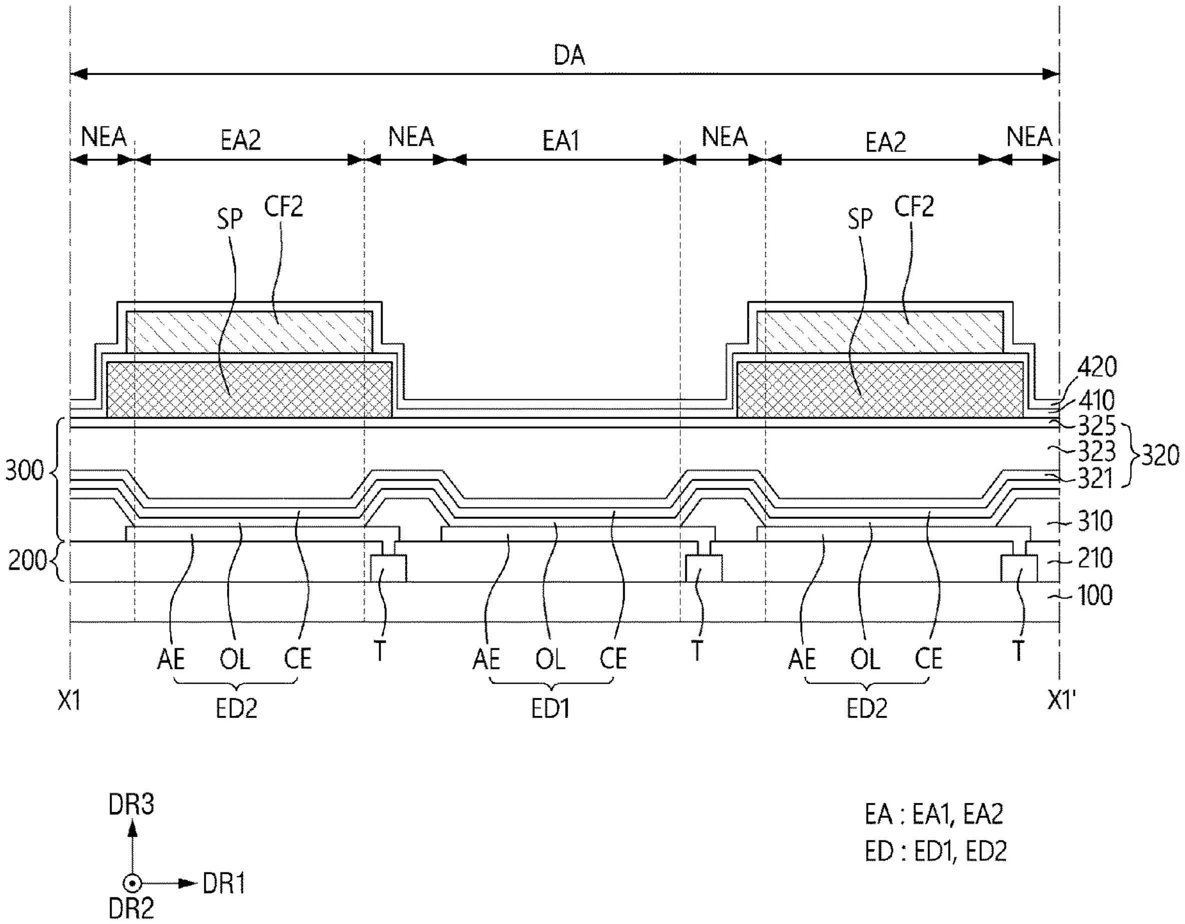

As illustrated in FIG. 14, the second color filters CF2 may be formed in the second emission areas EA2 on the first insulating layer 410. Although not shown in FIG. 14, the third color filters CF3 may be formed in the third emission areas EA3 on the first insulating layer 410. The second color filters CF2 and the third color filters CF3 may be formed to overlap the sacrificial patterns SP in a plan view. In an embodiment, the second color filters CF2 and the third color filters CF3 may be formed to have a width less than a width of the sacrificial patterns SP in the first direction DR1 and be disposed at a center of the sacrificial patterns SP. For example, the second color filters CF2 and the third color filters CF3 may not be disposed on both ends of the sacrificial patterns SP in the first direction DR1.

After forming the second color filters CF2 and third color filters CF3, the second insulating layer 420 may be formed on the base member 100 on which the second color filters CF2 and the third color filters CF3 are formed. In an embodiment, the second insulating layer 420 may be formed in an area (e.g., an entire area) of the display area DA including the first emission areas EA1, the second emission areas EA2, and the third emission areas EA3. In an embodiment, the second insulating layer 420 may include an inorganic insulating material and may be formed by a plasma enhanced chemical vapor deposition (PECVD) process or the like. In an embodiment, the second insulating layer 420 may have a thickness in a range of about 1,000 Å to about 20,000 Å, but the disclosure is not limited thereto.

Figure 15:
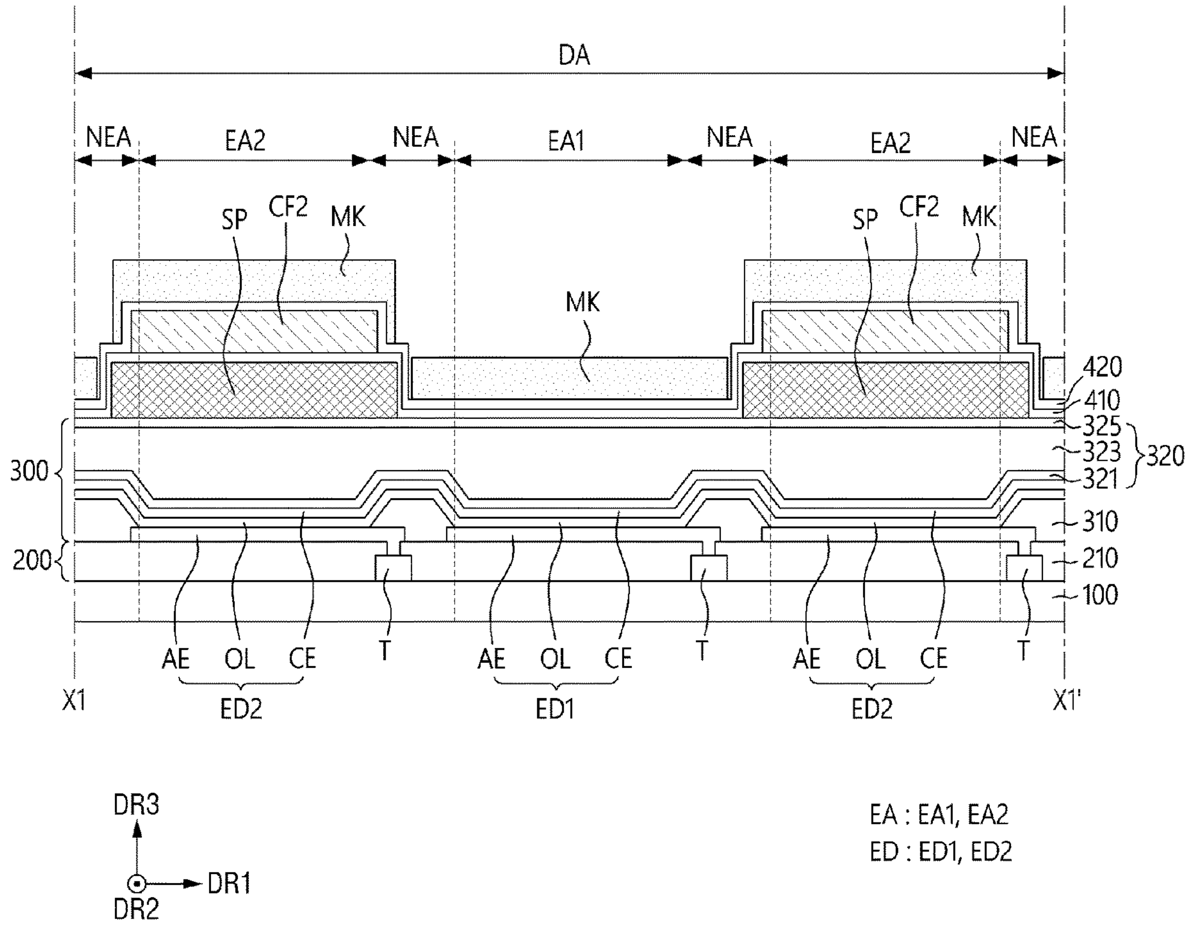

As shown in FIG. 15, a mask MK may be disposed on the second insulating layer 420. In an embodiment, as illustrated in FIGS. 15, 23, and 24, the mask MK may be formed to cover the emission areas EA, and may be formed to expose portions of the non-emission area NEA between the first emission areas EA1 and the second emission areas EA2 disposed adjacent to each other in the first direction DR1, and between the first emission areas EA1 and the third emission areas EA3 disposed adjacent to each other in the first direction DR1. For example, the mask MK may be opened such that it is not disposed on both ends of the sacrificial patterns SP at a portion disposed adjacent to the first emission areas EA1 in the first direction DR1. In an embodiment, the mask MK may be opened in a stripe shape in the second direction DR2 at the boundaries between adjacent pixel rows. For example, the mask MK may be opened in a slit shape extending in the second direction DR2 between the adjacent pixel rows. In an embodiment, the mask MK may be formed using a photosensitive organic material. FIG. 23 schematically illustrates the positions of the sacrificial patterns SP and the mask MK for the display area DA of FIG. 4 to explain the position of the mask MK according to an embodiment.

In an embodiment, FIGS. 15, 23, and 24 illustrate the positions of the sacrificial patterns SP and the mask MK, but disclosure is not limited thereto. In another embodiment, the positions of the sacrificial patterns SP may be changed corresponding to the positions at which the wavelength conversion patterns WCP are to be formed. In another embodiment, the position of the mask MK may be changed according to the supply point or the inflow direction of the material used to form the wavelength conversion patterns WCP. In another embodiment, in forming the first wavelength conversion patterns WCP1 and the second wavelength conversion patterns WCP2 in the second emission areas EA2 and the third emission areas EA3, respectively, the material for forming the wavelength conversion patterns WCP may be supplied to the second emission areas EA2 and the third emission areas EA3 through the adjacent first emission areas EA1 in each pixel row. The shape, position, and/or arrangement direction of the mask MK or the positions where the sacrificial patterns SP are exposed may be changed according to the opening position of the first insulating layer 410 or the like.

Figure 16:
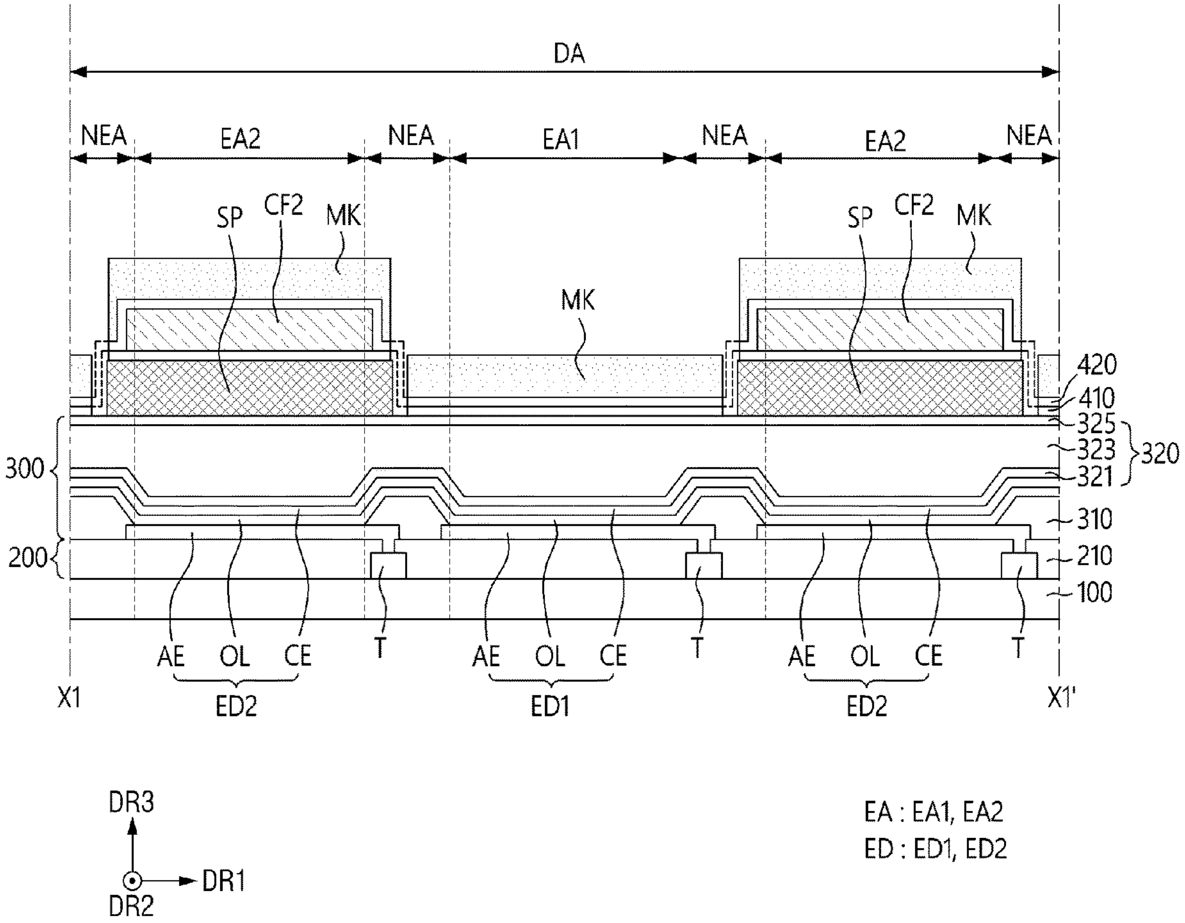

As shown in FIG. 16, portions of the sacrificial patterns SP may be exposed by removing the first insulating layer 410 and the second insulating layer 420 from the non-emission area NEA disposed adjacent to the first emission areas EA1 using the mask MK. For instance, by removing the first insulating layer 410 and the second insulating layer 420 by an etching (e.g., dry etching) process or the like in the non-emission area NEA corresponding to between the first emission areas EA1 and the second emission areas EA2 disposed adjacent to each other in the first direction DR1 and between the first emission areas EA1 and the third emission areas EA3 disposed adjacent to each other in the first direction DR1, both ends of each of the sacrificial patterns SP may be exposed.

Figure 17:
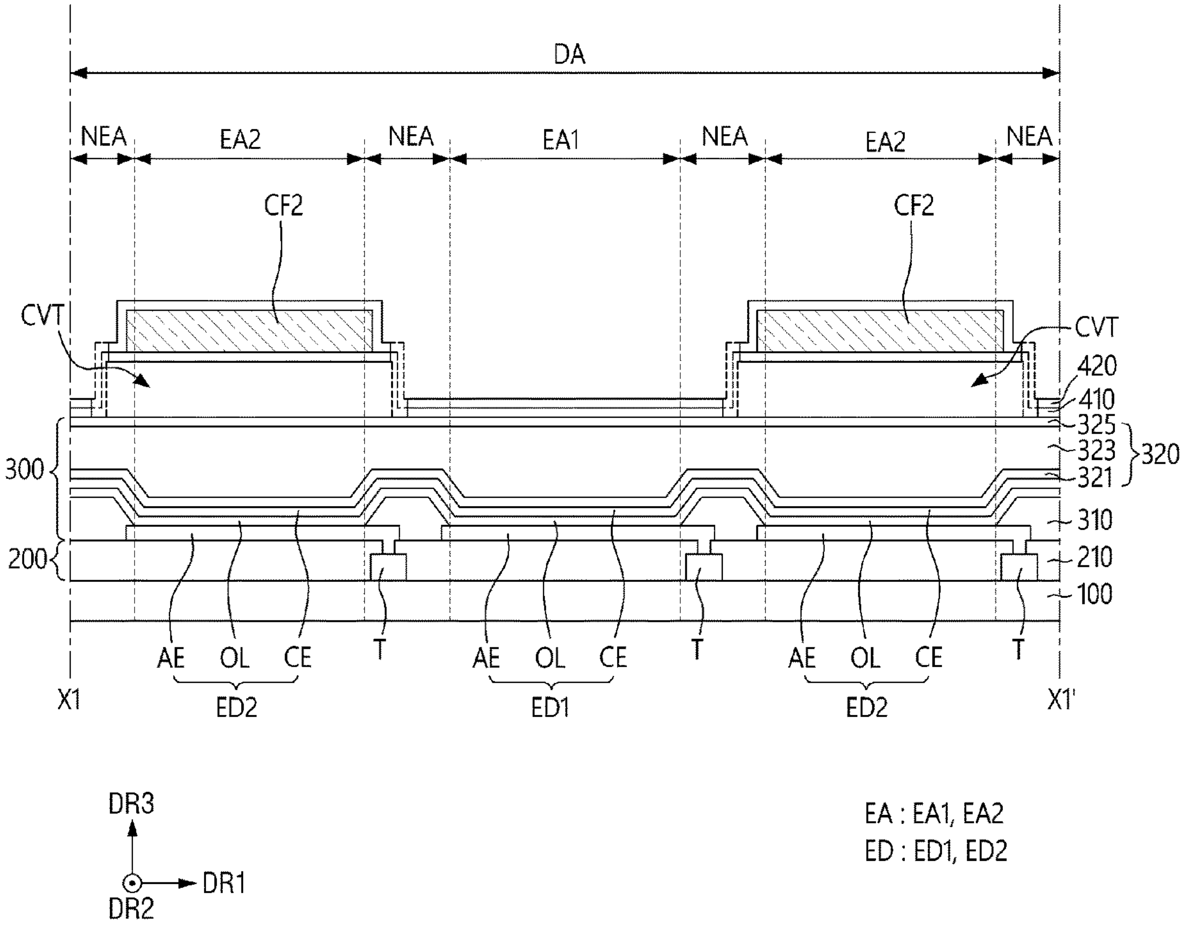

As shown in FIG. 17, by removing the sacrificial patterns SP and the mask MK, cavities CVT corresponding to the sacrificial patterns SP may be formed. In an embodiment, the sacrificial patterns SP and the mask MK may be removed by supplying a material such as a developer, a stripper solution, or the like or by an ashing process or the like. For example, the sacrificial patterns SP and the mask MK may be removed by a strip process, and the cavities CVT corresponding to the sacrificial patterns SP may be formed readily by forming the sacrificial patterns SP with a material and/or a size suitable for being readily removed by the stripper solution. In an embodiment, each cavity CVT may be formed as a space with a tunnel structure opened toward at least one first emission area EA1 adjacent in the first direction DR1 (e.g., the first emission areas EA1 disposed on both sides of the cavity CVT in the first direction DR1).

Figure 18:
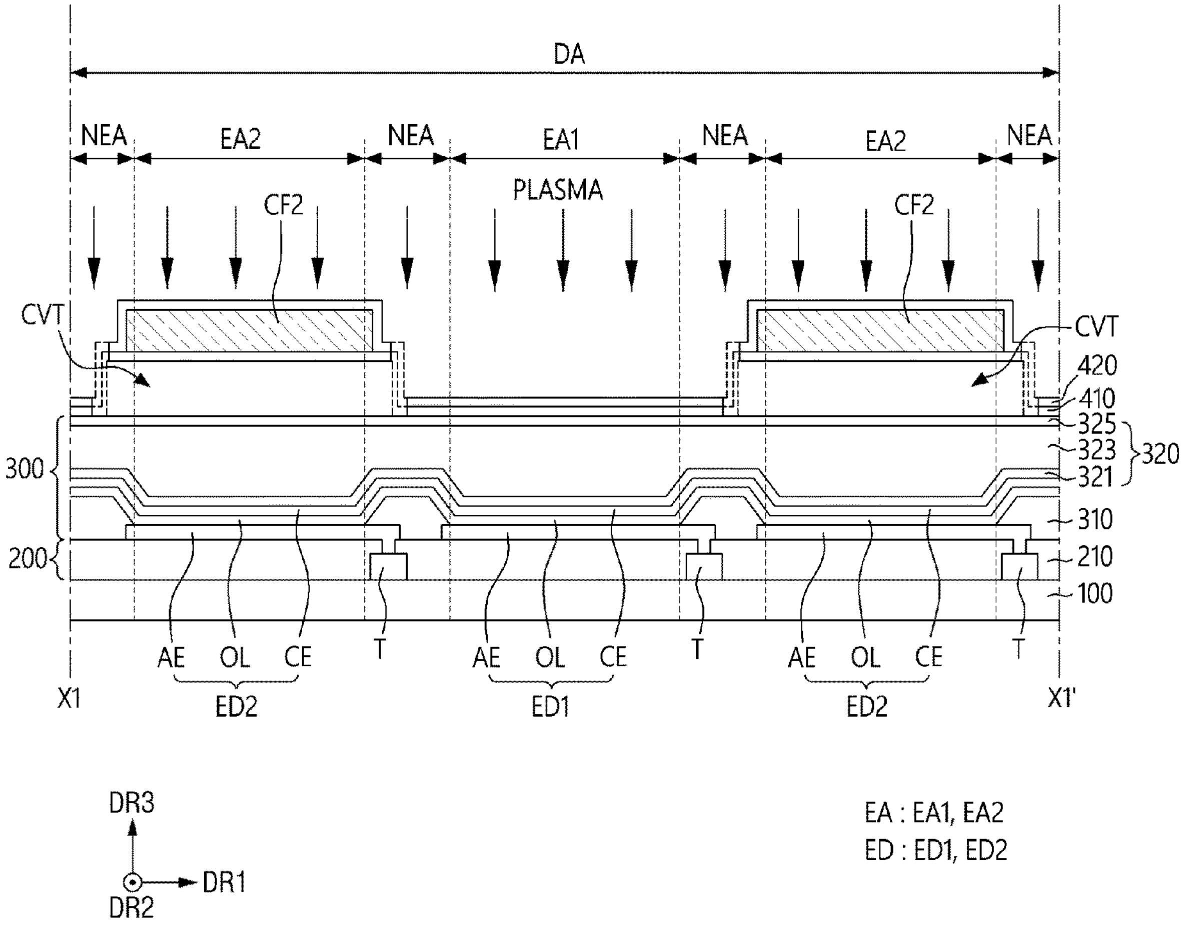

As shown in FIG. 18, by surface-treating the second insulating layer 420, liquid repellency may be imparted to the emission areas EA. For example, the surface of the second insulating layer 420 may be made to have hydrophobicity by a hydrogen ($H_2$) plasma treatment.

Figure 19:
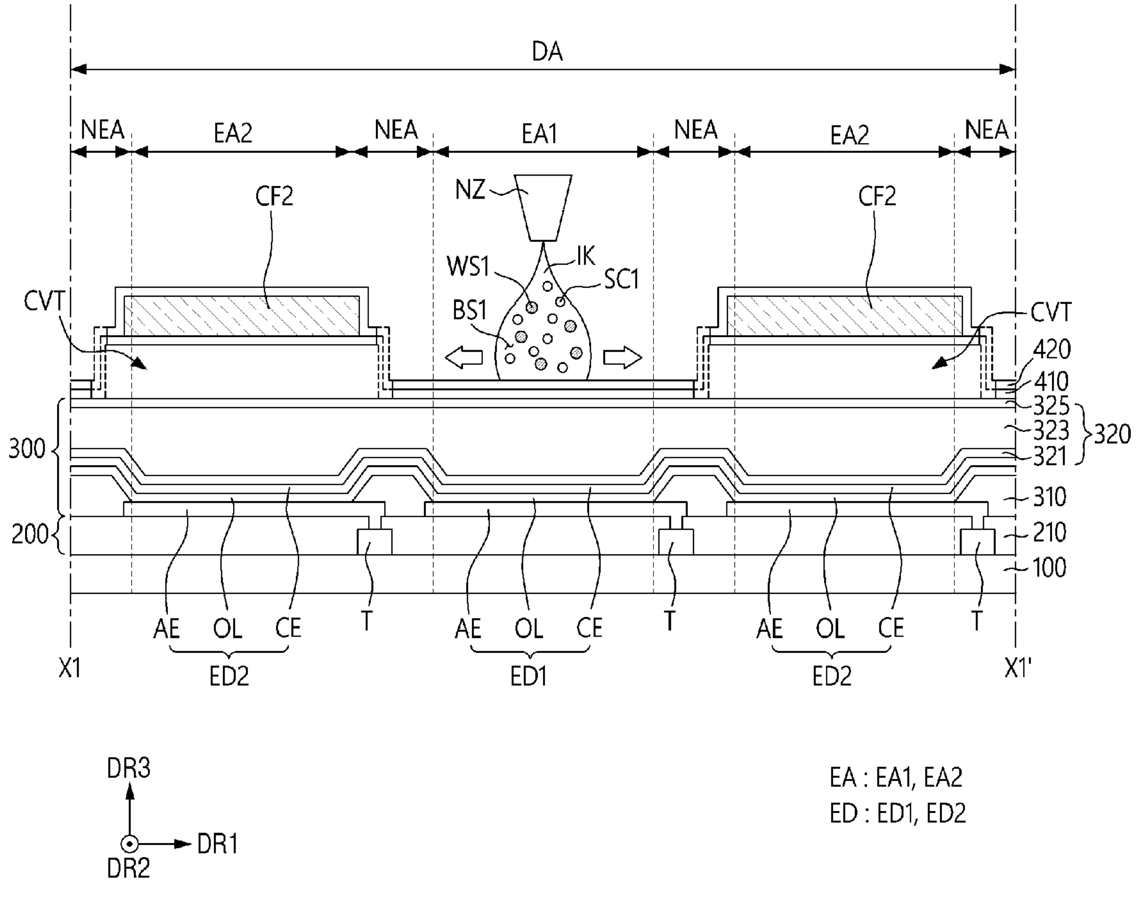
Figure 20:
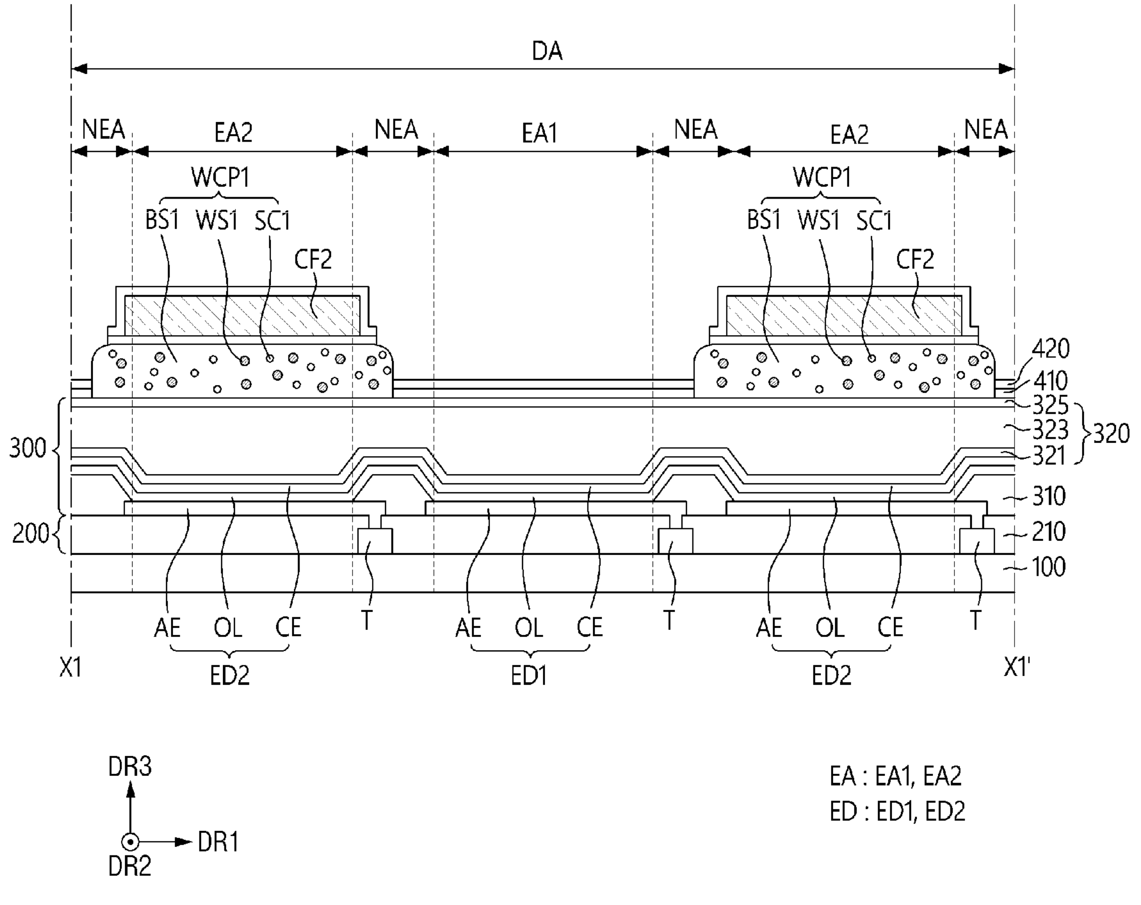

After imparting the liquid repellency, as shown in FIGS. 19 and 20, by supplying a material for forming the wavelength conversion part WCP to the first emission areas EA1, the wavelength conversion part WCP may be formed in the second emission areas EA2 and the third emission areas EA3.

For example, as shown in FIG. 19, ink IK including the first wavelength shifter WS1 (e.g., ink IK in which the first wavelength shifter WS1 and the first scatterer SC1 are dispersed in the first base resin BS1) may be discharged, by using a nozzle NZ or the like, to the first emission areas EA1 in the pixel column (see, e.g., the first pixel column COL1 and the third pixel column COL3 of FIGS. 4 and 5) in which the first emission areas EA1 and the second emission areas EA2 are disposed. The ink IK may be introduced into the cavities CVT corresponding to the ambient second emission areas EA2 by capillary action, thus filling the cavities CVT. Accordingly, as shown in FIG. 20, the first wavelength conversion patterns WCP1 may be formed in the second emission areas EA2.

Furthermore, in substantially a same manner as described above, ink IK including the second wavelength shifter WS2 (e.g., ink IK in which the second wavelength shifter WS2 and the second scatterer SC1 are dispersed in the second base resin BS2) may be discharged to the first emission areas EA1 in the pixel column (see, e.g., the second pixel column COL2 and the fourth pixel column COL4 of FIGS. 4 and 5) in which the first emission areas EA1 and the third emission areas EA2 are disposed. The ink IK may be introduced into the cavities corresponding to the ambient third emission areas EA3 by capillary action, thus filling the cavities. As a result, the second wavelength conversion patterns WCP2 may be formed in the third emission areas EA3.

In an embodiment, since the surfaces of the emission areas EA (e.g., the surface of the second insulating layer 420) are surface-treated to be liquid-repellent or hydrophobic, the ink IK may be readily flown into the cavity CVT through the open portion of the cavity CVT (e.g., the portion where the first insulating layer 410 and the second insulating layer 420 have been removed). Since the surfaces of the emission areas EA are surface-treated to be liquid-repellent or hydrophobic, the ink IK may be readily flown into the cavity CVT even in case that the ink IK lands on the ambient second emission area EA2 or third emission area EA3 unintentionally. In an embodiment, the amount of the ink IK supplied to each of the first emission areas EA1 may be appropriately adjusted in consideration of the size of the cavity CVT. For example, in consideration of an error range, the ink IK may be supplied to each first emission area EA1 in an amount sufficient to fill the ambient cavity CVT.

As described above, in case of using the first emission areas EA1 as an inkjet drop area (e.g., an area to which the ink IK including the first wavelength shifter WS1 or second wavelength shifter WS2 is supplied by an inkjet method), a sufficient area and/or width of the inkjet drop area may be secured even in the display device DD having a high resolution in which the size of the pixels PX is reduced and the pixels PX are densely arranged. Furthermore, the inkjet process may be performed before the formation of the light blocking member BM, and not only each first emission area EA1 but also a portion of the non-emission area NEA disposed in the vicinity of the first emission area EA1 may be used as the inkjet drop area. For example, in addition to each first emission area EA1, a portion of the non-emission area NEA disposed between the cavities CVT disposed on both sides of the first emission area EA1 in the first direction DR1 may also be used as the inkjet drop area for supplying the ink IK to the second emission areas EA2 or third emission areas EA3 disposed adjacent to the first emission area EA1.

Figure 21:
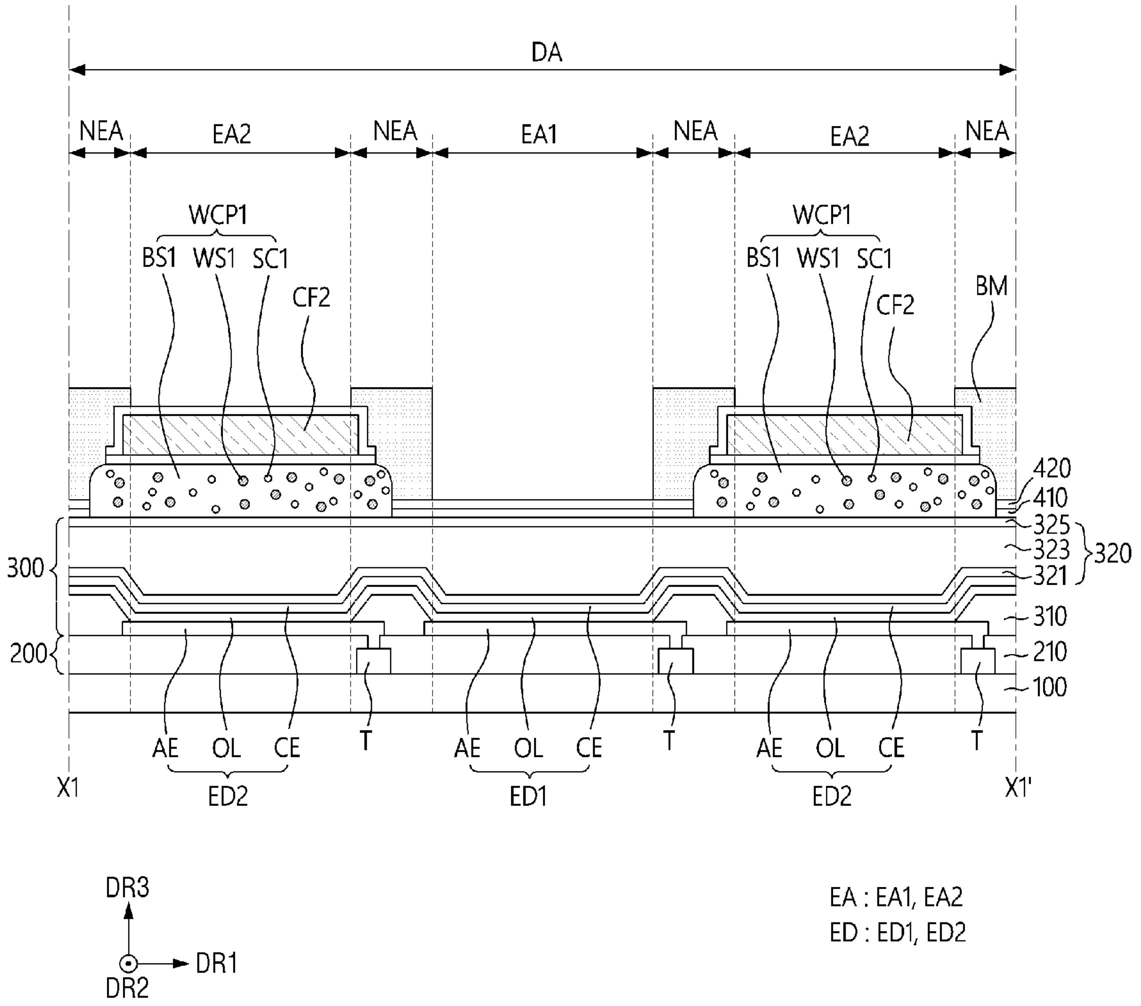

After the inkjet process, as shown in FIG. 21, the light blocking member BM may be formed in the non-emission area NEA. The light blocking member BM may be formed to cover the exposed surfaces of the first wavelength conversion patterns WCP1 and the second wavelength conversion patterns WCP2, which are exposed in the portions where the first insulating layer 410 and the second insulating layer 420 have been removed. The light blocking member BM may allow the emission areas EA of the pixels PX and the non-emission area NEA adjacent to the emission areas EA to be more clearly distinguished.

Figure 22:
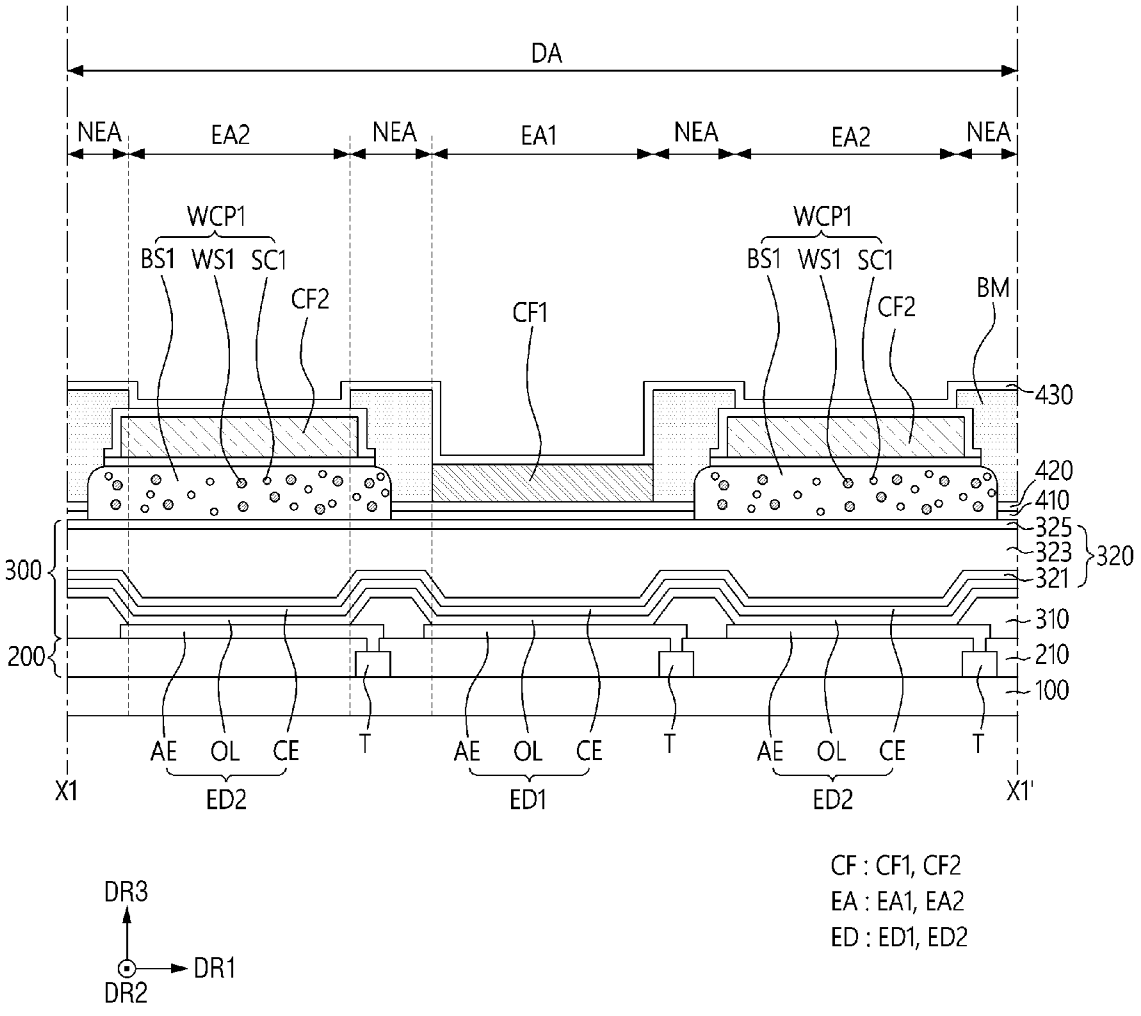

As shown in FIG. 22, the first color filter CF1 may be formed in each emission area EA1. The first color filter CF1 may block light of a color other than the first color (e.g., red light or green light) from being emitted from the first emission area EA1 even in case that the residue of the ink IK remains in the first emission area EA1. In an embodiment, the first color filter CF1 may be formed on the second insulating layer 420 in the first emission area EA1 and may contact (e.g., directly contact) the side surface of the light blocking member BM.

After forming the first color filter CF1, the third insulating layer 430 may be formed on the base member 100 on which the light blocking member BM, the first color filters CF1, and the like are formed. In an embodiment, the third insulating layer 430 may be formed in an area (e.g., an entire area) of the display area DA including the first emission areas EA1, the second emission areas EA2, and the third emission areas EA3. In an embodiment, the third insulating layer 430 may include an inorganic insulating material and may be formed by a plasma enhanced chemical vapor deposition (PECVD) process or the like. In an embodiment, the third insulating layer 430 may have a thickness in a range of about 1,000 Å to about 20,000 Å, but the disclosure is not limited thereto. In an embodiment, the process of forming the third insulating layer 430 may be omitted.

After the forming of the third insulating layer 430, the display device DD may be manufactured by selectively further forming or disposing the fourth insulating layer 440, the fifth insulating layer 450, and the like shown in FIGS. 6 and 7.

FIGS. 25 to 32 are schematic cross-sectional views illustrating a method for manufacturing the display device DD according to an embodiment based on the structure of FIG. 8. In describing a method for manufacturing the display device DD according to an embodiment of FIGS. 25 to 32, a description of the components of FIGS. 25 to 32 and the description of the components of FIGS. 13 to 24 are substantially identical or similar to, and the same description will be omitted.

Figure 25:
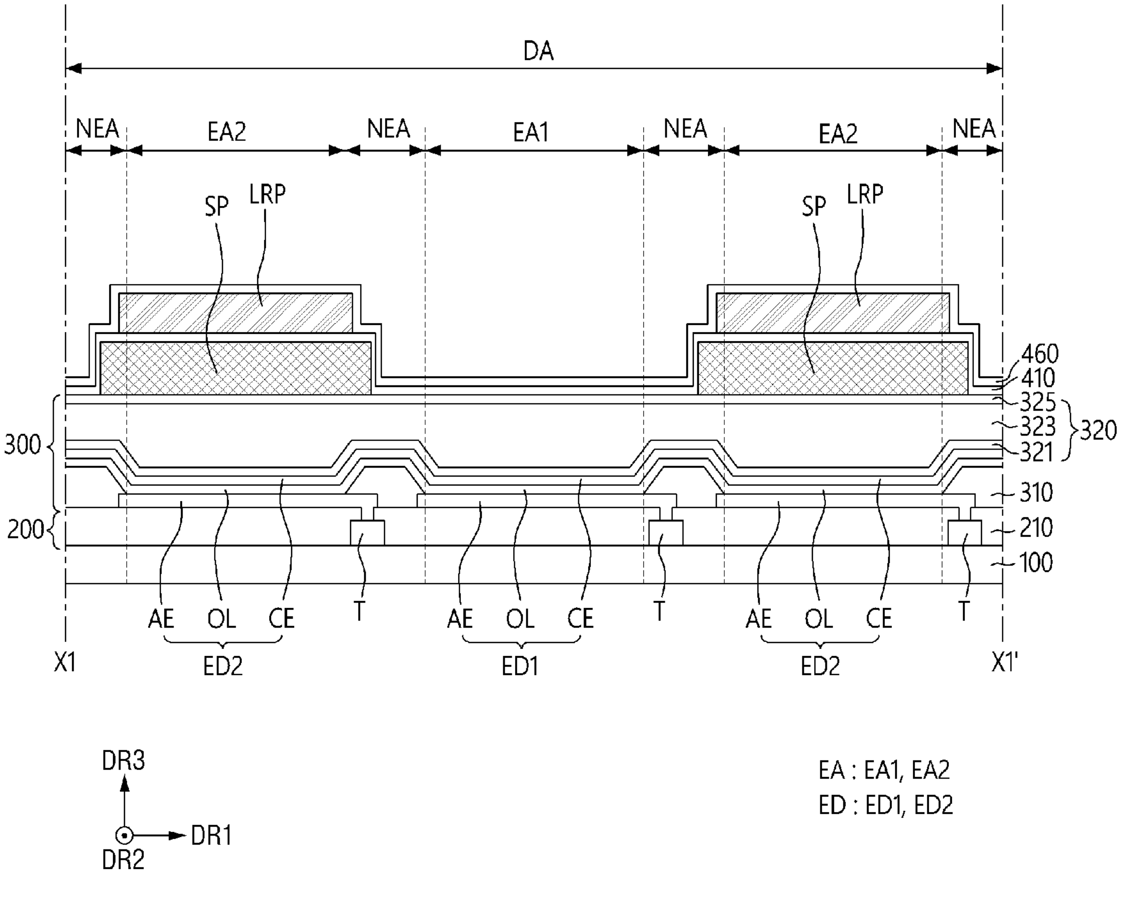
FIGS. 25 to 32 are schematic cross-sectional views illustrating a method for manufacturing the display device according to an embodiment based on a structure of FIG. 8.

Referring to FIGS. 25 to 32 (in addition to FIGS. 1 to 5, 8, and 9), the base member 100 disposed in the emission areas EA and the non-emission area NEA may be provided, and the panel circuit part 200, the light emitting element part 300, the sacrificial patterns SP (or a sacrificial layer), and the first insulating layer 410 may be sequentially formed on the base member 100, as illustrated in FIG. 25. After forming the panel circuit part 200, the light emitting element part 300, the sacrificial patterns SP, and the first insulating layer 410, the low refractive patterns LRP and the sixth insulating layer 460 may be sequentially formed on the first insulating layer 410.

In an embodiment, the low refractive patterns LRP may be formed in the second emission areas EA2 and the third emission areas EA3, and may not be formed in the first emission areas EA1. In an embodiment, the low refractive patterns LRP may be formed to have a width less than a width of the sacrificial patterns SP in the first direction DR1 and be disposed at the center of the sacrificial patterns SP. For example, the low refractive patterns LRP may not be disposed on both ends of the sacrificial patterns SP in the first direction DR1.

In an embodiment, the sixth insulating layer 460 may be formed in an area (e.g., an entire area) of the display area DA including the first emission areas EA1, the second emission areas EA2, and the third emission areas EA3. In an embodiment, the sixth insulating layer 460 may include an inorganic insulating material and may be formed by a plasma enhanced chemical vapor deposition (PECVD) process or the like. In an embodiment, the sixth insulating layer 460 may have a thickness in a range of about 1,000 Å to about 20,000 Å, but the disclosure is not limited thereto.

Figure 26:
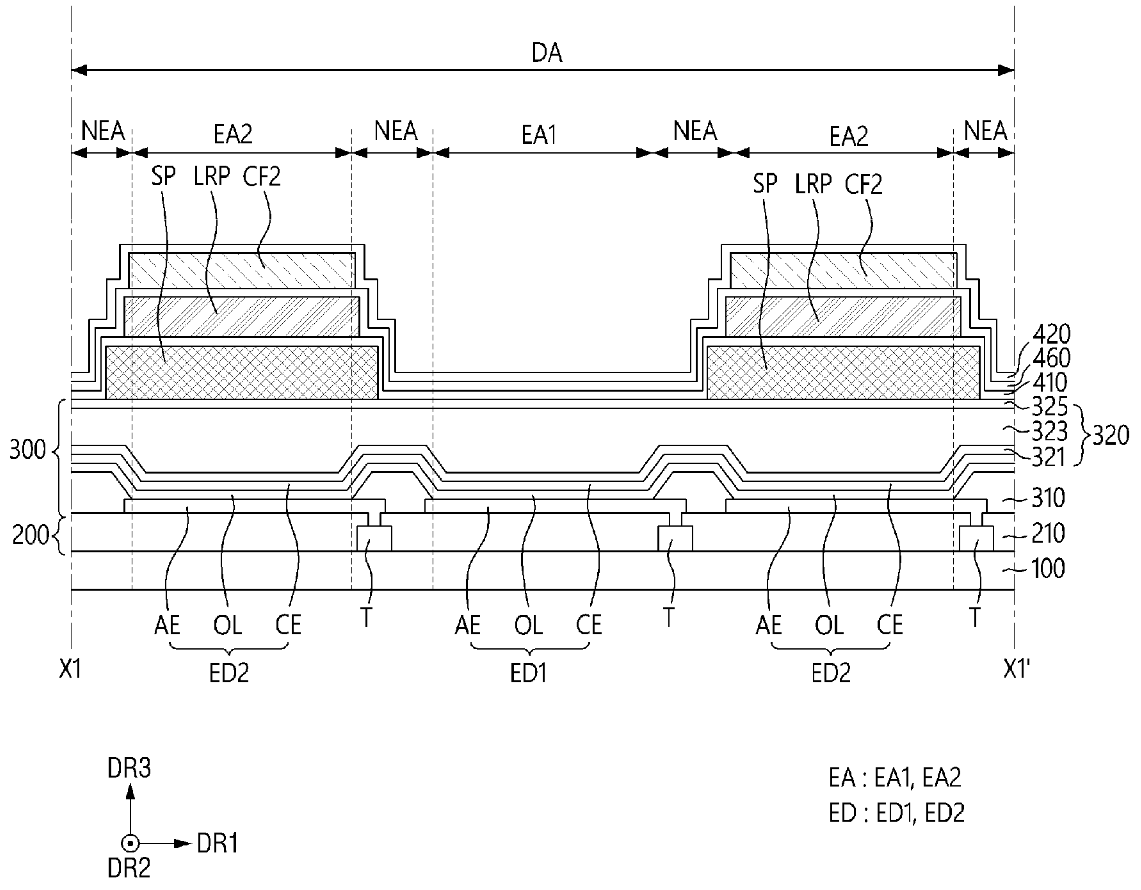

As illustrated in FIG. 26, the second color filters CF2 may be formed in the second emission areas EA2 on the sixth insulating layer 460. Although not shown in FIG. 26, the third color filters CF3 may be formed in the third emission areas EA3 on the sixth insulating layer 460. The second color filters CF2 and the third color filters CF3 may be formed to overlap the low refractive patterns LRP and the sacrificial patterns SP in a plan view. In an embodiment, the second color filters CF2 and the third color filters CF3 may be formed to have a width less than a width of the sacrificial patterns SP in the first direction DR1 while being disposed at the center of the sacrificial patterns SP, and may not be disposed on both ends of the sacrificial patterns SP. After forming the second color filters CF2 and the third color filters CF3, the second insulating layer 420 may be formed on the base member 100 on which the second color filters CF2 and the third color filters CF3 are formed.

Figure 27:
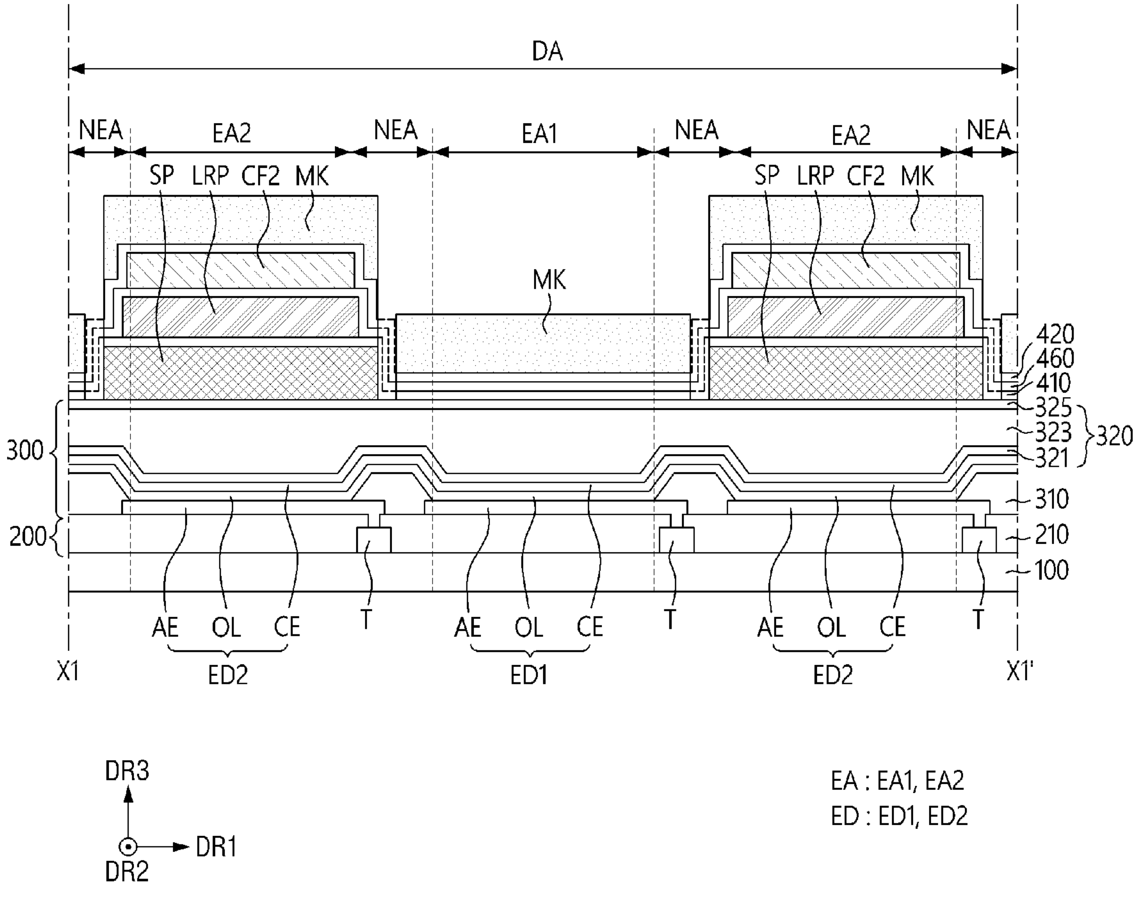

As shown in FIG. 27, the mask MK may be disposed on the second insulating layer 420. In an embodiment, the mask MK may be formed to cover the emission areas EA, and may be formed to expose portions of the non-emission area NEA between the first emission areas EA1 and the second emission areas EA2 disposed adjacent to each other in the first direction DR1 and between the first emission areas EA1 and the third emission areas EA3 disposed adjacent to each other in the first direction DR1. For example, the mask MK may be opened such that it is not disposed on both ends of the sacrificial patterns SP at a portion disposed adjacent to the first emission areas EA1 in the first direction DR1.

After the exposing of the portions of the non-emission area NEA, by removing the first insulating layer 410, the second insulating layer 420, and the sixth insulating layer 460 in the non-emission area NEA disposed adjacent to the first emission areas EA1, portions of the sacrificial patterns SP may be exposed. For example, by partially removing the first insulating layer 410, the second insulating layer 420, and the sixth insulating layer 460 by an etching process using the mask MK, both ends of each of the sacrificial patterns SP may be exposed.

Figure 28:
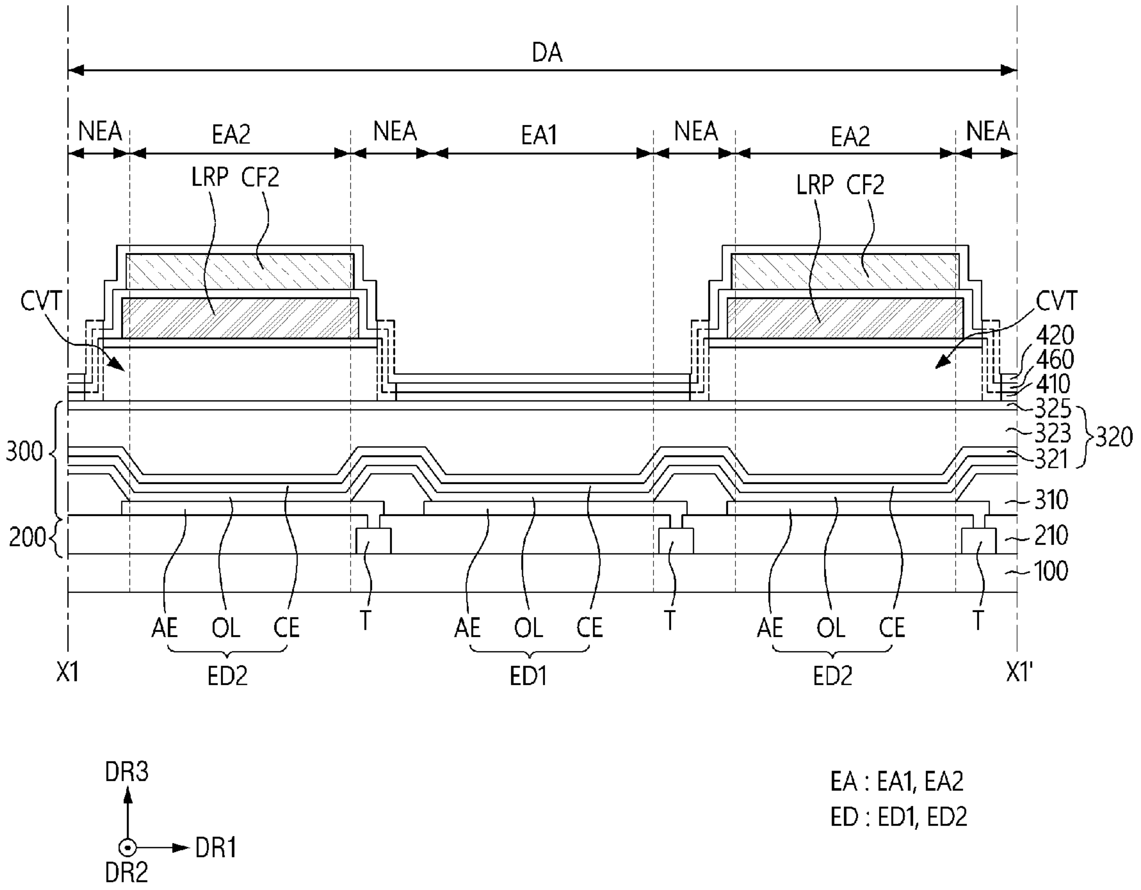

As shown in FIG. 28, by removing the sacrificial patterns SP and the mask MK, the cavities CVT each corresponding to the sacrificial patterns SP may be formed. Subsequently, by surface-treating the second insulating layer 420, liquid repellency or hydrophobicity may be imparted to the emission areas EA.

Figure 29:
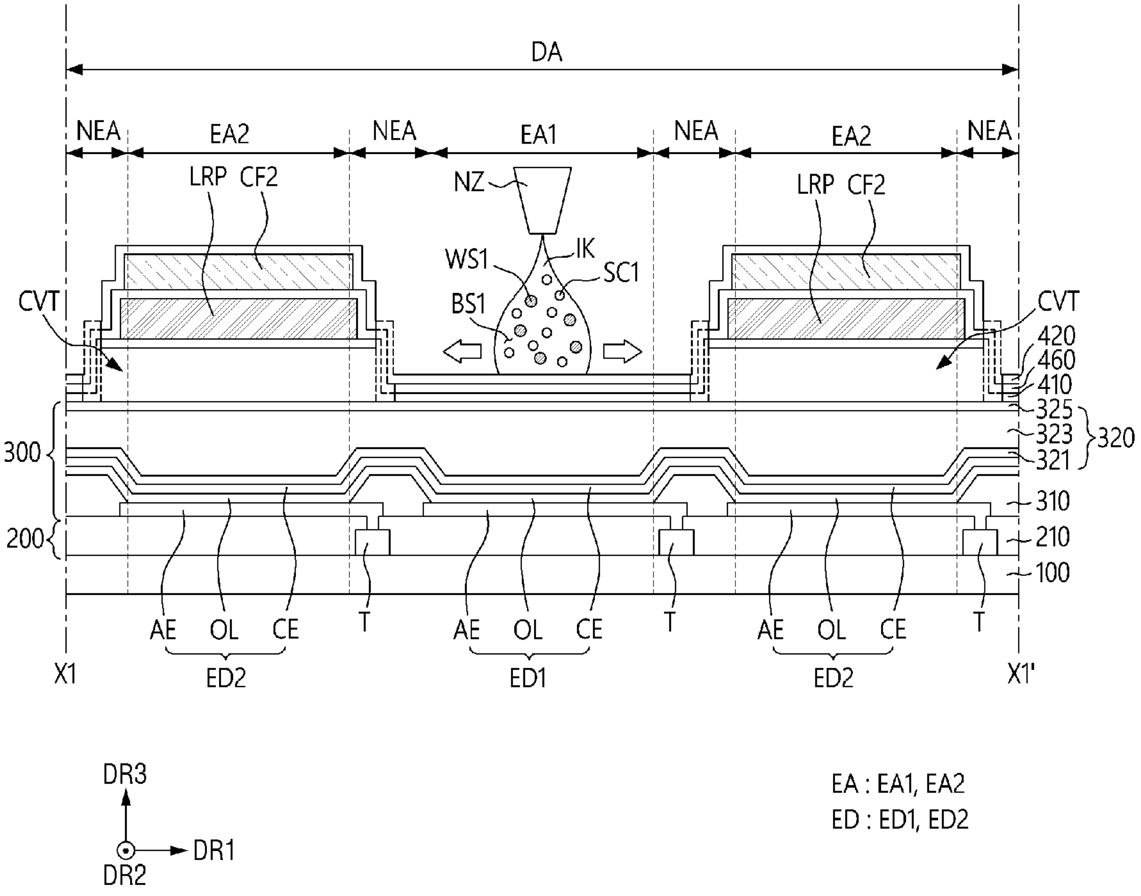
Figure 30:
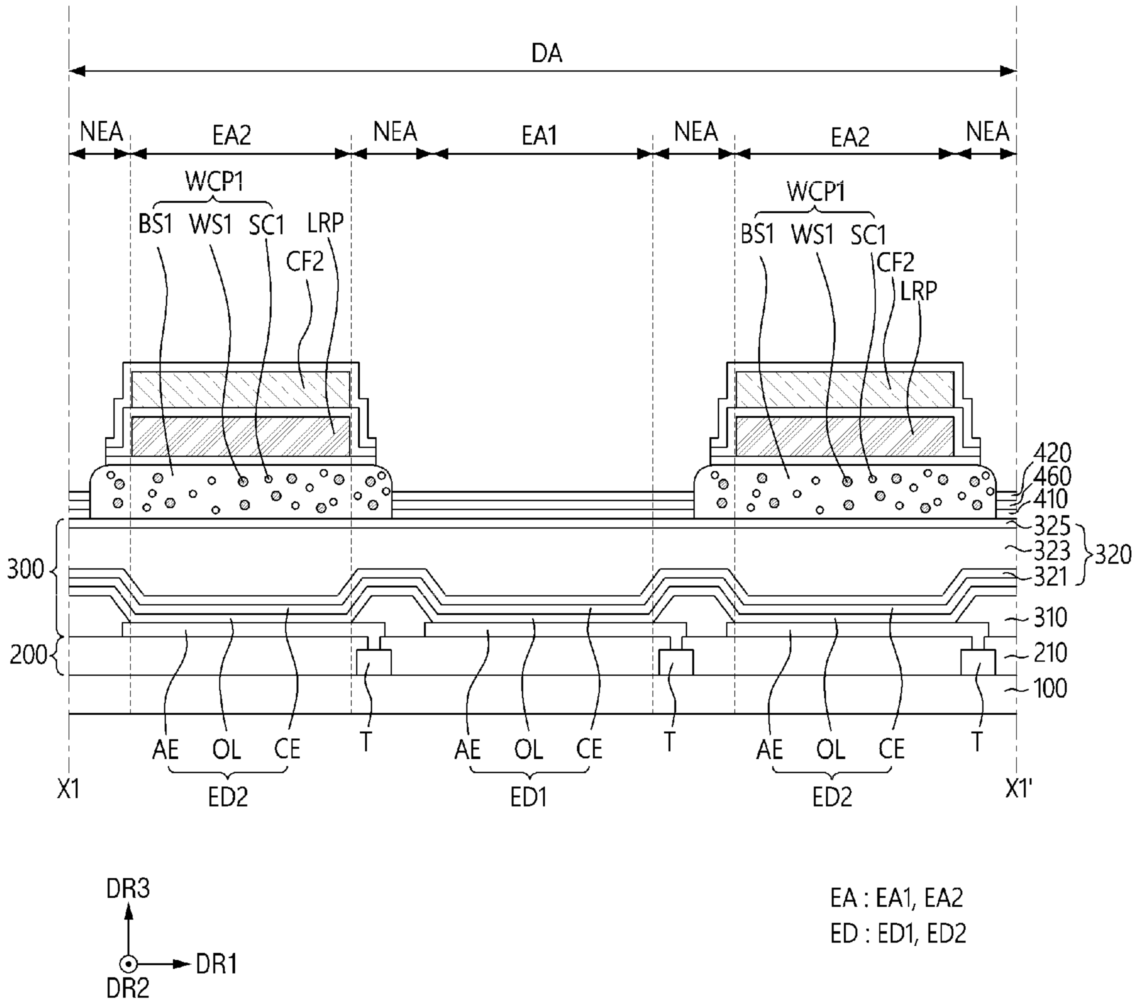

As shown in FIGS. 29 and 30, by supplying a material for forming the wavelength conversion part WCP to the first emission areas EA1, the wavelength conversion part WCP may be formed in the second emission areas EA2 and the third emission areas EA3. In an embodiment, a material for forming the first wavelength conversion patterns WCP1 may be supplied to the first emission areas EA1 of the pixel column in which the second emission areas EA2 are arranged, and a material for forming the second wavelength patterns WCP2 may be supplied to the first emission areas EA1 of the pixel column in which the third emission areas EA3 are arranged.

For example, as described in FIG. 29, the ink IK including the first wavelength shifter WS1 or the second wavelength shifter WS2 may be discharged to each of the first emission areas EA1 by an inkjet method using the nozzle NZ. The ink IK may be introduced into the cavities CVT corresponding to the second emission areas EA2 or the third emission areas EA3 by capillary action, filling the cavities CVT. Accordingly, the first wavelength conversion patterns WCP1 may be formed in the second emission areas EA2, and the second wavelength conversion patterns WCP2 may be formed in the third emission areas EA3. Although the third emission areas EA3 are not illustrated in FIG. 30, the second wavelength conversion patterns WCP2 may be formed in the third emission areas EA3, and a forming the second wavelength conversion patterns WCP2 in the third emission areas EA3 and the forming the second wavelength conversion patterns WCP2 in the second emission areas EA2 may substantially have a same structure and/or method.

Figure 31:
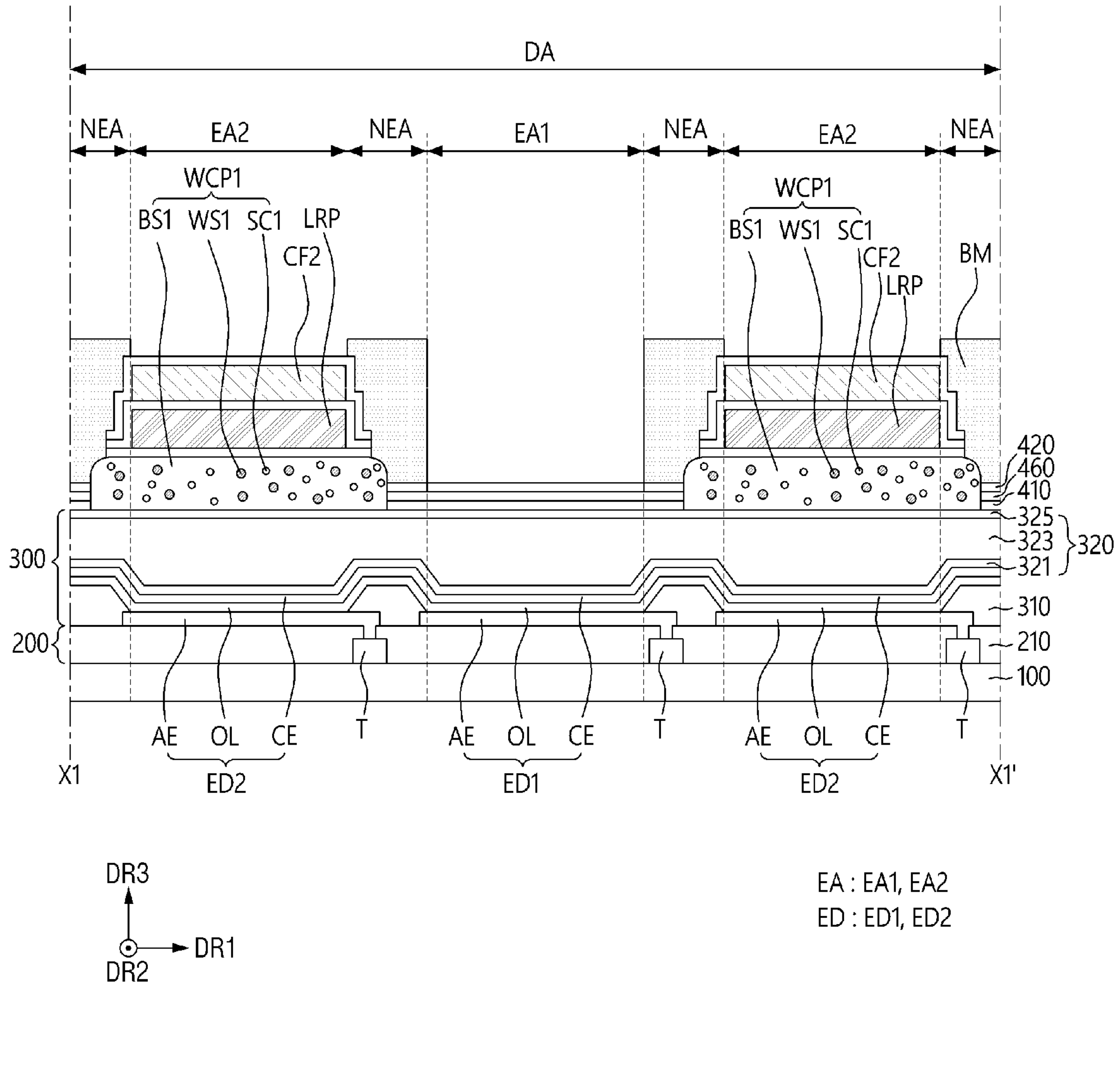

As shown in FIG. 31, the light blocking member BM may be formed in the non-emission area NEA. The light blocking member BM may be formed to cover the exposed surfaces of the first wavelength conversion patterns WCP1 and the second wavelength conversion patterns WCP2 that are exposed in the portions where the first insulation layer 410, the second insulation layer 420, and the sixth insulation layer 460 have been removed.

Figure 32:
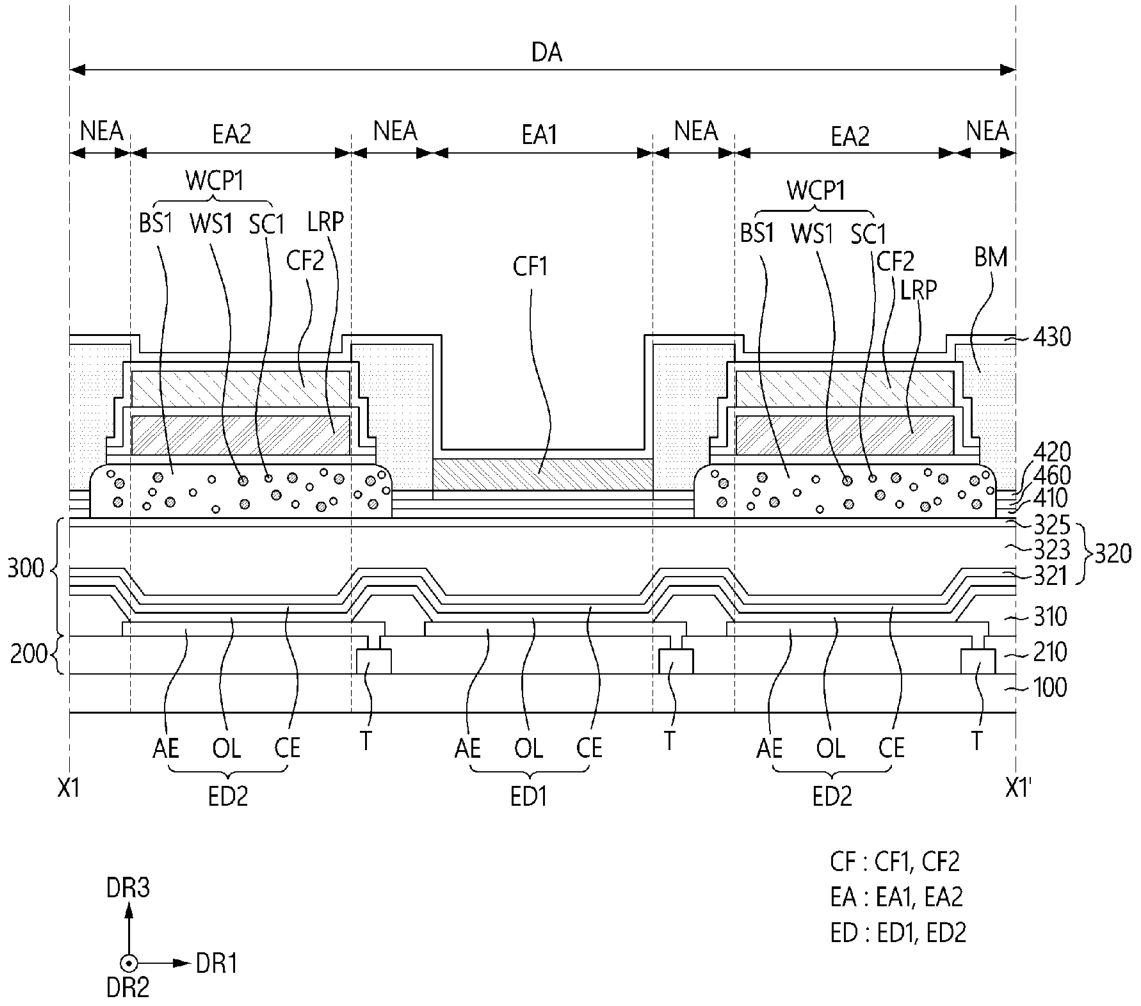

As shown in FIG. 32, the first color filter CF1 may be formed in each of the first emission areas EA1. In an embodiment, the first color filter CF1 may be formed on the second insulating layer 420 in the first emission area EA1 and may contact (e.g., directly contact) the side surface of the light blocking member BM. After forming the first color filter CF1, the third insulating layer 430 may be selectively formed on the base member 100 on which the light blocking member BM, the first color filters CF1, and the like are formed.

After forming the third insulating layer 430, the display device DD may be manufactured by selectively further forming or disposing the fourth insulating layer 440 and the fifth insulating layer 450 illustrated in FIGS. 8 and 9.

FIGS. 33 to 41 are schematic cross-sectional views illustrating a method for manufacturing the display device DD according to an embodiment based on the structure of FIG. 10. In describing a method for manufacturing the display device DD according to an embodiment of FIGS. 33 to 41, a description of the components of FIGS. 33 to 41 and the description of the components of FIGS. 13 to 24 and/or FIGS. 25 to 32 are substantially identical or similar to, and the same description will be omitted.

Figure 33:
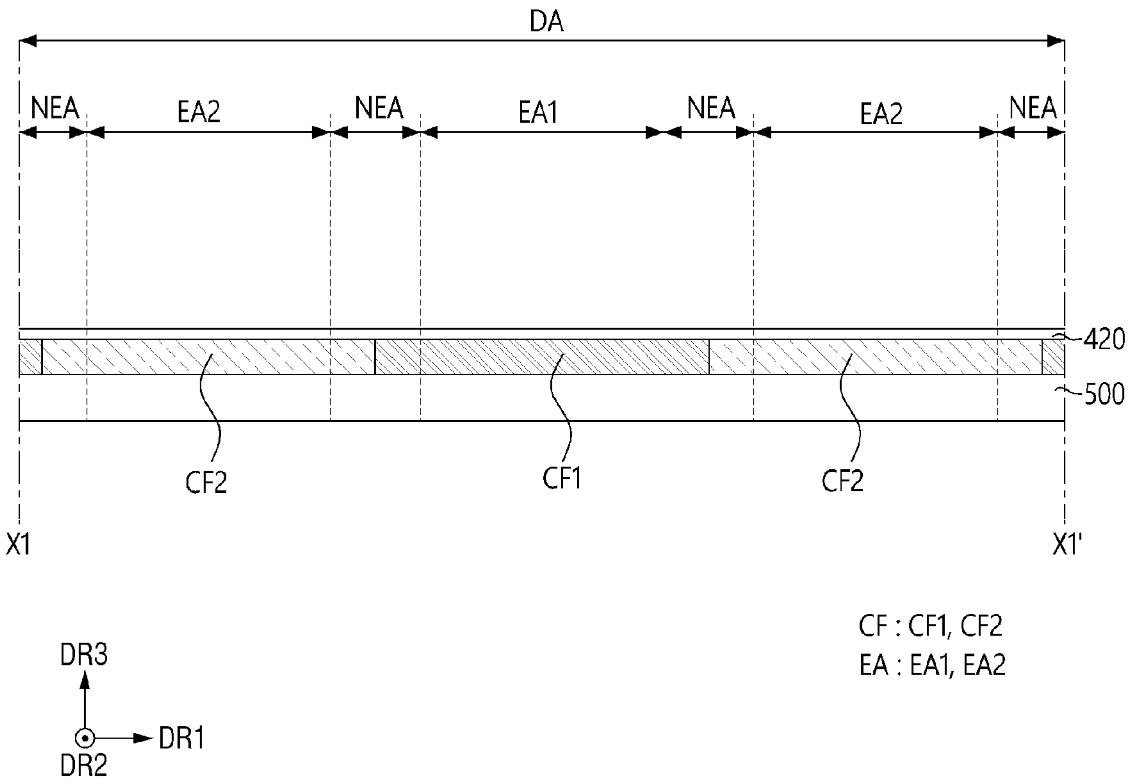
FIGS. 33 to 41 are schematic cross-sectional views illustrating a method for manufacturing the display device according to an embodiment based on a structure of FIG. 10.

Referring to FIGS. 33 to 41 (in addition to FIGS. 1 to 5 and 10), the protection member 500 disposed in the emission areas EA (or light transmitting areas) and the non-emission area NEA (or light blocking areas) may be prepared, and the color filter part CF and the second insulating layer 420 may be formed on the protection member 500, as illustrated in FIG. 33. For example, the first color filters CF1 may be formed in the first emission areas EA1, and the second color filters CF2 may be formed in the second emission areas EA2. Although not shown in FIG. 33, the third color filters CF3 may be formed in the third emission areas EA3. The second insulating layer 420 may cover the first color filters CF1, the second color filters CF2, and the third color filters CF3, and may be formed in an area (e.g., an entire area) of the display area DA.

Figure 34:
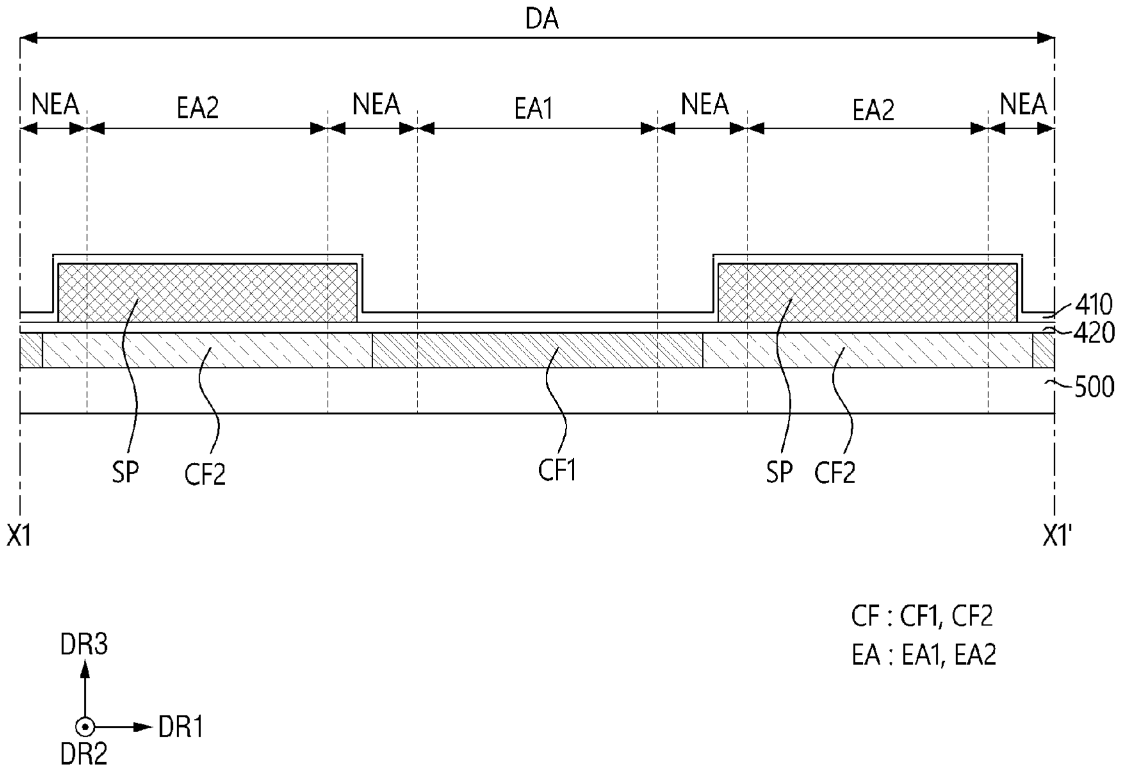

After forming the color filters CF and the second insulating layer 420, as illustrated in FIG. 34, the sacrificial patterns SP (or a sacrificial layer) and the first insulating layer 410 may be sequentially formed on the second insulating layer 420. The sacrificial patterns SP may be formed in the second emission areas EA2 and the third emission areas EA3, and may not be formed in the first emission areas EA1. In an embodiment, the sacrificial patterns SP may be formed such that both ends of the sacrificial patterns SP in the first direction DR1 are disposed in the non-emission area NEA.

Figure 35:
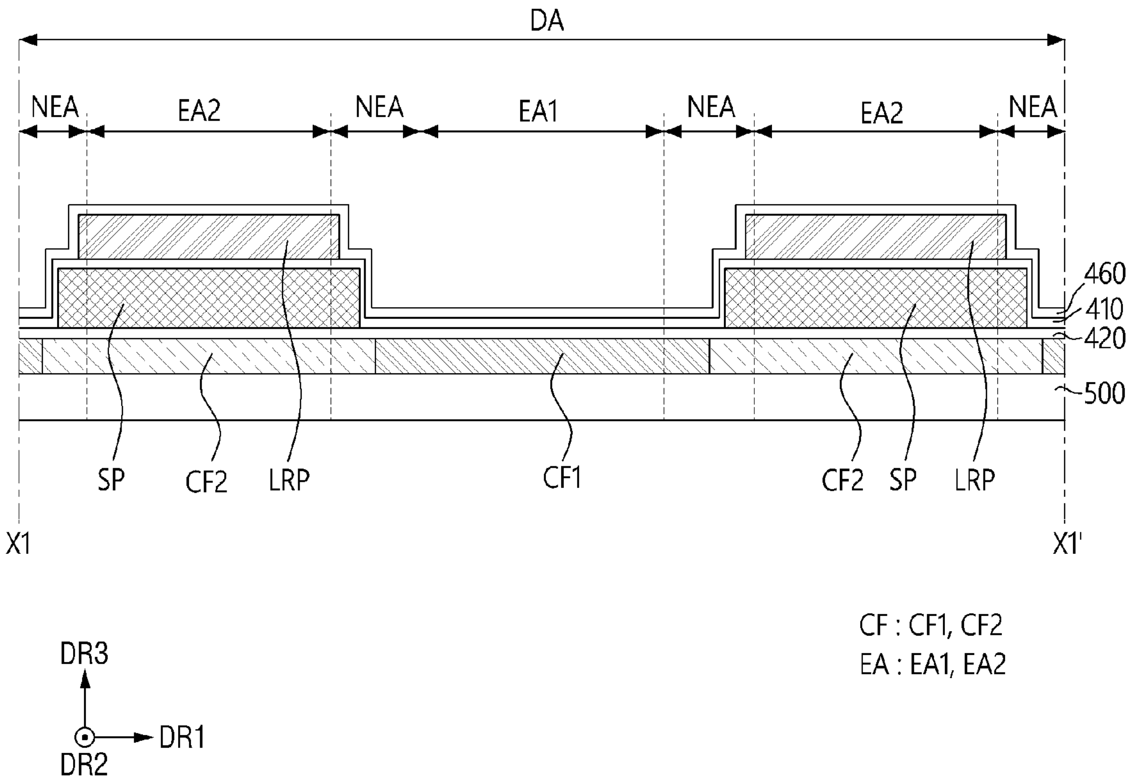

As illustrated in FIG. 35, the low refractive patterns LRP and the sixth insulating layer 460 may be sequentially formed on the first insulating layer 410. In an embodiment, the low refractive patterns LRP may be formed in the second emission areas EA2 and the third emission areas EA3, and may not be formed in the first emission areas EA1. In an embodiment, the low refractive patterns LRP may be formed to have a width less than a width of the sacrificial patterns SP in the first direction DR1 and be disposed at the center of the sacrificial patterns SP.

In an embodiment, in case that manufacturing the display device DD according to an embodiment of FIG. 12, the step of forming the low refractive patterns LRP and the sixth insulating layer 460 may be omitted.

Figure 36:
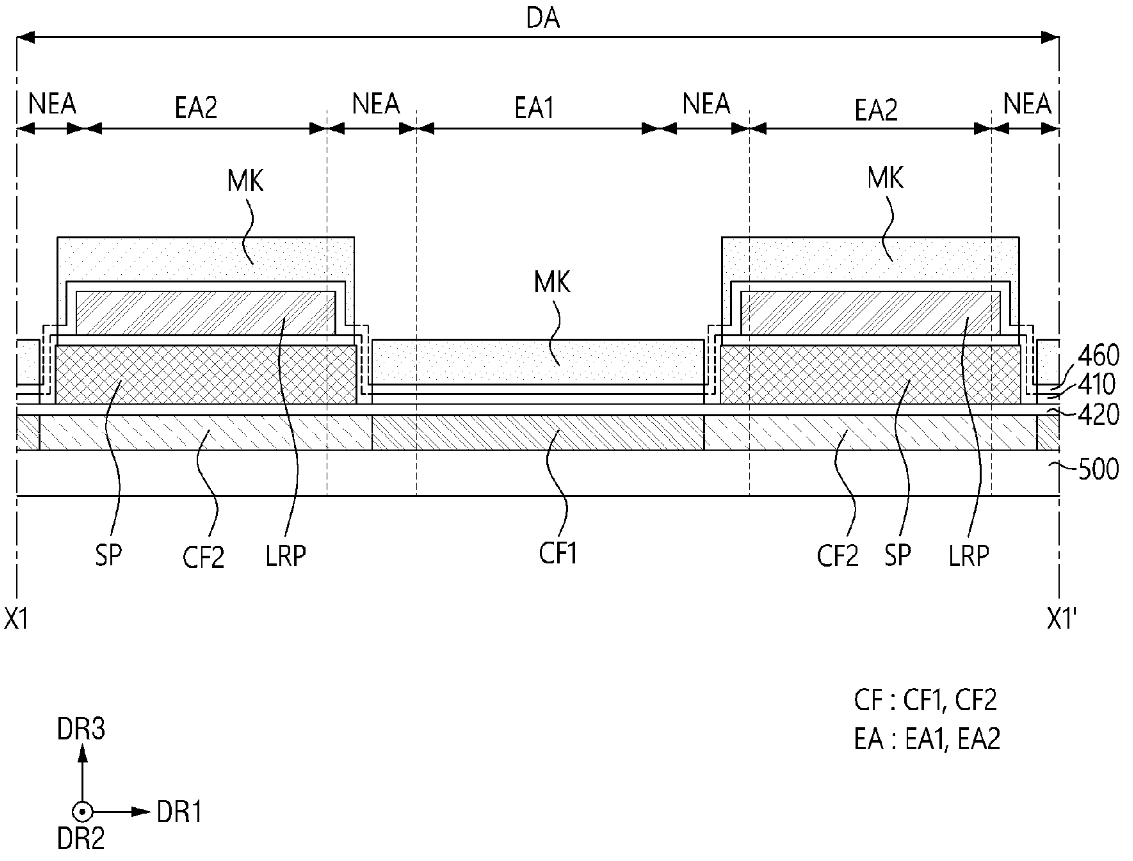

As illustrated in FIG. 36, the mask MK may be disposed on the sixth insulating layer 460. In an embodiment, the mask MK may be formed to cover the emission areas EA, and may be opened and not be disposed on both ends of the sacrificial patterns SP at a portion disposed adjacent to the first emission areas EA1 in the first direction DR1.

After disposing the mask MK, the first insulating layer 410 and the sixth insulating layer 460 may be removed from the non-emission area NEA disposed adjacent to the first emission areas EA1 by an etching process using the mask MK. Accordingly, portions of the sacrificial patterns SP (e.g., both ends of the sacrificial patterns SP in the first direction DR1) may be exposed.

Figure 37:
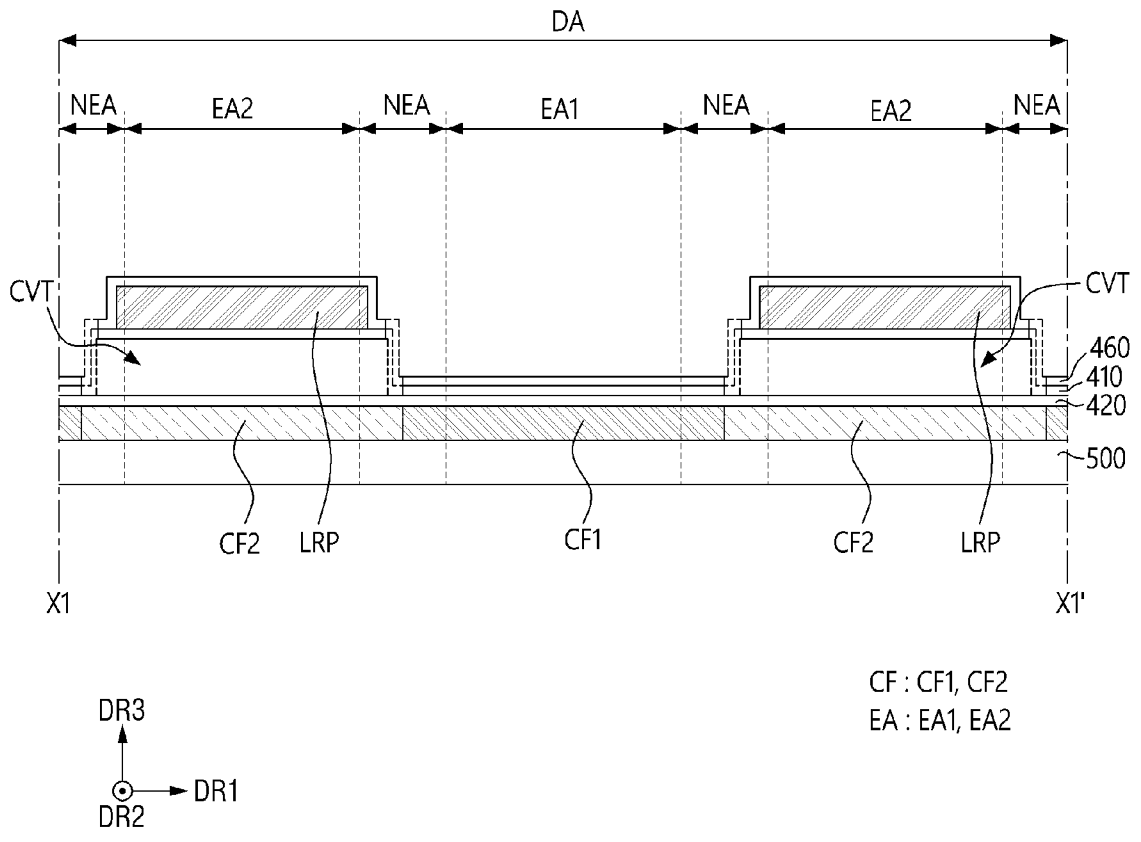

Subsequently, as shown in FIG. 37, by removing the sacrificial patterns SP and the mask MK, the cavities CVT each corresponding to the sacrificial patterns SP may be formed. After forming the cavities CVT, by surface-treating the second insulating layer 420, liquid repellency or hydrophobicity may be imparted to the emission areas EA (e.g., the surface of the sixth insulating layer 460).

Figure 38:
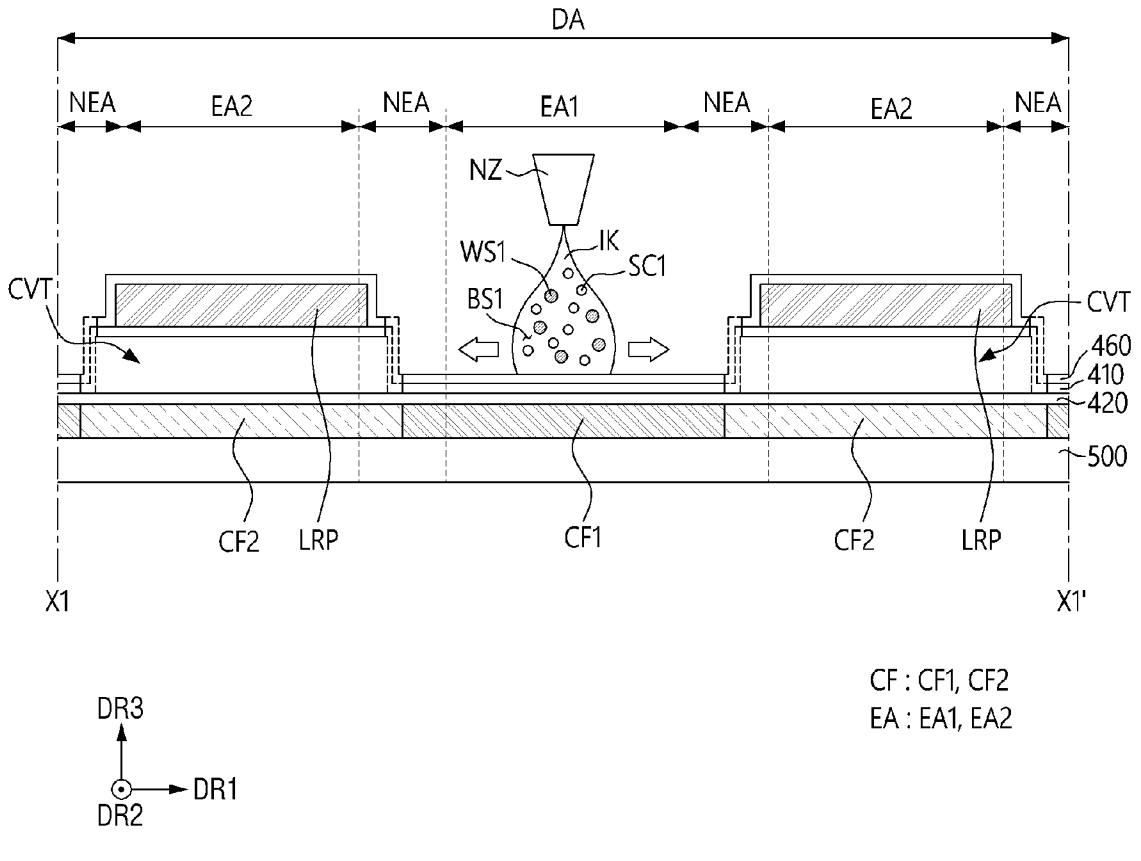
Figure 39:
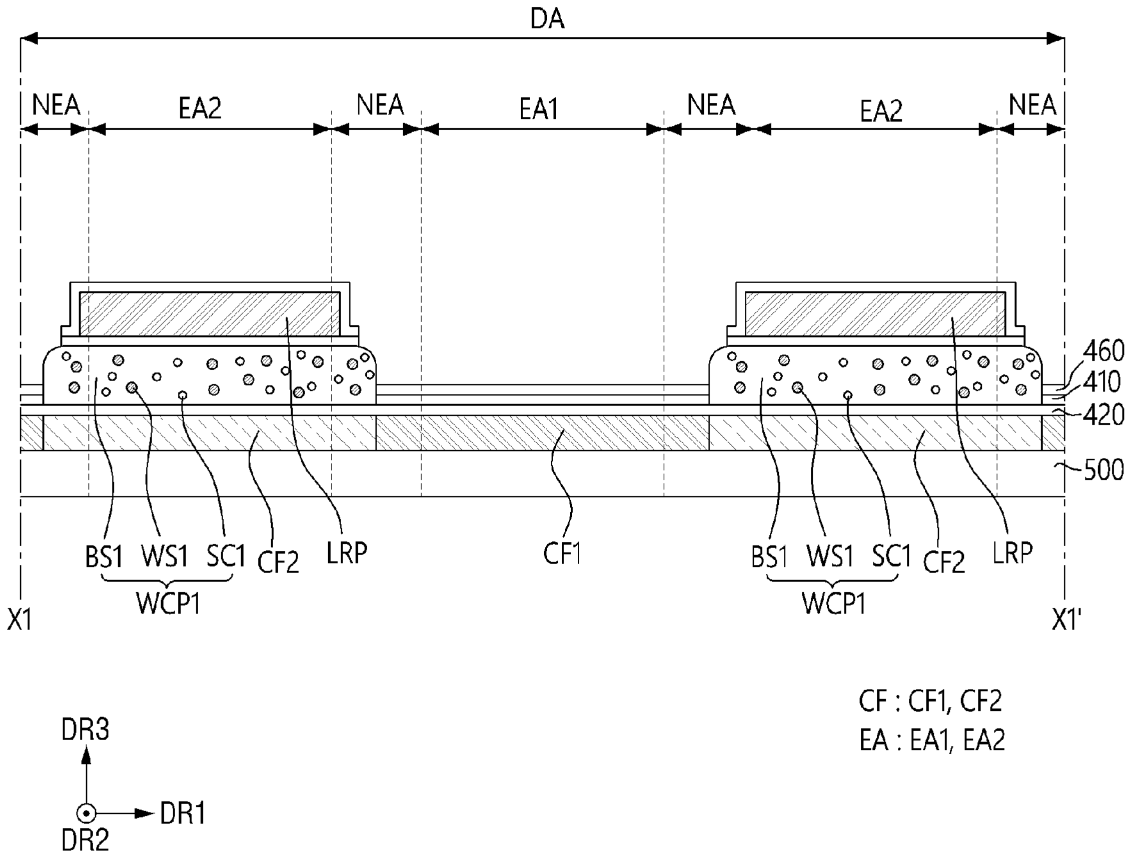

As shown in FIGS. 38 and 39, by supplying a material for forming the wavelength conversion part WCP to the first emission areas EA1, the wavelength conversion part WCP may be formed in the second emission areas EA2 and the third emission areas EA3. For example, as described in FIG. 38, the ink IK including the first wavelength shifter WS1 or the second wavelength shifter WS2 may be discharged to each of the first emission areas EA1 by an inkjet method using the nozzle NZ. The ink IK may be introduced into the cavities CVT corresponding to the second emission areas EA2 or the third emission areas EA3 by capillary action, filling the cavities CVT. Accordingly, the first wavelength conversion patterns WCP1 may be formed in the second emission areas EA2, and the second wavelength conversion patterns WCP2 may be formed in the third emission areas EA3. Although the third emission areas EA3 are not illustrated in FIGS. 38 and 39, the second wavelength conversion patterns WCP2 may be formed in the third emission areas EA3, and a forming the second wavelength conversion patterns WCP2 in the third emission areas EA3 and the forming the second wavelength conversion patterns WCP2 in the second emission areas EA2 may substantially have a same structure and/or method.

Figure 40:
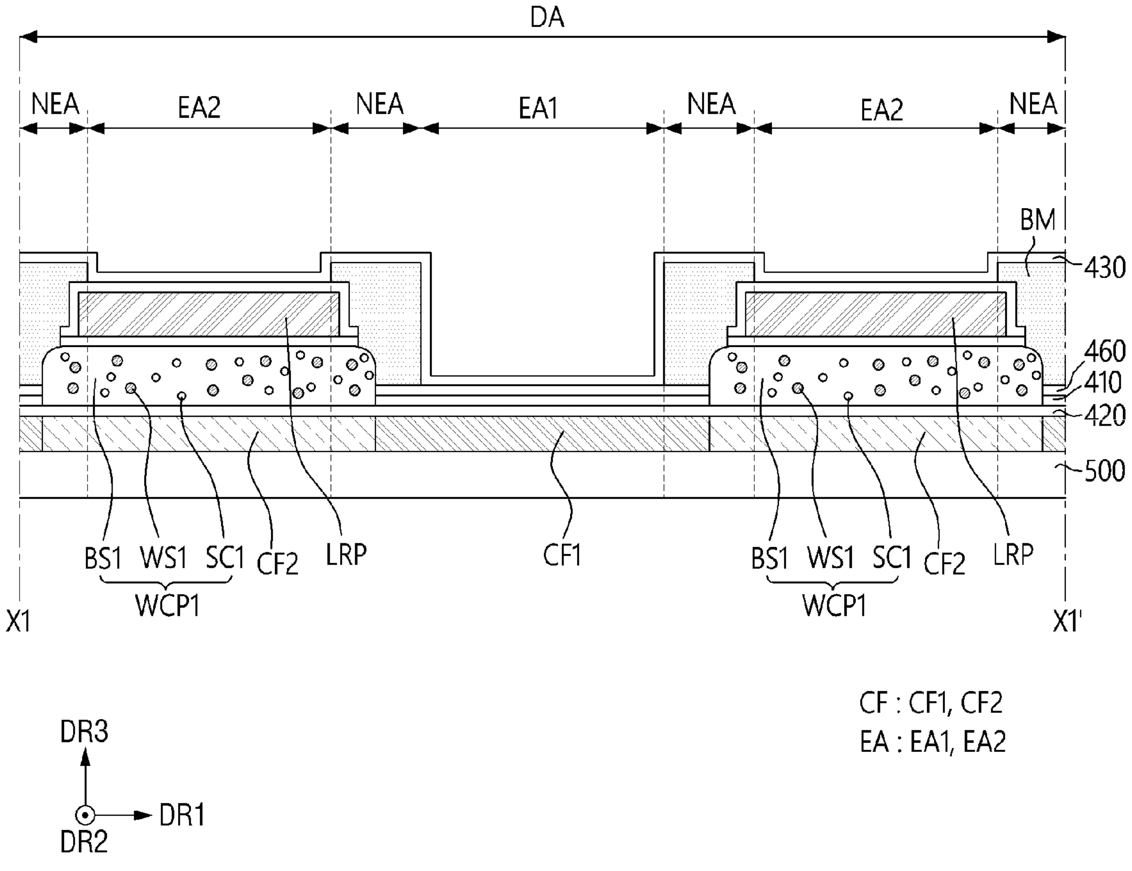

As shown in FIG. 40, the light blocking member BM may be formed in the non-emission area NEA. The light blocking member BM may be formed to cover the exposed surfaces of the first wavelength conversion patterns WCP1 and the second wavelength conversion patterns WCP2, which are exposed in the portions where the first insulating layer 410 and the sixth insulating layer 460 have been removed.

After forming the light blocking member BM, the fourth insulating layer 440 and the fifth insulating layer 450 illustrated in FIG. 10 may be further formed or disposed selectively.

Figure 41:
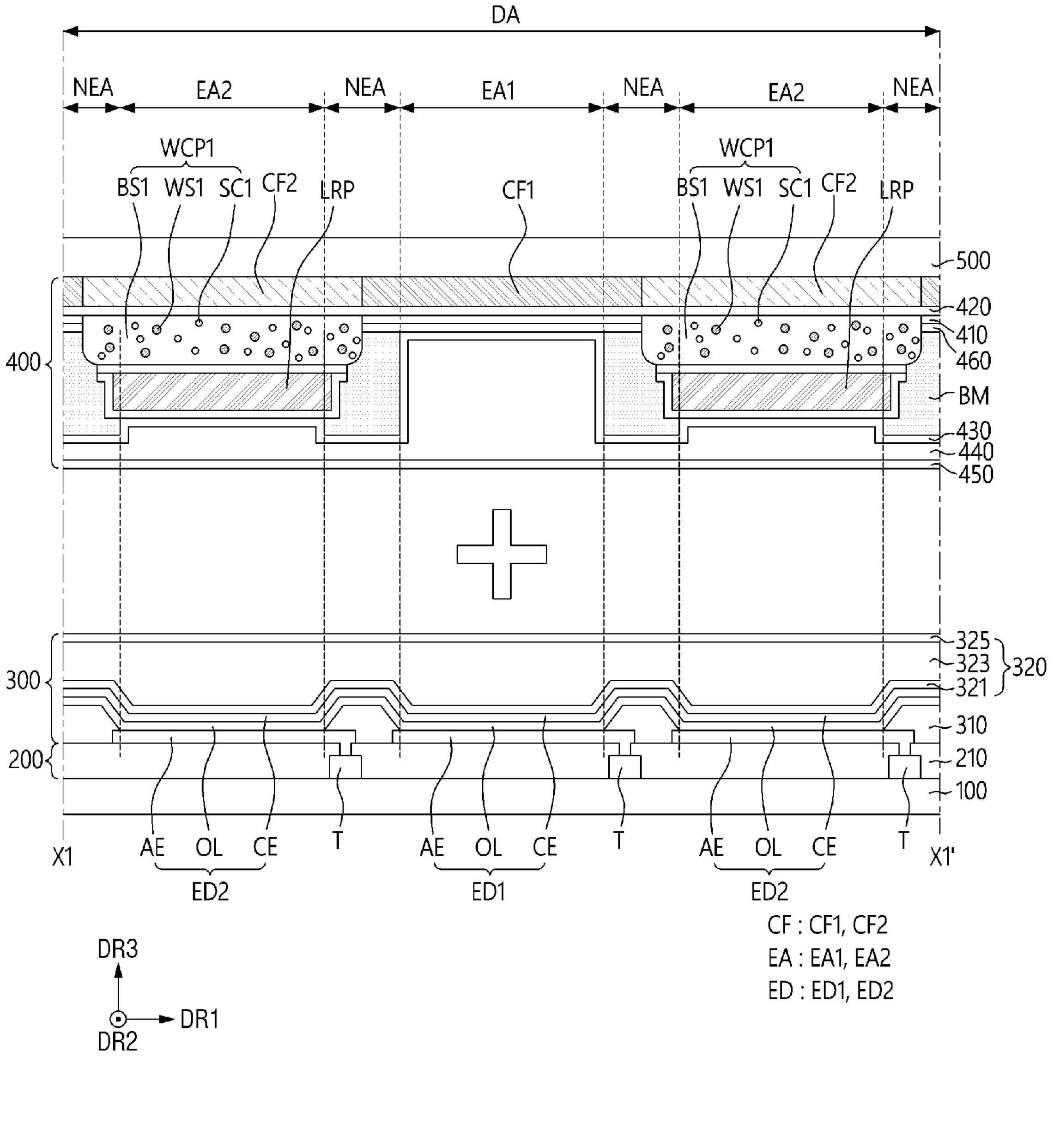

As shown in FIG. 41, the protection member 500 provided with the light conversion part 400 may be disposed on top of the base member 100 provided with the panel circuit part 200, the light emitting element part 300, and the like. After disposing the protection member 500, the display device DD may be manufactured by a bonding process using a scaling material (not shown), a filler 600, or the like.

According to the various embodiments described above, the first emission areas EA1 that do not include a wavelength conversion pattern may be used as the inkjet drop area to form the first wavelength conversion patterns WCP1 and the second wavelength conversion patterns WCP2 in the second emission areas EA2 and the third emission areas EA3, respectively.

For example, in the above description, at least one first emission area EA1 may be disposed adjacent to each of the second emission areas EA2 and the third emission areas EA3. The cavities CVT for forming the first wavelength conversion patterns WCP1 and the second wavelength conversion patterns WCP2 may be formed in the second emission areas EA2 and the third emission areas EA3, respectively, by using the sacrificial patterns SP.

In an embodiment, the cavity CVT may be formed as a space having a tunnel structure opened toward at least one first emission area EA1 disposed (e.g., directly disposed) adjacent to each of the second emission areas EA2 and the third emission areas EA3. In an embodiment, before forming the first wavelength conversion patterns WCP1 and the second wavelength conversion patterns WCP2, the surface of the base member 100 provided with the cavities CVT may be surface-treated, so that liquid repellency or hydrophobicity may be imparted to the surface of the remaining region other than for the inside of the cavities CVT (e.g., the exposed surfaces of the emission areas EA).

After forming the cavity CVT, in case that the ink IK including the first wavelength shifter WS1 or the second wavelength shifter WS2 is supplied to each first emission area EA1, the ink IK may be introduced into the cavity CVT of the adjacent second emission area EA2 or third emission area EA3 to fill the cavity CVT. As a result, the first wavelength conversion pattern WCP1 may be formed in each second emission area EA2, and the second wavelength conversion pattern WCP2 may be formed in each third emission area EA3.

According to the above description, by using the first emission areas EA1 and the surrounding non-emission area NEA as the inkjet drop areas for forming the wavelength conversion part WCP in the second emission areas EA2 and the third emission areas EA3, a sufficient area and/or width of the inkjet drop area may be secured. For example, even in the display device DD having a high resolution of greater than or equal to about 160 ppi in which the area of the unit pixel UPA is reduced and the pixels PX are densely arranged (e.g., the display device having a high resolution of about 220 ppi in which the width W1 of the unit pixel UPA in the first direction DR1 and/or the width W2 in the second direction DR2 are less than or equal to about 120 μm), the minimum inkjet drop area required for the inkjet process may be secured. Accordingly, the high-resolution display device DD including the wavelength conversion patterns may be manufactured by the inkjet process.

According to the above description, the size of each of the first wavelength conversion patterns WCP1 and the second wavelength conversion patterns WCP2 may be finely adjusted by adjusting the size of the sacrificial patterns SP (e.g., the area and/or height of the sacrificial patterns SP). Accordingly, the ink IK may be used efficiently or economically, so that the manufacturing cost of the display device DD may be reduced. The first wavelength conversion patterns WCP1 and the second wavelength conversion patterns WCP2 may be uniformly formed, so that a luminance deviation between the pixels PX may be reduced or minimized, and the quality of the display device DD may be improved.

According to embodiments in which the light conversion part 400 is formed (e.g., directly formed) on the surface of the base member 100 on which the light emitting element part 300 and the like are formed, the manufacturing process of the display device DD may be carried out continuously and/or continually without needing to invert the object being manufactured upside down during the manufacturing process of the display device DD. Accordingly, the risk of damage that may occur in the manufacturing process of the display device DD may be reduced or prevented, and the display device DD may be stably manufactured.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
- a first emission area, a second emission area disposed adjacent to the first emission area, and a non-emission area disposed between the first emission area and the second emission area;
- a base member disposed in the first emission area, the second emission area, and the non-emission area;
- a light emitting element part disposed on the base member and comprising:
  - a first light emitting element disposed in the first emission area; and
  - a second light emitting element disposed in the second emission area;
- a wavelength conversion part disposed on the light emitting element part and comprising a first wavelength conversion pattern disposed in the second emission area;
- a first insulating layer covering the first wavelength conversion pattern, opened at a portion adjacent to the first emission area, and exposing a portion of the first wavelength conversion pattern;
- a light blocking member disposed in the non-emission area and covering the portion of the first wavelength conversion pattern;
- a first color filter disposed on the first light emitting element in the first emission area; and
- a second color filter disposed on the first wavelength conversion pattern in the second emission area,
- wherein the wavelength conversion part is disposed only in the second emission area among the first emission area and the second emission area.

2. The display device of claim 1, wherein
- the first color filter and the second color filter are disposed on different layers, and
- the first color filter is disposed closer to the light emitting element part than the second color filter.

3. The display device of claim 2, wherein the first color filter directly contacts a side surface of the light blocking member.

4. The display device of claim 1, wherein
- the second light emitting element is a first color light emitting element emitting light of a first color, and
- the first wavelength conversion pattern comprises a first wavelength shifter converting light of the first color into light of a second color.

5. The display device of claim 4, wherein the second color filter is a color filter of the second color, which transmits light of the second color.

6. The display device of claim 1, wherein
- the first light emitting element is a first color light emitting element emitting light of a first color, and
- the first color filter comprises a color filter of the first color, which transmits light of the first color.

7. The display device of claim 1, wherein the second color filter is disposed on the first insulating layer.

8. The display device of claim 7, further comprising:
- a second insulating layer disposed on the second color filter entirely in a display area comprising the first emission area and the second emission area,
- wherein the second insulating layer is opened at a portion adjacent to the first emission area to expose the portion of the first wavelength conversion pattern.

9. The display device of claim 8, wherein the light blocking member is disposed directly on the second insulating layer and the portion of the first wavelength conversion pattern.

10. The display device of claim 8, wherein the first color filter is disposed on the second insulating layer.

11. A display device comprising:
- a first emission area, a second emission area disposed adjacent to the first emission area, and a non-emission area disposed between the first emission area and the second emission area;
- a base member disposed in the first emission area, the second emission area, and the non-emission area;
- a light emitting element part disposed on the base member and comprising:
  - a first light emitting element disposed in the first emission area; and
  - a second light emitting element disposed in the second emission area;
- a wavelength conversion part disposed on the light emitting element part and comprising a first wavelength conversion pattern disposed in the second emission area;
- a first insulating layer covering the first wavelength conversion pattern, opened at a portion adjacent to the first emission area, and exposing a portion of the first wavelength conversion pattern;

a light blocking member disposed in the non-emission area and covering the portion of the first wavelength conversion pattern;

a low refractive pattern disposed on the light emitting element part in the second emission area and overlapping the first wavelength conversion pattern in a plan view; and a third insulating layer covering the low refractive pattern, opened at a portion adjacent to the first emission area, and exposing another portion of the first wavelength conversion pattern, wherein the wavelength conversion part is disposed only in the second emission area among the first emission area and the second emission area.

12. The display device of claim 11, wherein the low refractive pattern and the third insulating layer are sequentially disposed on the first insulating layer.

13. The display device of claim 1, wherein the light blocking member directly contacts the portion of the first wavelength conversion pattern.

14. The display device of claim 1, further comprising:

a protection member disposed on the base member provided with the light emitting element part;

a color filter part disposed on a surface of the protection member facing the light emitting element part and comprising:

a first color filter disposed in the first emission area; and a second color filter disposed in the second emission area; and a second insulating layer covering the color filter part.

15. The display device of claim 14, wherein the wavelength conversion part is disposed on a surface of the second insulating layer and faces the light emitting element part.

16. The display device of claim 1, further comprising:

a display area including a plurality of emission areas comprising the first emission area and the second emission area, wherein the display area comprises a first pixel column in which the first emission area, which comprises the first light emitting element and do not comprise a wavelength conversion pattern, and the second emission area, which comprises the second light emitting element and the first wavelength conversion pattern, are alternately arranged.

17. The display device of claim 16, wherein the display area further comprises a second pixel column in which a third emission area, which comprises a third light emitting element and a second wavelength conversion pattern, and the first emission area, which comprises the first light emitting element and do not comprise the wavelength conversion pattern, are alternately arranged.

18. The display device of claim 17, wherein the first insulating layer:

is disposed entirely in the display area and cover the first wavelength conversion pattern and the second wavelength conversion pattern, is opened between the first emission area and the second emission area and expose the portion of the first wavelength conversion pattern, and is opened between the first emission area and the third emission area and exposes a portion of the second wavelength conversion pattern.

19. A method for manufacturing a display device, comprising:

preparing a base member disposed in a first emission area, a second emission area disposed adjacent to the first emission area, and a non-emission area disposed between the first emission area and the second emission area;

forming a sacrificial pattern only in the second emission area among the first emission area and the second emission area on the base member;

forming a first insulating layer on the base member on which the sacrificial pattern is formed;

exposing a portion of the sacrificial pattern by removing a portion of the first insulating layer in the non-emission area adjacent to the first emission area;

forming a cavity corresponding to the sacrificial pattern and opened toward the first emission area by removing the sacrificial pattern;

imparting liquid repellency to the first emission area and the second emission area by surface-treating a surface of the first insulating layer;

supplying ink including a first wavelength shifter to the first emission area and filling the cavity with the ink through a portion where the first insulating layer is removed to form a wavelength conversion pattern in the second emission area; and forming a light blocking member in the non-emission area, and covering an exposed surface of the wavelength conversion pattern exposed at a portion where the first insulating layer is removed with the light blocking member.

* * * * *